(12) United States Patent
Jhan et al.

(10) Patent No.: US 12,557,317 B2
(45) Date of Patent: Feb. 17, 2026

(54) SEMICONDUCTOR DEVICES WITH FIN-TOP HARD MASK AND METHODS FOR FABRICATION THEREOF

(71) Applicant: TAIWAN SEMICONDUCTOR MANUFACTURING COMPANY, LTD., Hsinchu (TW)

(72) Inventors: Yi-Ruei Jhan, New Taipei (TW); Kuan-Ting Pan, Hsinchu County (TW); Kuo-Cheng Chiang, Changhua County (TW); Kuan-Lun Cheng, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 207 days.

(21) Appl. No.: 18/226,896

(22) Filed: Jul. 27, 2023

(65) Prior Publication Data

US 2023/0369463 A1 Nov. 16, 2023

Related U.S. Application Data

(63) Continuation of application No. 16/996,781, filed on Aug. 18, 2020, now Pat. No. 11,757,021.

(51) Int. Cl.
| | | |
|---|---|---|
| H10D 30/01 | (2025.01) | |
| H01L 21/02 | (2006.01) | |
| H01L 21/306 | (2006.01) | |
| H01L 21/308 | (2006.01) | |
| H10D 30/67 | (2025.01) | |
| H10D 62/10 | (2025.01) | |
| H10D 64/01 | (2025.01) | |

(52) U.S. Cl.
CPC ..... *H10D 30/024* (2025.01); *H01L 21/02532* (2013.01); *H01L 21/02603* (2013.01); *H01L 21/30604* (2013.01); *H01L 21/308* (2013.01); *H10D 30/6735* (2025.01); *H10D 30/6757* (2025.01); *H10D 62/121* (2025.01); *H10D 64/017* (2025.01)

(58) Field of Classification Search
CPC ......... H01L 29/66545; H01L 21/02233; H01L 21/76224
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

*Primary Examiner* — Brian Turner
(74) *Attorney, Agent, or Firm* — NZ Carr Law Office

(57) ABSTRACT

The present disclosure provides a method for using a hard mask layer on a top surface of fin structures to form a fin-top mask layer. The fin-top mask layer can function as an etch stop for subsequent processes. Using the fin-top hard mask layer allows a thinner conformal dielectric layer to be used to protect semiconductor fins during the subsequent process, such as during etching of sacrificial gate electrode layer. Using a thinner conformal dielectric layer can reduce the pitch of fins, particularly for input/output devices.

20 Claims, 65 Drawing Sheets

(56) References Cited

U.S. PATENT DOCUMENTS

| | | |
|---|---|---|
| 9,536,738 B2 | 1/2017 | Huang et al. |
| 9,576,814 B2 | 2/2017 | Wu et al. |
| 9,608,116 B2 | 3/2017 | Ching et al. |
| 2005/0019993 A1 | 1/2005 | Lee et al. |
| 2006/0029887 A1 | 2/2006 | Oh |
| 2007/0063224 A1 | 3/2007 | Watanabe |
| 2014/0117464 A1 | 5/2014 | Chang |
| 2015/0102409 A1 | 4/2015 | Cheng et al. |
| 2015/0287779 A1 | 10/2015 | Jhaveri |
| 2016/0064543 A1 | 3/2016 | Cheng et al. |
| 2016/0141392 A1 | 5/2016 | Kim |
| 2016/0218012 A1* | 7/2016 | Shimamoto .......... H10D 30/024 |
| 2016/0240652 A1 | 8/2016 | Ching |
| 2016/0380058 A1 | 12/2016 | Basker et al. |
| 2017/0005090 A1 | 1/2017 | Ando et al. |
| 2019/0067417 A1 | 2/2019 | Ching |
| 2020/0105869 A1 | 4/2020 | Loubet |

\* cited by examiner

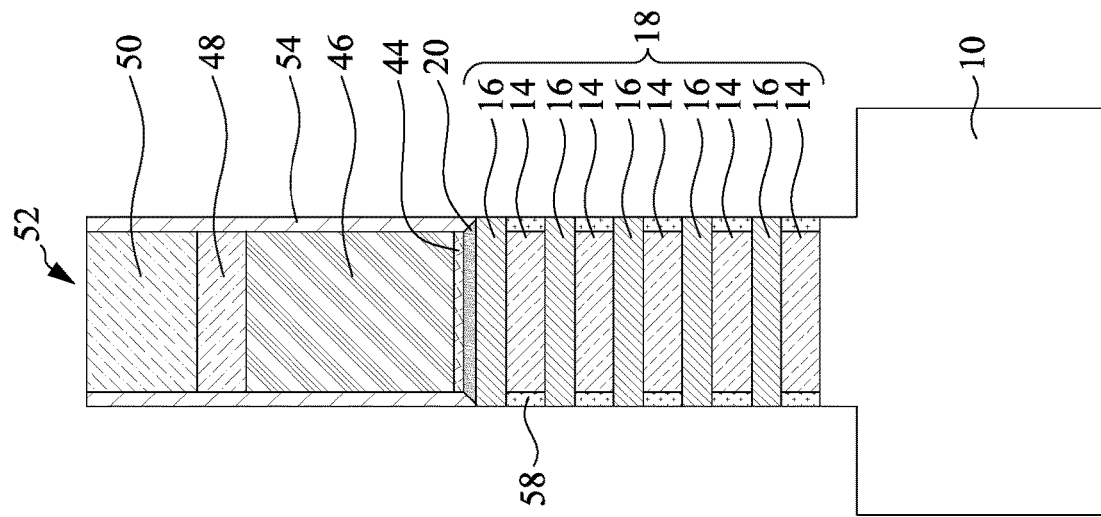
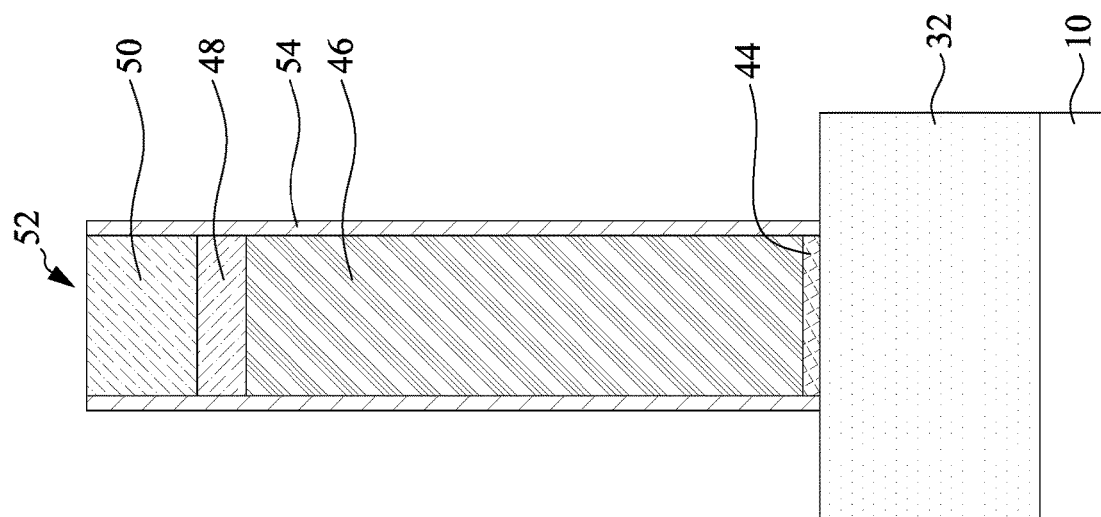
Fig. 17C
Fig. 17D

SEMICONDUCTOR DEVICES WITH FIN-TOP HARD MASK AND METHODS FOR FABRICATION THEREOF

CROSS-REFERENCE TO RELATED APPLICATIONS

This application is a continuation application of U.S. patent application Ser. No. 16/996,781 filed Aug. 18, 2020, which is incorporated by reference in its entirety.

BACKGROUND

With the increasing down scaling of semiconductor devices, various processing techniques are adapted to allow for the manufacture of devices with increasingly smaller dimensions. As semiconductor devices continue to shrink, the spacing between elements, i.e., the pitch, of a device also reduces. However, traditional techniques and/or process flows may hinder pitch reduction.

Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
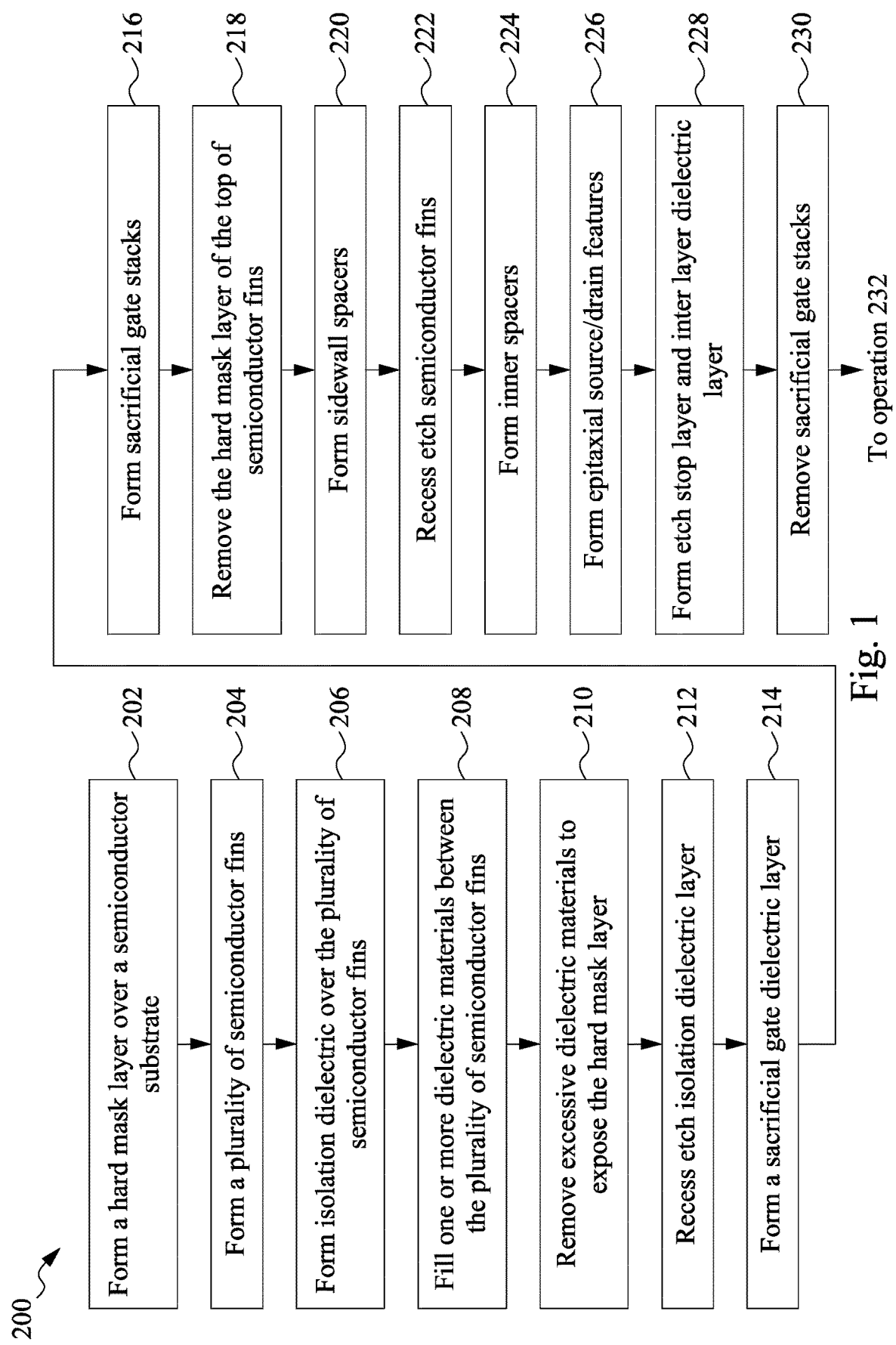
FIG. 1 is a flowchart of an exemplary method for forming a semiconductor device according to embodiments of the present disclosure.
Figure 1:
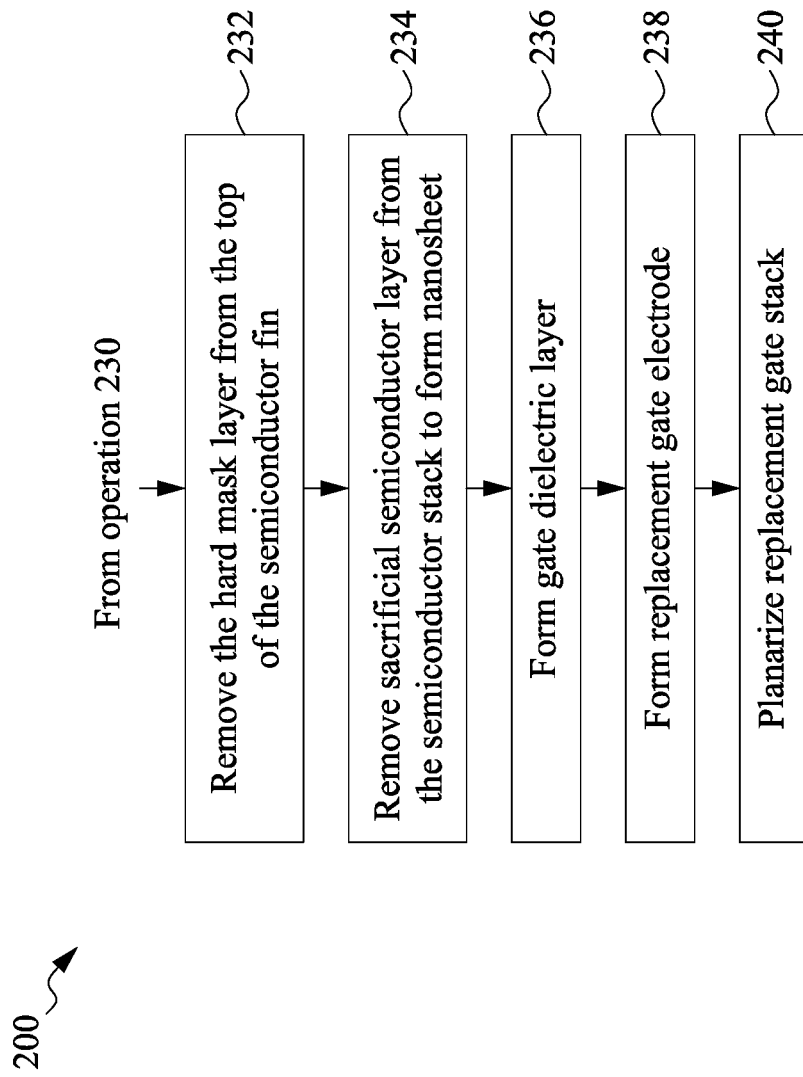

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In current fabrication process for Fin-FETs, nanosheet FETs, GAA FETs, or other multi-channel FETs, a conformal dielectric layer is formed over the fin structures to protect the fin structures during the subsequent process, such as during operations to form dummy gate structures. Portions of the dielectric layer remain in the FET devices as gate dielectric layer. Therefore, the thickness of the conformal dielectric layer is selected to protect the semiconductor fin structures and to function as gate dielectric layer. As a result, pitch of fin structures is set to be large enough to permit formation of the conformal dielectric layer with desired thickness over the fin structures. In situations when a thick layer of gate dielectric layer is desired, such as in input/output devices, the pitch of fin structures is increased to provide space for forming the conformal dielectric layer in the trench between neighboring fin structures. However, increased pitch between fins in Fin-FET devices may result in decreased speed of the devices.

Embodiments of the present disclosure provide a method for using a hard mask layer on a top surface of fin structures to form a fin-top mask layer. The fin-top mask layer can function as an etch stop for subsequent processes. For example, a fin-top mask layer may be used on two or more semiconductor fin structures as an etch stop during formation of sacrificial gate structures when forming a FET device, such as a Fin-FET, a nanosheet FET, a GAA FET, or other multi-channel FET. The fin-top hard mask may be formed by depositing a blanket layer over a semiconductor substrate prior to forming semiconductor fins. The fin-top hard mask layer provides protection to semiconductor fins thereunder during subsequent processes. Using the fin-top hard mask layer allows a thinner conformal dielectric to be used to protect semiconductor fins during the subsequent process, such as during etching of sacrificial gate electrode layer. The fin-top hard mask layer may be removed prior to forming a replacement gate structure. In some embodiments, a gate dielectric layer is formed, as part of the replacement gate structure, on the semiconductor fin after removal of the fin-top hard mask. In some instances, a portion of the fin-top hard mask layer remains under spacer layer of a FET device due to process limitation of the fin-top hard mask removal process.

FIG. 1 is a flow chart of an exemplary method 200 for forming a semiconductor device according to embodiments of the present disclosure. FIGS. 2-25F schematically illustrate the semiconductor device at various stages of fabrication according to the method 200. Particularly, FIGS. 2-10 are schematic perspective views of a semiconductor device at various stages of manufacturing the semiconductor device according to embodiments of the present disclosure. FIGS. 11A-11D, FIGS. 12A-12E to 14A-14E, FIGS. 15A-15D to 20A-20D, FIGS. 21A-21E to 24A-24E, and FIGS. 25A-25F are schematic views of the semiconductor device at various stages of manufacturing the semiconductor device according to embodiments of the present disclosure.

Figure 2:
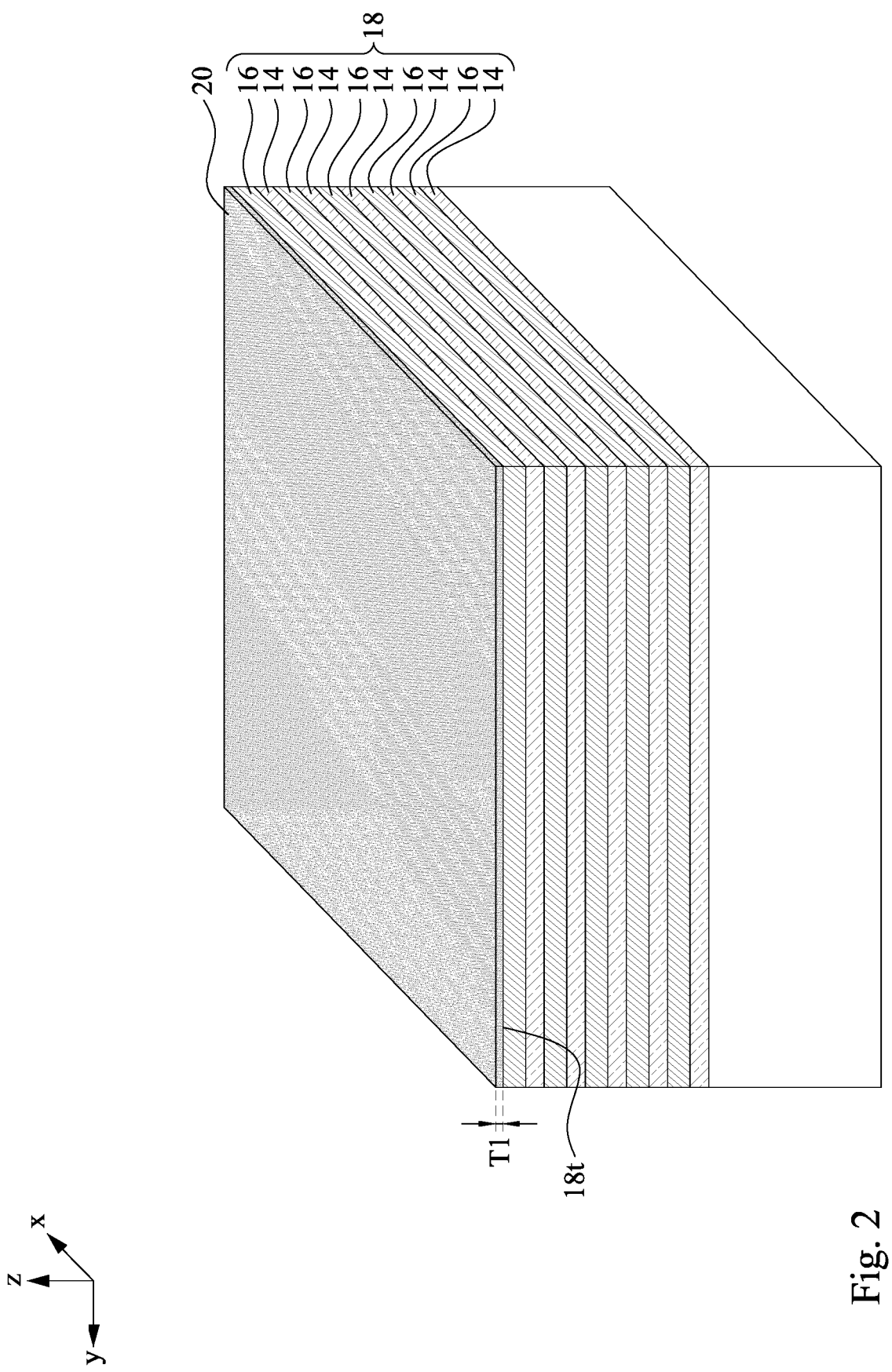
FIGS. 2-10 are schematic perspective views of a semiconductor device at various stages of manufacturing the semiconductor device according to embodiments of the present disclosure.

The method 200 begins at operation 202 where a hard mask layer 20 is formed over a substrate 10, as shown in FIG. 2. The substrate 10 is provided to form a semiconductor device thereon. The substrate 10 may include a single crystalline semiconductor material such as, but not limited to Si, Ge, SiGe, GaAs, InSb, GaP, GaSb, InAlAs, InGaAs, GaSbP, GaAsSb, and InP. The substrate 10 may include various doping configurations depending on circuit design. For example, different doping profiles, e.g., n-wells, p-wells, may be formed in the substrate 10 in regions designed for different device types, such as n-type field effect transistors (NFET), and p-type field effect transistors (PFET). In some embodiments, the substrate 10 may be a silicon-on-insulator (SOI) substrate including an insulator structure (not shown) for enhancement.

In the embodiment of FIG. 2, a semiconductor stack 18 is formed over the substrate 10. The semiconductor stack 18 includes alternately stacked semiconductor layers made of different materials to facilitate formation of nanosheet channels in a multi-gate device, such as nanosheet channel FETs. In some embodiments, the semiconductor stack 18 includes first semiconductor layers 14 interposed by second semiconductor layers 16. The first semiconductor layers 14 and second semiconductor layers 16 have different oxidation rates and/or etch selectivity.

In later fabrication stages, portions of the semiconductor layers 16 form nanosheet channels in a multi-gate device. Five first semiconductor layers 14 and five second semiconductor layers 16 are alternately arranged, as an example illustrated in FIG. 2. More or less semiconductor layers 14 and 16 may be included in the semiconductor stack 18 depending on the desired number of channels to be formed in the semiconductor device. In some embodiments, the number of semiconductor layers 16 is between 1 and 10.

The semiconductor layers 14, 16 may be formed by a molecular beam epitaxy (MBE) process, a metalorganic chemical vapor deposition (MOCVD) process, and/or other suitable epitaxial growth processes. In some embodiments, the semiconductor layers 16 include the same material as the substrate 10. In some embodiments, the semiconductor layers 14 and 16 include different materials than the substrate 10. In some embodiments, the semiconductor layers 14 and 16 are made of materials having different lattice constants. In some embodiments, the first semiconductor layers 14 include an epitaxially grown silicon germanium (SiGe) layer and the second semiconductor layers 16 include an epitaxially grown silicon (Si) layer. Alternatively, in some embodiments, either of the semiconductor layers 14 and 16 may include other materials such as Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

In some embodiments, each second semiconductor layer 16 has a thickness in a range between about 5 nm and about 30 nm. In other embodiments, each second semiconductor layer 16 has a thickness in a range between about 10 nm and about 20 nm. In some embodiments, each second semiconductor layer 16 has a thickness in a range between about 6 nm and about 12 nm. In some embodiments, the second semiconductor layers 16 in the semiconductor stack 18 are uniform in thickness. The first semiconductor layers 14 in channel regions may eventually be removed and serve to define a vertical distance between adjacent channel regions for a subsequently formed multi-gate device. In some embodiments, the thickness of the first semiconductor layer 14 is equal to or greater than the thickness of the second semiconductor layer 16. In some embodiments, each semiconductor layer 14 has a thickness in a range between about 5 nm and about 50 nm. In other embodiments, each first semiconductor layer 14 has a thickness in a range between about 10 nm and about 30 nm.

The hard mask layer 20 is formed over the semiconductor stack 18. The hard mask layer 20 is selected to have a high etching selectivity with relative to materials of dummy gate structures so as to function as an etch stop during formation of dummy gate structures. As discussed below, the hard mask layer 20 remains on subsequently formed fin structures and functions as a fin-top hard mask to provide protection to the fin structures during formation of gate structures. In some embodiments, the hard mask layer 20 is selected to have an etch selectivity with respect to material used in sacrificial gate electrode, such as poly-crystalline-silicon (poly-Si), amorphous silicon, poly-crystalline silicon-germanium (poly-SiGe), or the like. In some embodiments, the sacrificial gate electrode material has an etch selectivity over the hard mask layer 20, which is the ratio of the etching rate of the sacrificial gate electrode material to the etching rate of the hard mask layer 20, higher than about 30. For example, the sacrificial gate electrode material has an etch selectivity over the hard mask layer 20 in an arrange between 30 and 50. If the etch selectivity is lower than 30, a thicker hard mask layer 20 is needed to function as an etch stop, which will increase aspect ratio of the fin structure to be formed and processed, thus increase fabrication difficulty. If the etch selectivity is greater than 50, no obvious advantage is achieved to obtain high etch selectivity.

In some embodiments, the hard mask layer 20 is formed of silicon oxycarbo-nitride (SiOCN), silicon nitride (SiN), silicon carbo-nitride (SiCN), or the like. In some embodiments, the hard mask layer 20 is formed by atomic layer deposition (ALD), chemical vapor deposition (CVD), or other suitable method.

The hard mask layer 20 has a thickness T1 in a range between about 1 nm and about 5 nm. If the thickness T1 is less than 1 nm, the hard mask layer 20 may not be thick enough to function as a mask to protect the semiconductor stack 18 underneath during subsequent processing. If the thickness T1 is greater than 5 nm, the hard mask layer 20 may increase aspect ratio of semiconductor fins to be formed, which would increase manufacturing difficulties without significant advantages. In some embodiments, the thickness T1 is between about 1 nm and 3 nm.

Alternatively, when Fin-FET devices are to be formed over the substrate 10, the semiconductor stack 18 is omitted and the hard mask layer 20 is formed directly on the substrate 10. In such a case, the hard mask layer 20 can function to protect semiconductor fins formed from semiconductor material of the substrate 10 during the subsequent processing.

Figure 3:
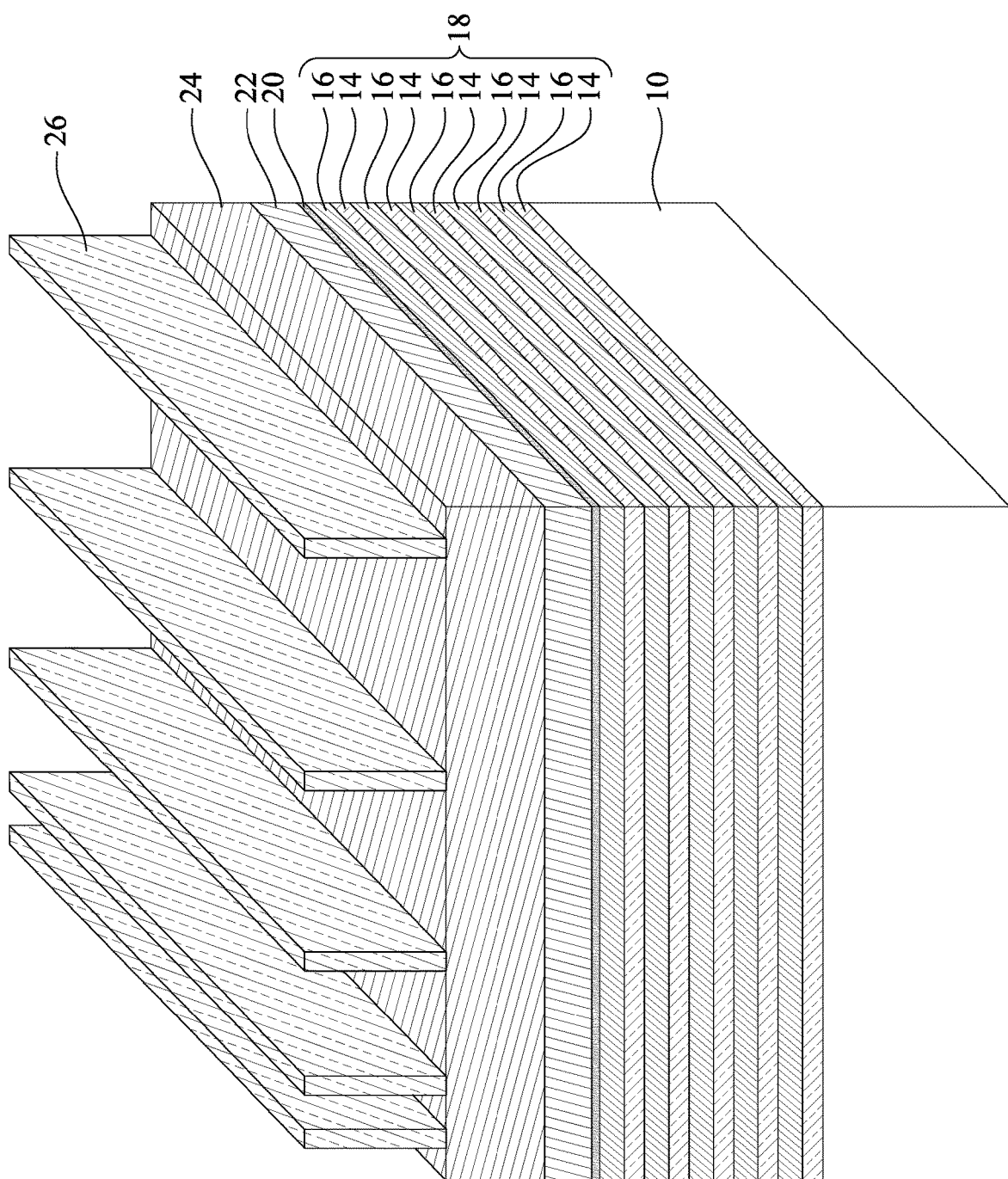
Figure 4:
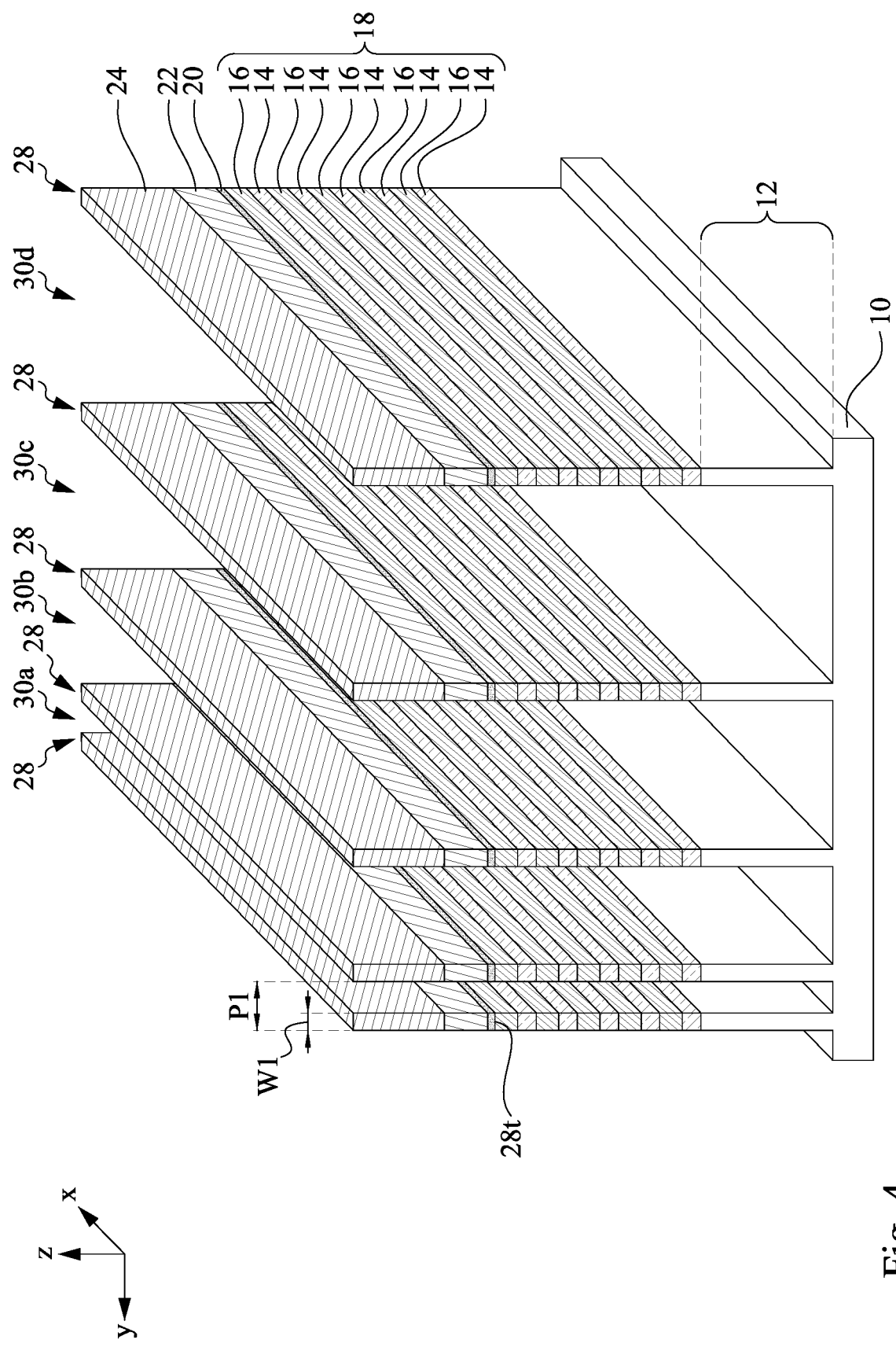

In operation 204, a plurality of semiconductor fins 28 are formed on the substrate 10 as shown in FIGS. 3-4. The plurality of semiconductor fins 28 may be formed by lithography and etching processes using one or more patterning layers. In the example of FIG. 3, a pad layer 22 and a mask layer 24 are formed on the hard mask layer 20. A photo resist layer 26 is formed on the mask layer 24 and then patterned by a photolithograph process. The pad layer 22 may be a thin film including silicon oxide formed, for example, using a thermal oxidation process. The pad layer 22 may act as an adhesion layer between the hard mask layer 20 and the mask layer 24. The pad layer 22 may also act as an etch stop layer for etching the mask layer 24. In some embodiments, the mask layer 24 is formed of silicon nitride, for example, using low-pressure chemical vapor deposition (LPCVD). In some other embodiments, the mask layer 24 is formed by thermal nitridation of silicon, plasma enhanced chemical vapor deposition (PECVD), or plasma anodic nitridation. The mask layer 24 is used as a hard mask during subsequent photolithography processes. The photo resist layer 26 may include positive-type or negative-type resist materials. In one example, the photo resist layer 26 includes poly(methylmethacrylate) (PMMA). Then, the photo resist layer 26 is subjected to an exposure process. For example, the photo resist layer 26 is exposed to radiation energy, such as ultraviolet (UV) radiation, through a mask (photomask or reticle) having a predefined pattern, resulting in the patterned photo resist layer 26 that includes exposed regions of the photo resist layer 26.

In FIG. 4, the mask layer 24, the pad layer 22, the hard mask layer 20, the semiconductor stack 18, and a portion of the substrate 10 are patterned. In some embodiments, the mask layer 24 and the pad layer 22 are etched through using the patterned photo resist layer 26 to expose the underlying hard mask layer 20. After etching the mask layer 24 and the pad layer 22, the photo resist layer 26 is removed. The exposed hard mask layer 20, the semiconductor stack 18, and a portion of the substrate 10 are then etched though the patterned mask layer 24 and pad layer 22 using suitable processes. The hard mask layer 20 may be etched together with or separately from the semiconductor stack 18 and the substrate 10 using a suitable process.

After the semiconductor stack 18 and substrate 10 are etched, the plurality of semiconductor fins 28 are formed. The plurality of semiconductor fins 28 are substantially parallel to each other. Each semiconductor fin 28 has an upper portion including the semiconductor layers 14, 16 and a well portion 12 formed from the substrate 10. The hard mask layer 20 is disposed on a top surface 28t of each semiconductor fin 28. Trenches 30 are formed between neighboring semiconductor fins 28. The trenches 30 may have the same width or different widths according to circuit design. In FIG. 4, trenches 30a, 30b, 30c, and 30d of various widths are formed between the semiconductor fins 28.

In FIG. 4, the semiconductor fins 28 are formed along the X direction. A width W1 of the semiconductor fins 28 along the Y direction is in a range between about 10 nm and about 40 nm. In some embodiments, the width W1 of the semiconductor fins 28 along the Y direction is in a range between about 20 nm and about 30 nm. The pitch P1 of the semiconductor fins 28 denotes the minimum distance between any neighboring semiconductor fins 28 among the plurality of semiconductor fins 28. In some embodiments, the pitch P1 is in a range between about 20 nm and 60 nm. Because the method 200 according to embodiments of the present disclosure using the hard mask layer 20 in manufacture FET devices including Fin-FETs, nanosheet FETs, GAA FETs, or other multi-channel FETs, the pitch P1 of the semiconductor fins 28 is smaller than the pitch of semiconductor fins in conventional FET process sequencing. In some embodiments, the pitch P1 is smaller than the pitch used in conventional FET process sequence by an amount in a range between about 4 nm and about 6 nm, when other parameters are kept the same.

Figure 5:
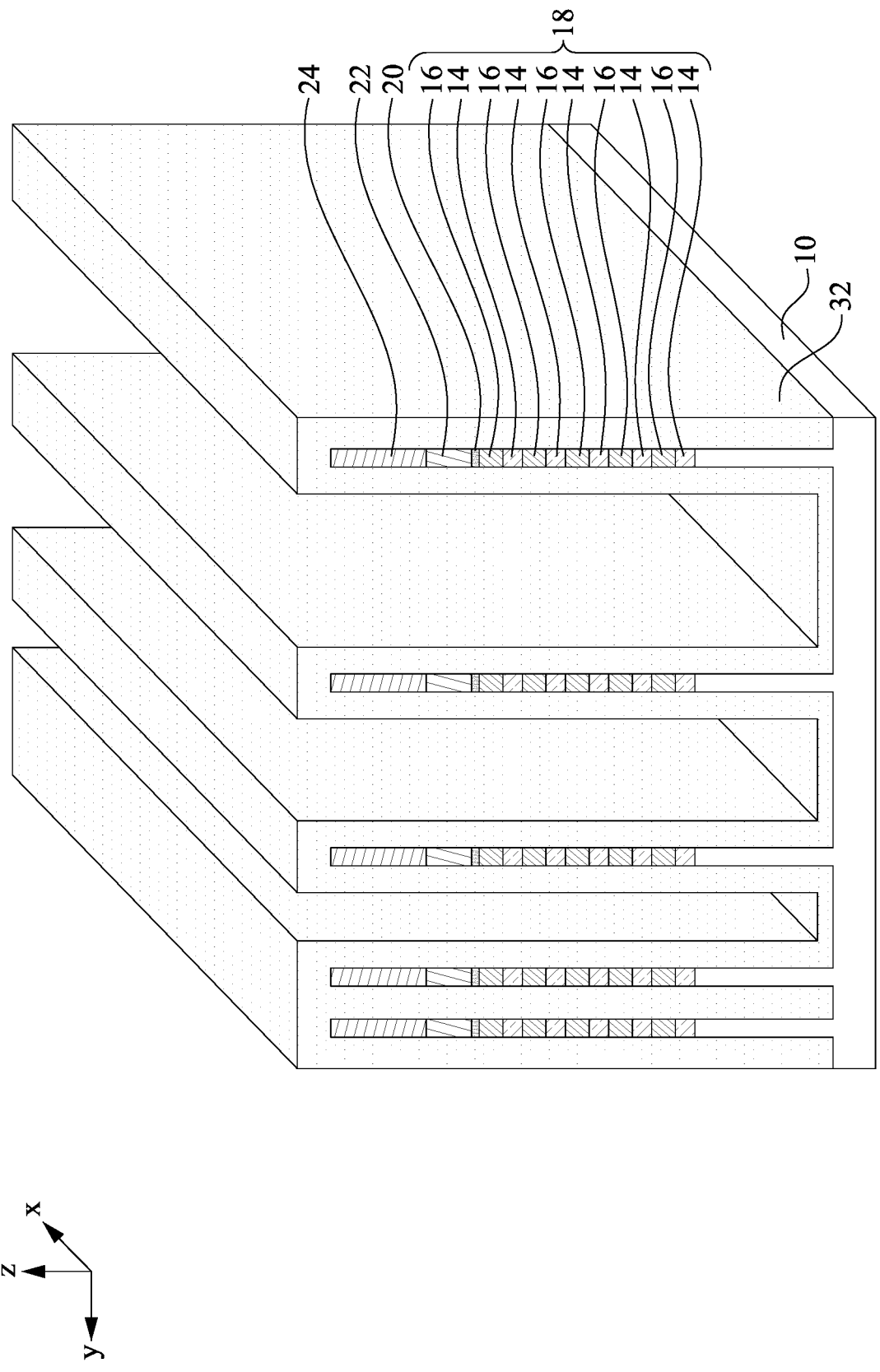
Figure 6:
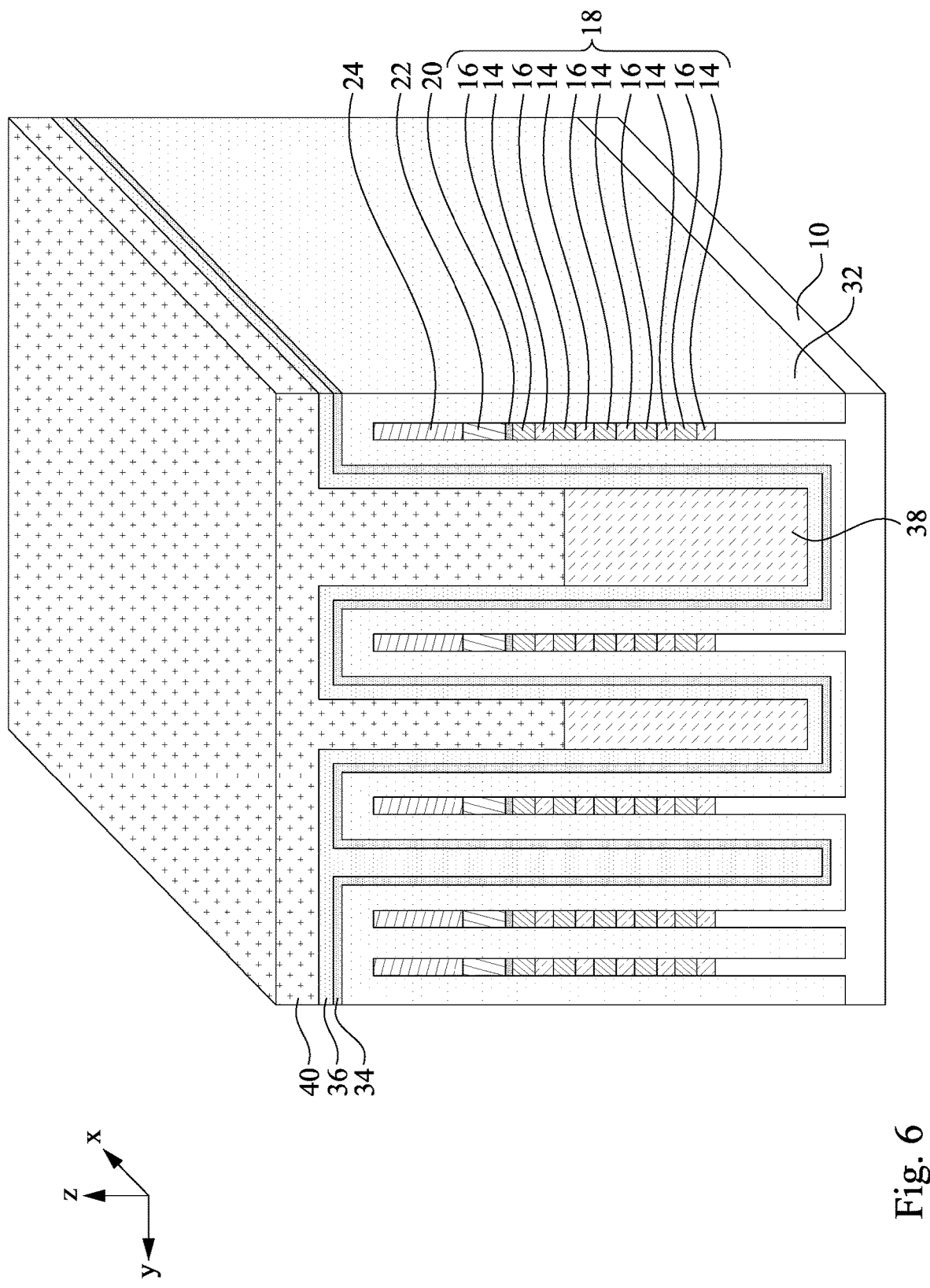

In operation 206, an isolation layer 32 is formed over the semiconductor fins 28 as shown in FIG. 5. The isolation layer 32 may be formed by a high density plasma chemical vapor deposition (HDP-CVD), a flowable CVD (FCVD), or other suitable deposition process. In some embodiments, the isolation layer 32 is formed conformally to cover the semiconductor fins 28 by a suitable deposition process, such as atomic layer deposition (ALD). In some embodiments, the isolation layer 32 may include silicon oxide, silicon nitride, silicon oxynitride, fluorine-doped silicate glass (FSG), a low-k dielectric, combinations thereof.

In some embodiments, the conformal deposition of the isolation layer 32 fills the trenches 30 between neighboring semiconductor fins 28. In the example of FIG. 5, the trench 30a is filled by the isolation layer 32. However, wider trenches 30b, 30c, 30d are not filled by the isolation layer 32 and remain the trench shape.

In some embodiments, after formation of the isolation layer 32, optional operation 208 may be performed to fill remaining trenches 30 with one or more dielectric layers to form hybrid fins therein. In the example shown in FIG. 6, dielectric layers 34, 36, 38, 40 are subsequently filled in the trenches 30b, 30c, and 30d to form hybrid fins 42 (also referred to as dummy fins or dielectric fins) therein. The dielectric layers 34, 36, 38, 40 may be selected from dielectric material of various dielectric values and/or etch properties suitable for desired functions and/or subsequent process. In some embodiments, the hybrid fins 42 may prevent undesirable lateral merging of source/drain epitaxial features formed on immediately adjacent semiconductor fins 28.

In some embodiments, the dielectric layers 34, 36, 38, and 40 may be a combination of different dielectric materials such that the hybrid fins 42 may include a high-k dielectric material layer, a low-k dielectric material layer, or a bi-layer dielectric material including high-k upper part and a low-k lower part. In some embodiments, each of the dielectric layers 34, 36, 38, 40 may be selected from a high-k metal oxide, such as $HfO_2$, $ZrO_2$, $HfAlO_x$, $HfSiO_x$, $Al_2O_3$, and the like, a low-k material such as SiONC, SiCN, SiOC, or other dielectric material.

Figure 7:
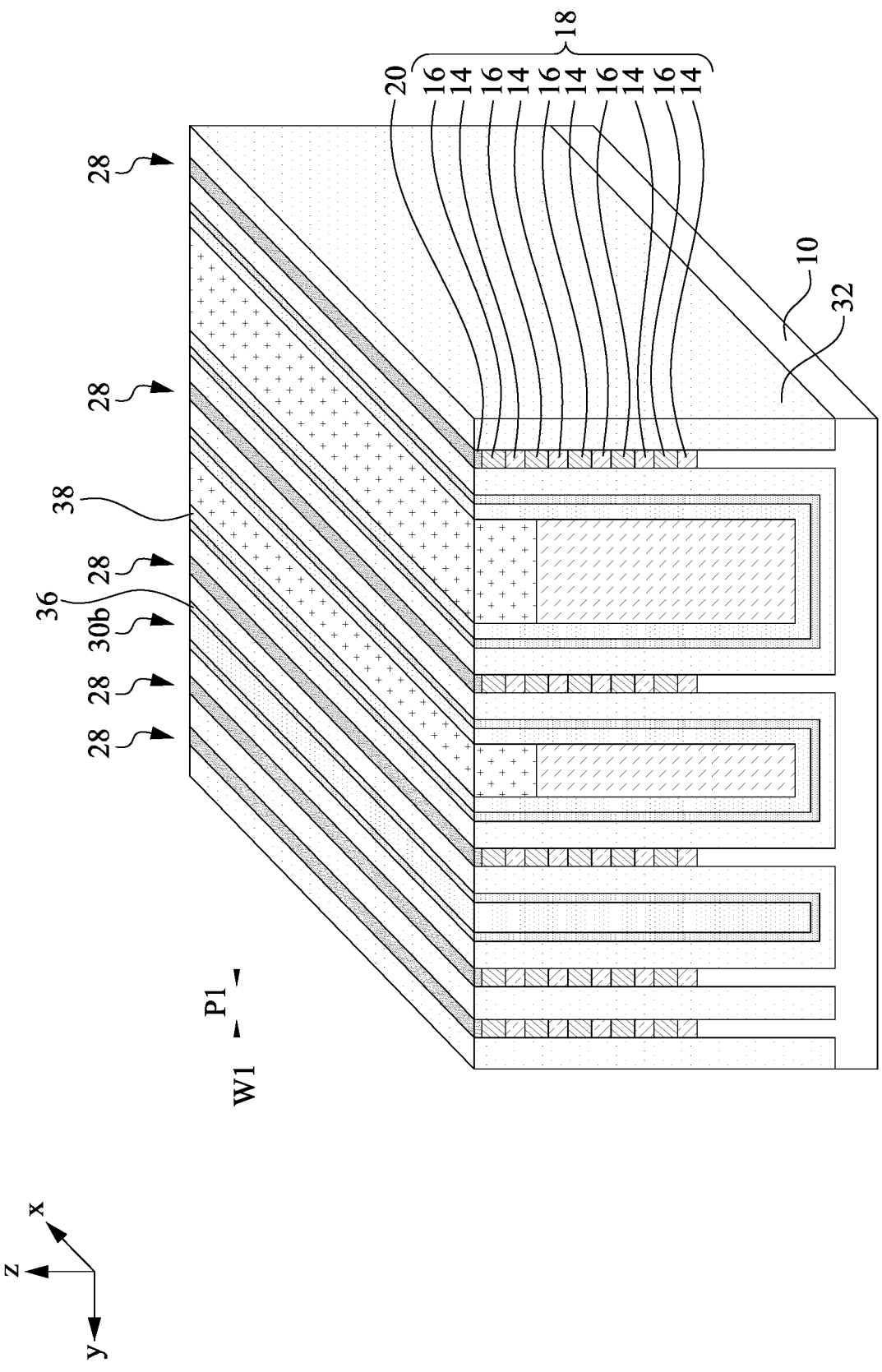

In operation 210, as shown in FIG. 7, a planarization process, such as a chemical mechanical polishing (CMP) process, is performed to remove the excessive isolation layer 32, and excessive dielectric layers 34, 36, 38, 40 until the hard mask layer 20 on top of the semiconductor fins 28 is exposed.

Figure 8:
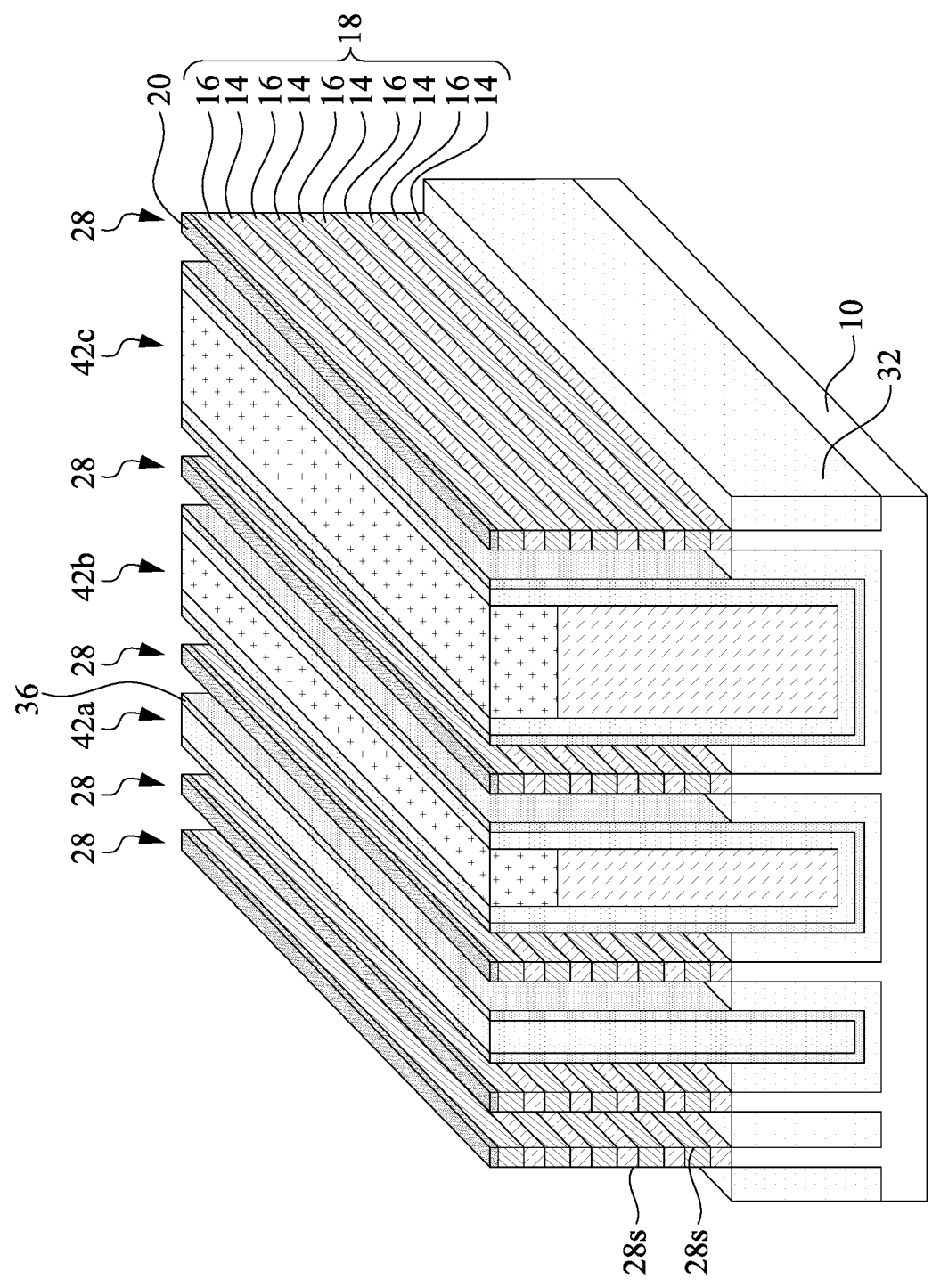

In operation 212, as shown in FIG. 8, the isolation layer 32 is recess etched using a suitable anisotropic etching process to expose the semiconductor fins 28 and the hybrid fins 42. In some embodiments, the isolation layer 32 is etched to expose at least the semiconductor stack 18 in the semiconductor fins 28. The isolation layer 32 is removed by a selective etch process with a higher etch rate to the isolation layer 32 than the hard mask layer 20, the semiconductor layers 14, 16, and exposed dielectric layers, such as dielectric layers 36 and 40, in the hybrid fins 42. In some embodiments, the isolation layer 32 is removed using a selective wet etch or a selective dry etch. In some embodiments, a wet etching solution includes a tetramethylammonium hydroxide (TMAH), a $HF/HNO_3/CH_3COOH$ solution, or other suitable solution may be used to selectively etch the isolation layer 32. In some embodiments, a wet etching solution including $NH_4OH$, KOH (potassium hydroxide), HF (hydrofluoric acid), TMAH (tetramethylammonium hydroxide), other suitable wet etching solutions, or combinations thereof, may be used to remove the isolation layer 32. In other embodiments, a biased plasma etching process that uses a chlorine-based chemistry or fluorine based chemistry may be used to etch the isolation layer 32.

Figure 9:
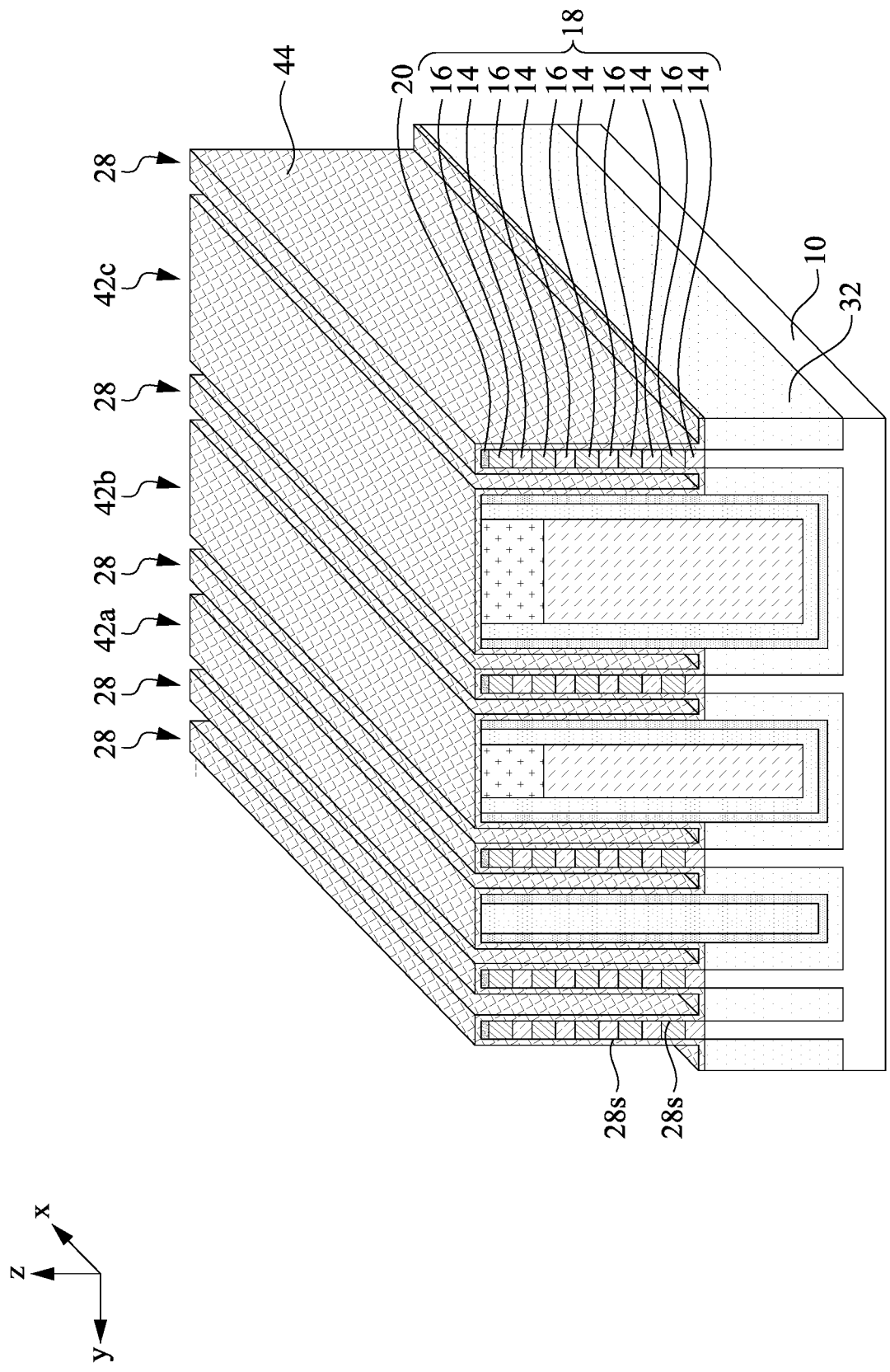

In operation 214, as shown in FIG. 9, a sacrificial gate dielectric layer 44 is conformally formed over the substrate 10. The sacrificial gate dielectric layer 44 is formed over the semiconductor fins 28 and the hybrid fins 42. The sacrificial gate dielectric layer 44 covers side surfaces 28s of the semiconductor fins 28 and the hard mask layer 20 on the top surface 28t of the semiconductor fins 28. The sacrificial gate dielectric layer 44 is configured to cover and protect side surfaces 28s of the semiconductor fins 28 during the subsequent etching processes to form sacrificial gate structures.

The sacrificial gate dielectric layer 44 and a sacrificial gate electrode layer 46 (FIG. 10), which is subsequently deposited, may include sufficient etching selectivity of the etching process, such that the sacrificial gate dielectric layer 44 remains after etching the sacrificial gate electrode layer 46. That is, the sacrificial gate dielectric layer 44 may include higher etching resistance to the etchant than the sacrificial gate electrode layer 46.

In some embodiments, the sacrificial gate dielectric layer 44 has a thickness in a range between about 1 nm and about 4 nm. If the thickness of the sacrificial gate dielectric layer 44 is less than 1 nm, the sacrificial gate dielectric layer 44 may not be able to withstand the etchant in subsequent process to maintain coverage of the side surfaces 28s of the semiconductor fins 28 in some instances. If the thickness of the sacrificial gate dielectric layer 44 is greater than 4 nm, the sacrificial gate dielectric layer 44 may fill the trenches 30 between the fins 28 and 42, and may be challenging to remove to expose the semiconductor fins 28 for epitaxial processes and/or replacement gate processes in some instances.

The sacrificial gate dielectric layer 44 may include silicon oxide, silicon nitride, a combination thereof, or the like. The sacrificial gate dielectric layer 44 may be deposited or thermally grown according to acceptable techniques, such as thermal CVD, CVD, ALD, and other suitable methods.

Figure 10:
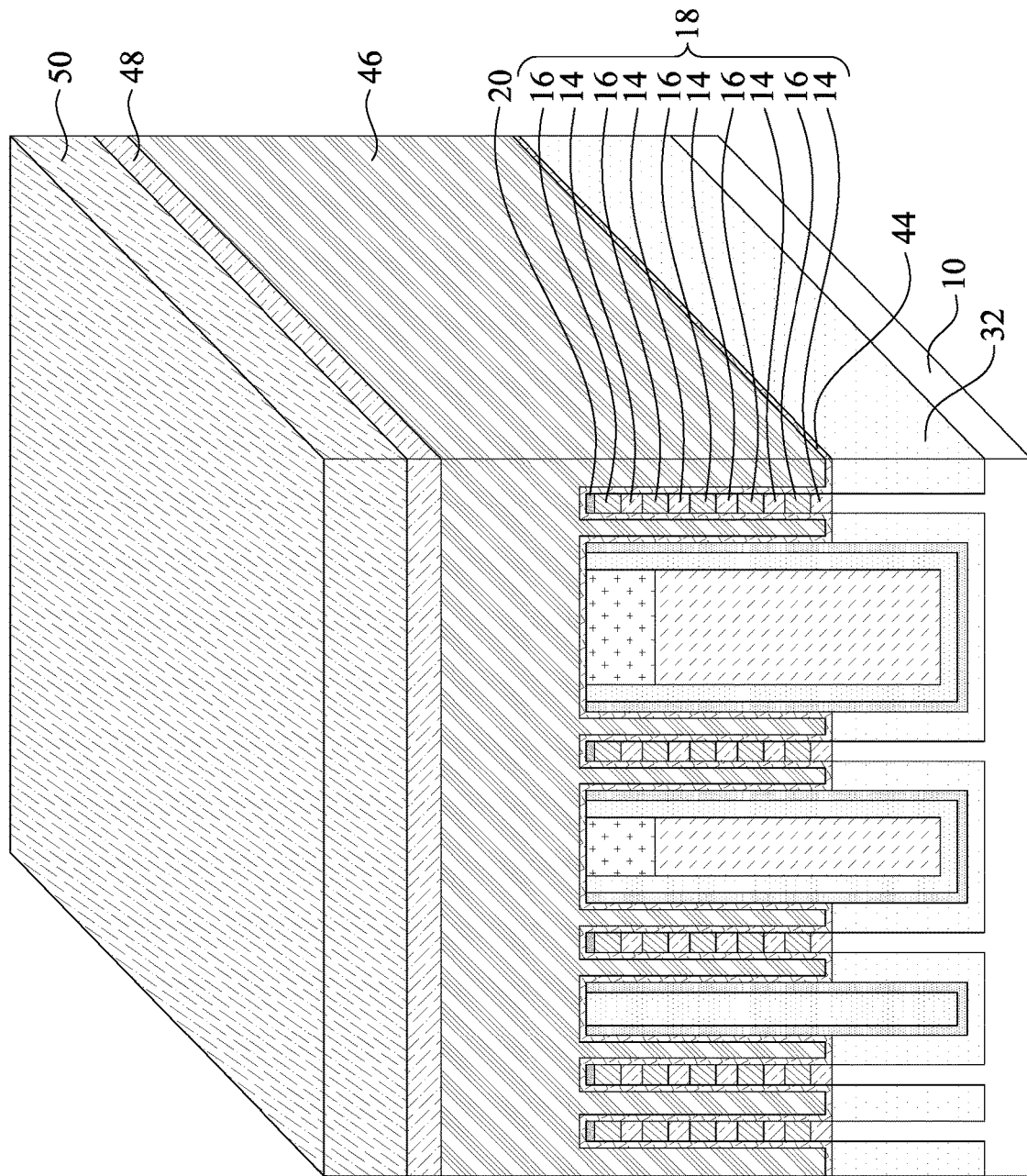
Figure 11A:
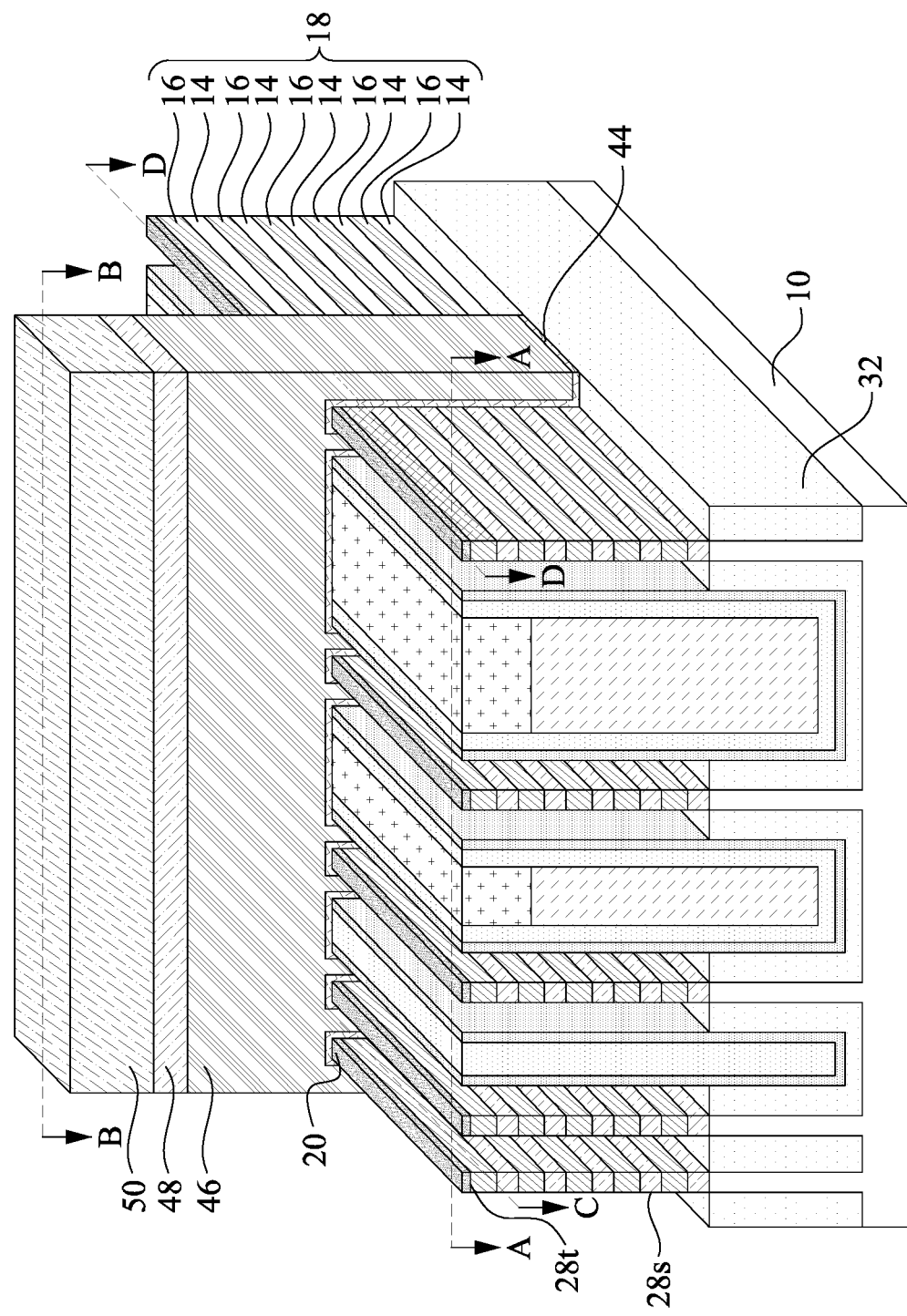
FIGS. 11A-11D, FIGS. 12A-12E to 14A-14E, FIGS. 15A-15D to 20A-20D, FIGS. 21A-21E to 24A-24E, and FIGS. 25A-25F are schematic views of the semiconductor device at various stages of manufacturing the semiconductor device according to embodiments of the present disclosure.
Figure 11B:
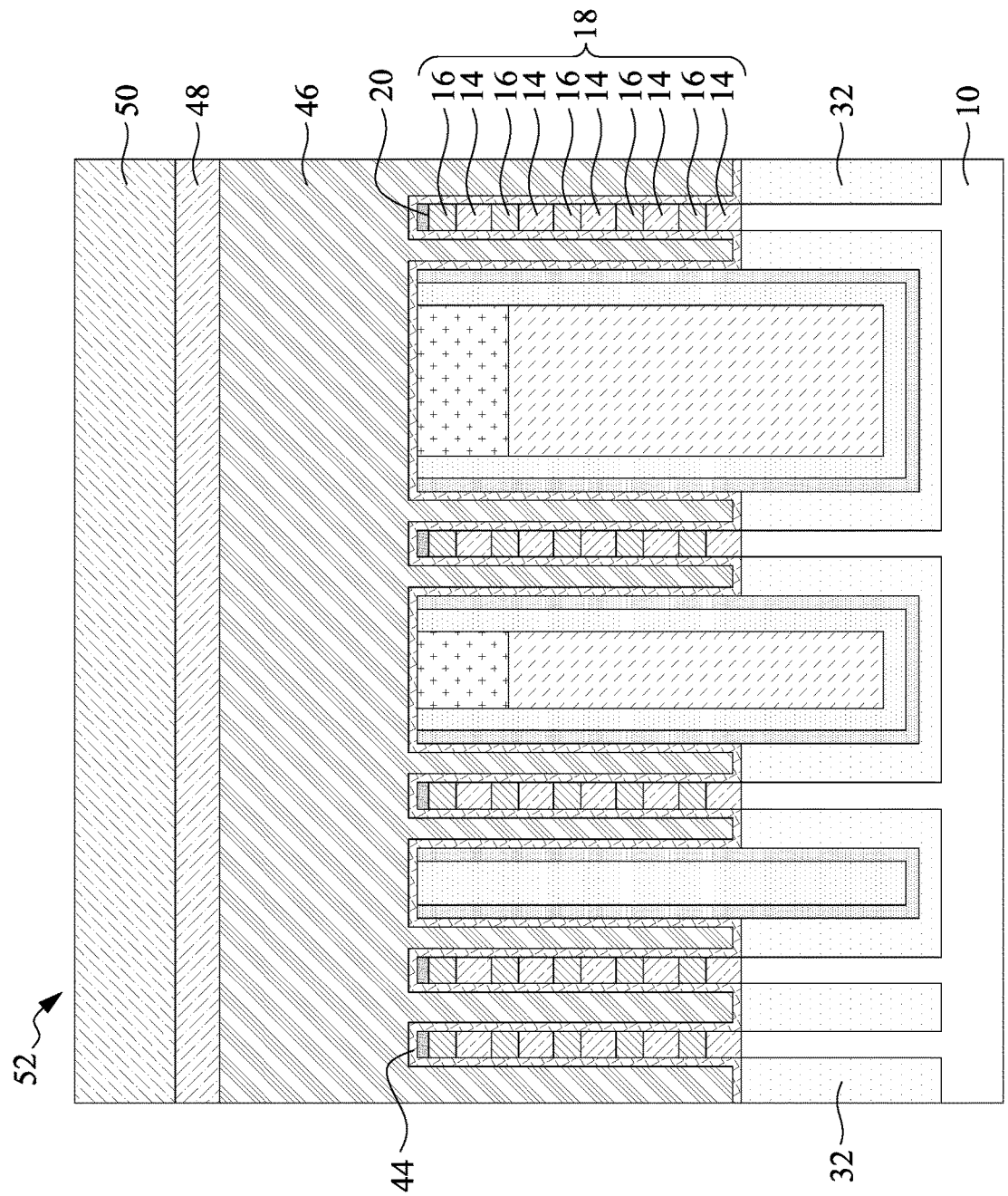
Figure 11D:
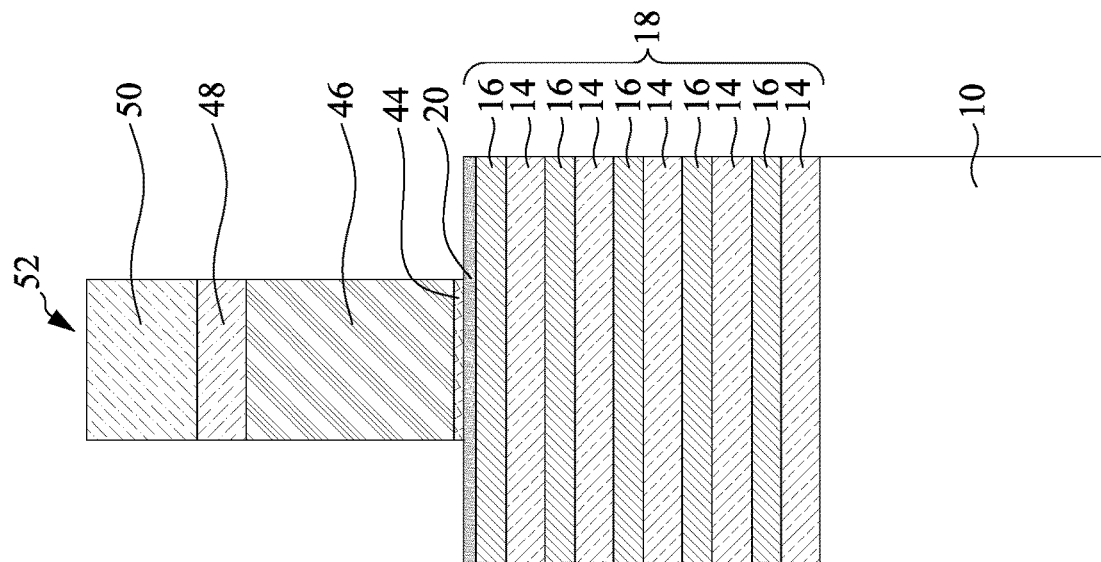
Figure 11C:
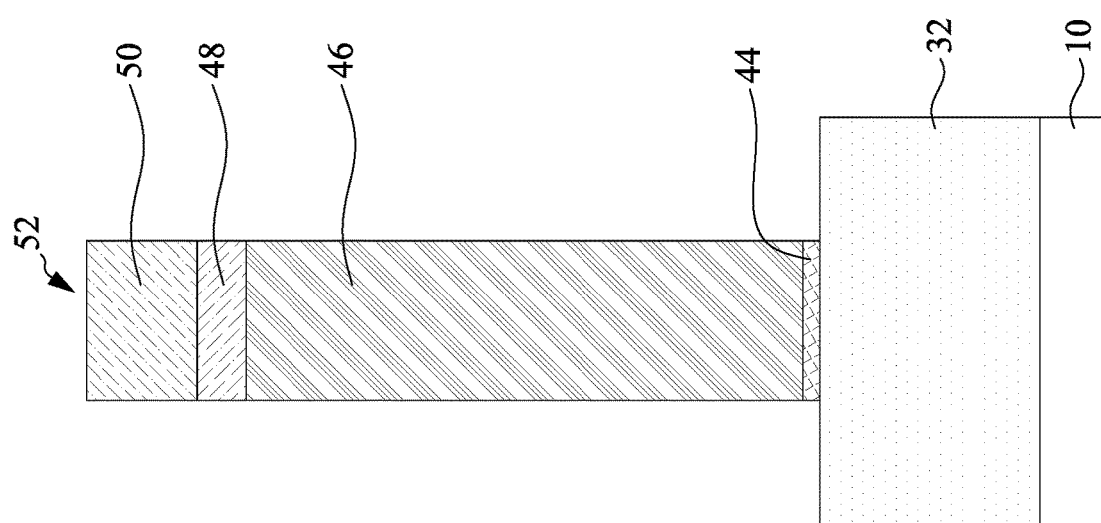

In operation 216, a sacrificial gate structure 52 is formed over the semiconductor fins 28 and the hybrid fins 42, as shown in FIG. 10 to FIGS. 11A-11D. FIG. 11A is a schematic perspective view of the semiconductor device of FIGS. 2-10. FIG. 11B is a cross sectional view of the semiconductor device along the line B-B in FIG. 11A. FIG. 11C is a cross sectional view of the semiconductor device along the line C-C in FIG. 11A. FIG. 11D is a cross sectional view of the semiconductor device along the line D-D in FIG. 11A.

As shown in FIG. 10, to form the sacrificial gate structure 52 (FIG. 11A), a sacrificial gate electrode layer 46 is deposited on the sacrificial gate dielectric layer 44 and then planarized, such as by a CMP process. The sacrificial gate electrode layer 46 includes silicon such as polycrystalline silicon, amorphous silicon, poly-crystalline silicon-germanium (poly-SiGe), or the like. The thickness of the sacrificial gate electrode layer is in a range between about 100 nm and about 200 nm. In some embodiments, the sacrificial gate electrode layer 46 is subjected to a planarization operation. The sacrificial gate electrode layer 46 may be deposited using CVD, including LPCVD and PECVD, PVD, ALD, or other suitable process.

In some embodiments, patterning the In FIGS. 10, a sacrificial gate electrode layer 46, a pad layer 48, and a mask layer 50 are sequentially deposited over the sacrificial gate dielectric layer 44. Subsequently, the pad layer 48 and the mask layer 50 are formed over the sacrificial gate electrode layer 46. The pad layer 48 may include silicon nitride. The mask layer 50 may include silicon oxide.

Next, as shown in FIGS. 11A-11D, a patterning operation is performed on the mask layer 50, the pad layer 48, the sacrificial gate electrode layer 46, and the sacrificial gate dielectric layer 44 to form the sacrificial gate structure 52 using one or more etching processes, such as one or more dry plasma etching processes or one or more wet etching processes. In some embodiments, the mask layer 50 and pad layer 48 are first patterned using a patterning process. The sacrificial gate electrode layer 46 is then patterned using the patterned mask layer 50 and pad layer 48 as an etching mask. In some embodiments, the sacrificial gate electrode layer 46 may be etched to form the gate structure 52 (FIG. 11A) by an anisotropic etching, such as a reactive ion etching (RIE) process. The anisotropic etching has a greater etching rate along the Z direction than etching rates along the X and Y directions. During the etching of the sacrificial gate electrode layer 46, the sacrificial gate dielectric layer 44 and the hard mask layer 20 on the top surface 28t of the semiconductor fins 28 act as etch stops to prevent the etchant from removing the semiconductor fins 28. Because of the anisotropic nature of the etching process, a stronger etching stop is needed on top of the semiconductor fins 28 than on the side surfaces 28s (FIG. 9) of the semiconductor fins 28. In the example of FIGS. 11A-11E, the sacrificial gate dielectric layer 44 alone functions as an etch stop on the side surfaces 28s of the semiconductor fins 28. The combination of the sacrificial gate dielectric layer 44 and hard mask layer 20 on the top surface 28t (FIG. 4) functions as an etch stop for the semiconductor fins 28 on the top surface 28t.

In some embodiments, after patterning the sacrificial gate electrode layer 46, any exposed residual sacrificial gate dielectric layer 44 is removed to expose side surfaces 28s of the semiconductor fins 28 by an etch process. In some embodiments, the residual sacrificial gate dielectric layer 44 can be etched by tuning one or more parameters, such as etchant, etching temperature, etching solution concentration, etching pressure, source power, radio frequency (RF) bias voltage, etchant flow rate, of the etch process for etching the sacrificial gate electrode 46. In other embodiments, a different etching method is used to remove the residual sacrificial gate dielectric layer 44.

After operation 216, the sacrificial gate structure 52 is formed. The sacrificial gate structure 52 covers a portion of the semiconductor fins 28 and the hybrid fins 42. The portion of the semiconductor fins 28 covered by the sacrificial gate structure 52 eventually form a channel region, including one or more channels in a FET device, such as a Fin-FET with a single channel in a fin structure, a nanosheet Fin-FET, a GAA Fin-FET, or the like. After operation 216, the top surface 28t on portions of the semiconductor fins 28 not covered by the sacrificial gate structure 52 is still covered by the hard mask 20.

Figure 12A:
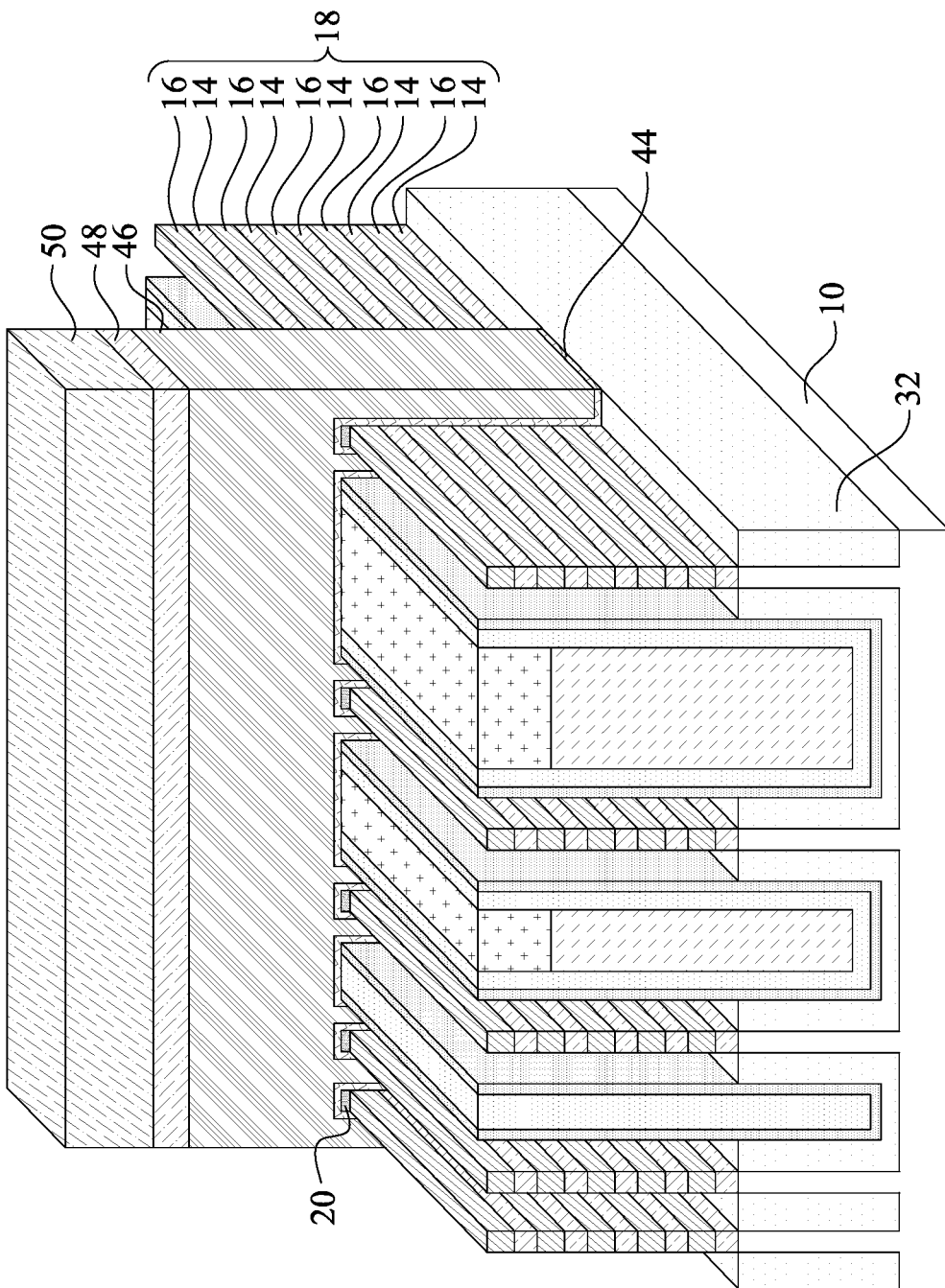
Figure 12B:
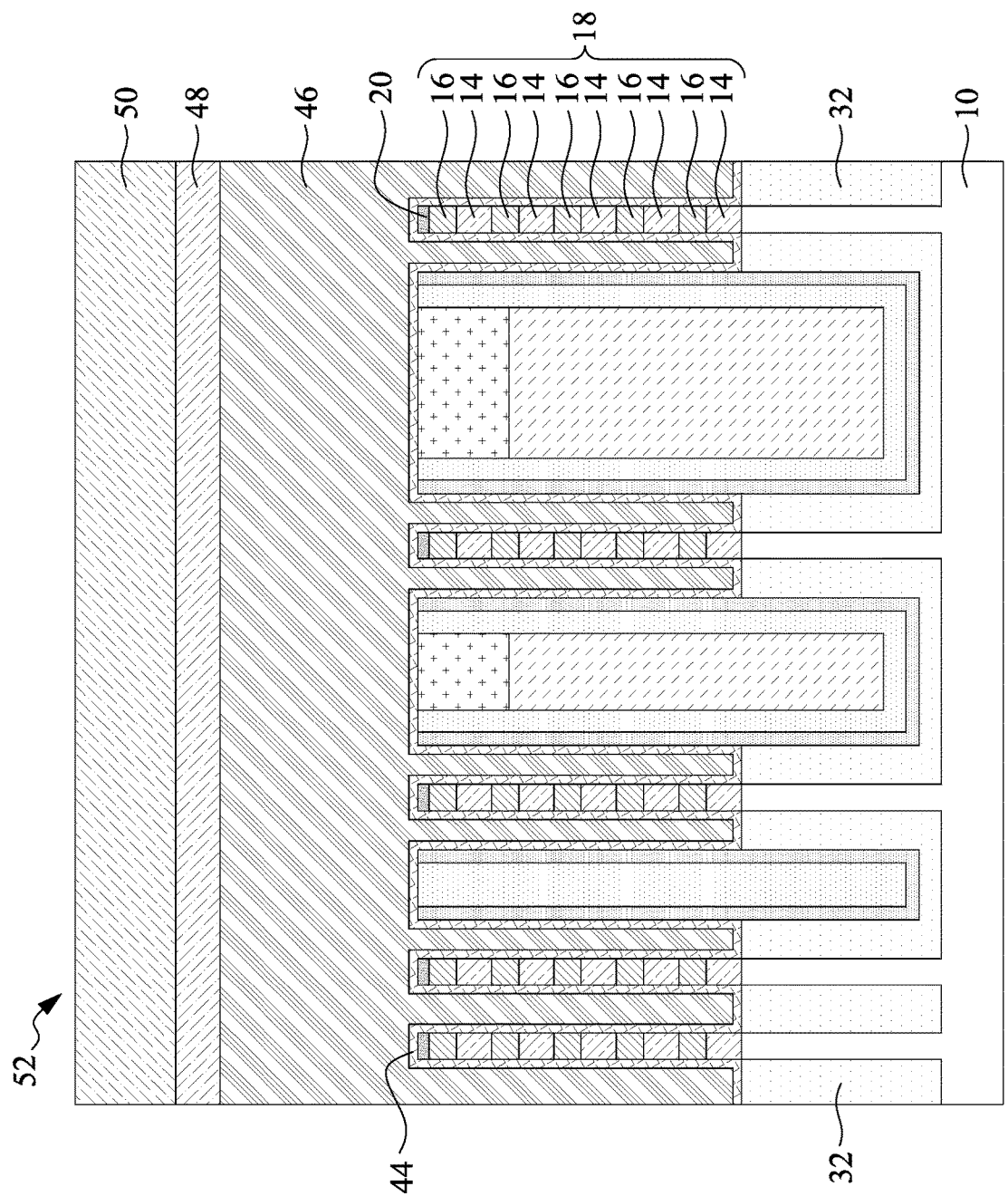
Figure 12D:
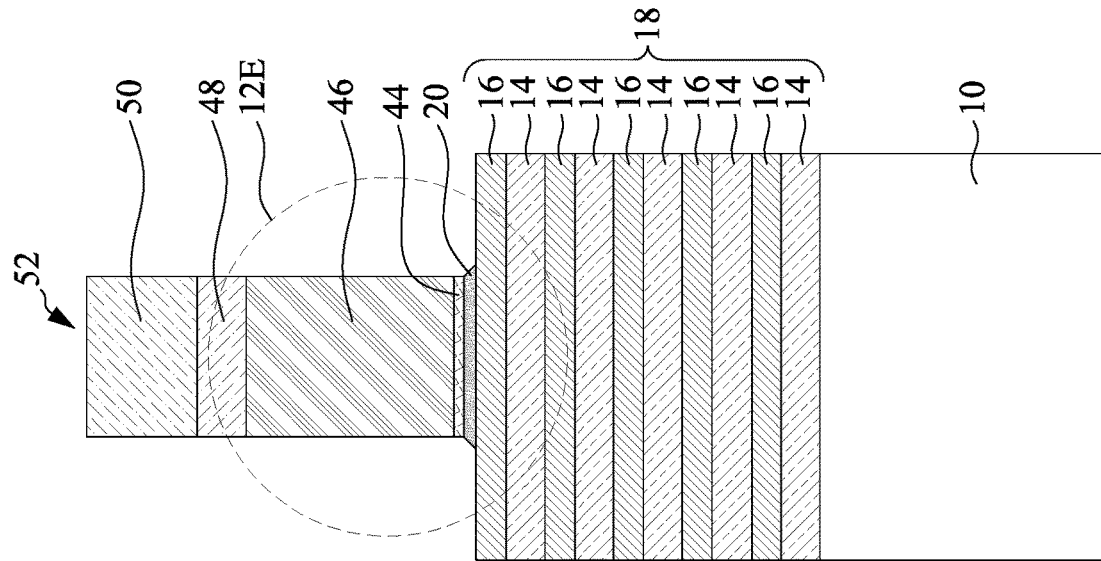
Figure 12C:
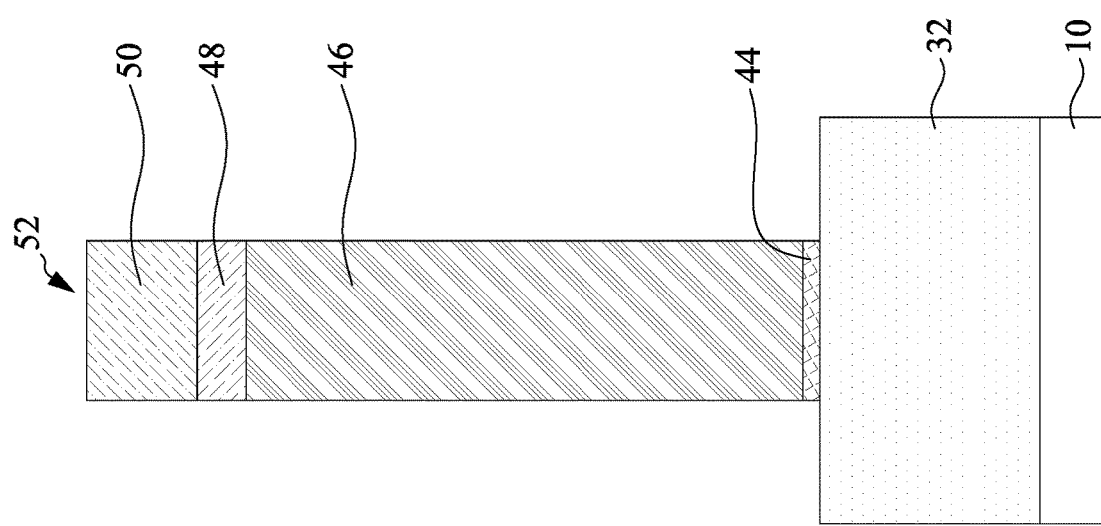
Figure 12E:
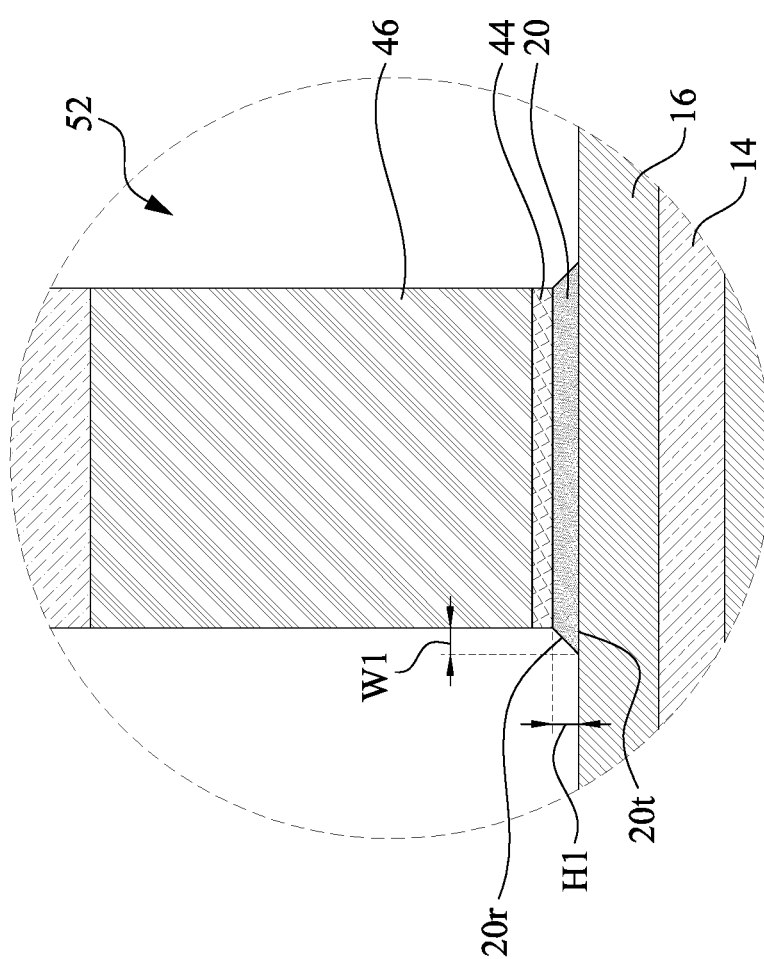

In operation 218, an etching process is performed to remove exposed portion of the hard mask layer 20, as shown in FIGS. 12A-12E. FIG. 12A is a schematic perspective view of the semiconductor device of FIGS. 2-10. FIG. 12B is a cross sectional view of the semiconductor device along the line B-B in FIG. 11A. FIG. 12C is a cross sectional view of the semiconductor device along the line C-C in FIG. 11A. FIG. 12D is a cross sectional view of the semiconductor device along the line D-D in FIG. 11A. FIG. 12E is partial enlarged view of a region in FIG. 12D.

The hard mask layer 20 can be removed by a suitable etch process, such as a dry etch, a wet etch, or a combination thereof. In some embodiments, a wet etching process is used to selectively etch the hard mask layer 20 over the semiconductor stack 18 and the sacrificial gate electrode 46. In some embodiments, a wet etching process using diluted HF as etchant is used when the hard mask layer 20 includes SiOCN. In other embodiments, a wet etching process using trifluormethane ($CHF_3$), carbon tetrafluoride ($CF_4$), and oxygen ($O_2$) as etchant is used when the hard mask layer 20 includes SiCN.

Portions of the hard mask 20 between the sacrificial gate structure 52 and the semiconductor fin 28 remain after the etch process. In some embodiments, the In some instances, a portion 20r of the hard mask layer 20 exposed at either side of the sacrificial gate structure 52 may protrude from under the sacrificial gate structure 52 and form a shape due to limitation of the etching process. FIG. 12E schematically illustrates the location of the portion 20r. In some embodiments, the portion 20r protruded from under the sacrificial gate structure 52 has a triangular shape when viewed in Y direction. The triangular shape may have a height H1 and a width W1. The height H1 and width W1 are related to the etch process in operation 218, the thickness of the hard mask layer 20, and the thickness of the sidewall spacers to be formed. In some instances, the height H1 is in a range between 0 nm and about 4 nm or up to the thickness T1 of the hard mask layer 20. The width W1 is a range between 0 nm and about 4 nm or up to a width of sidewall spacers to be formed.

Figure 13A:
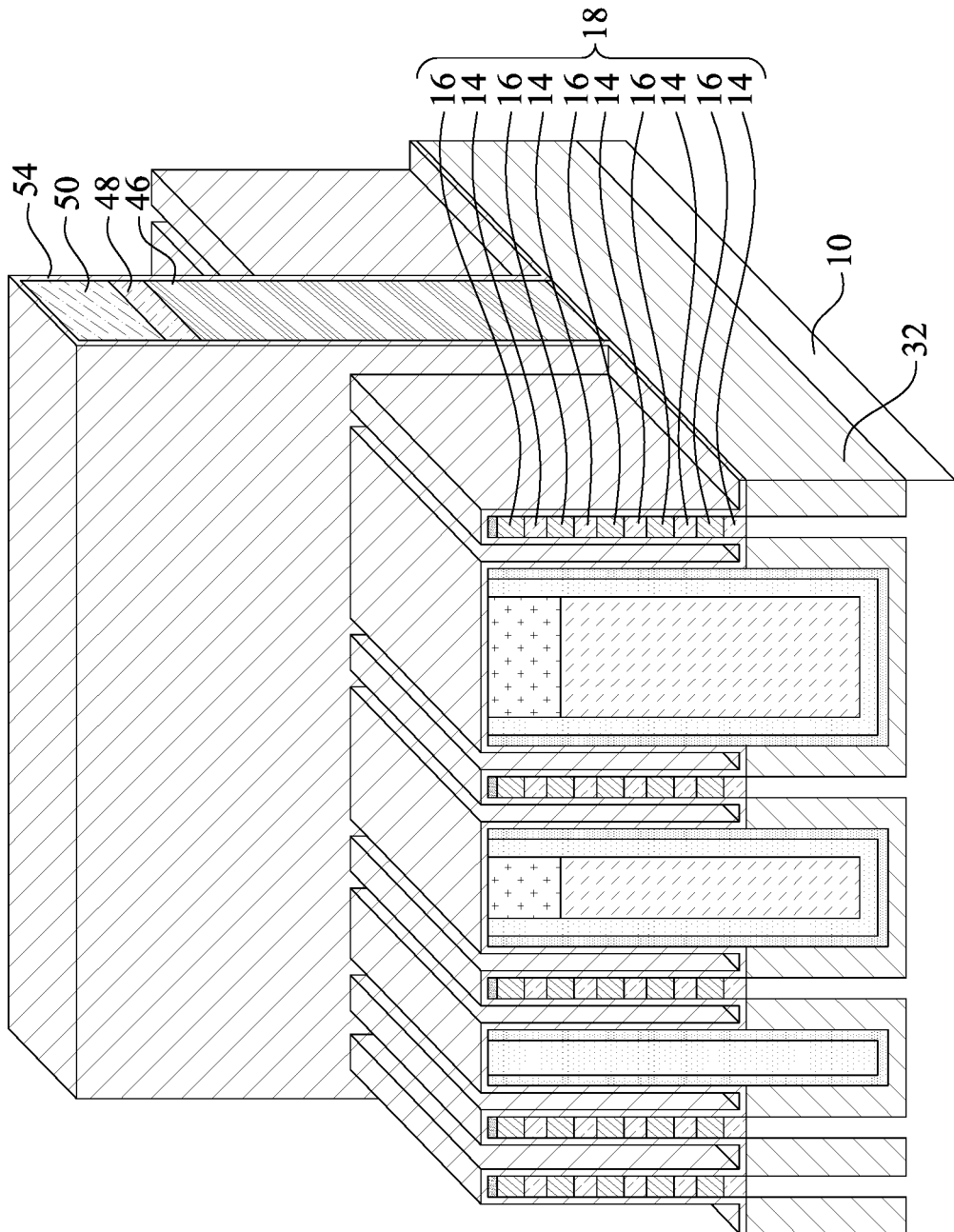
Figure 13B:
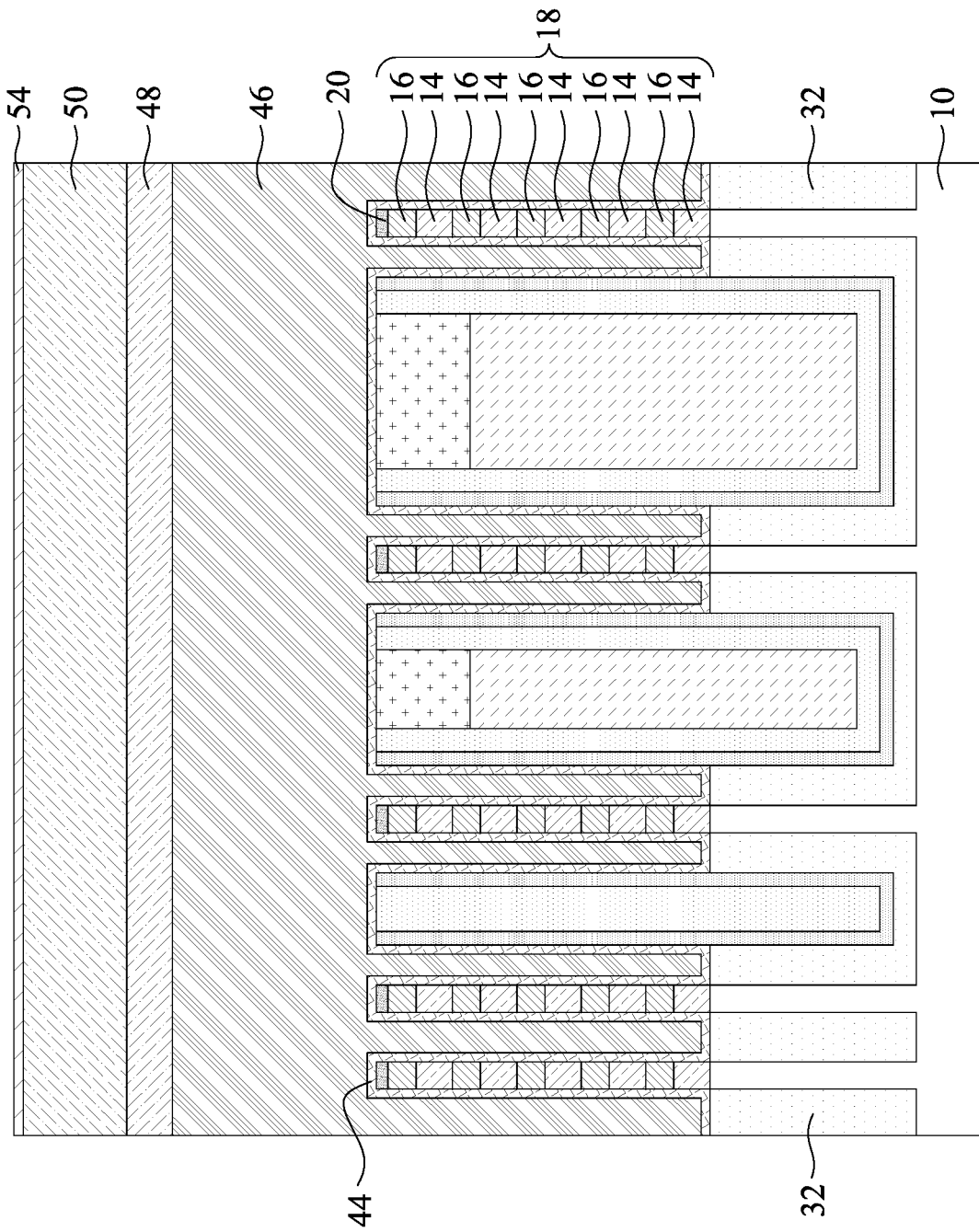
Figure 13D:
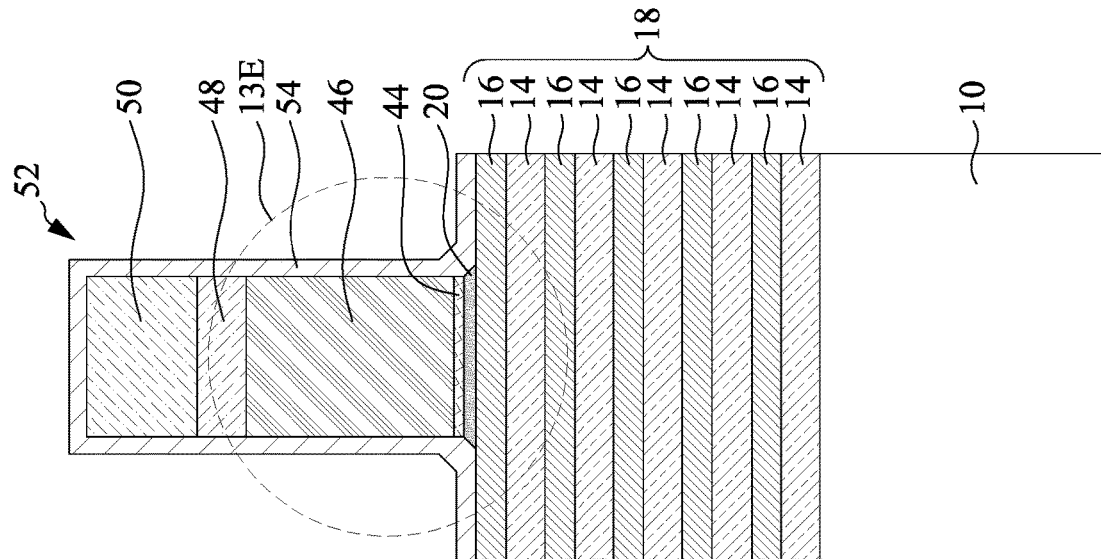
Figure 13C:
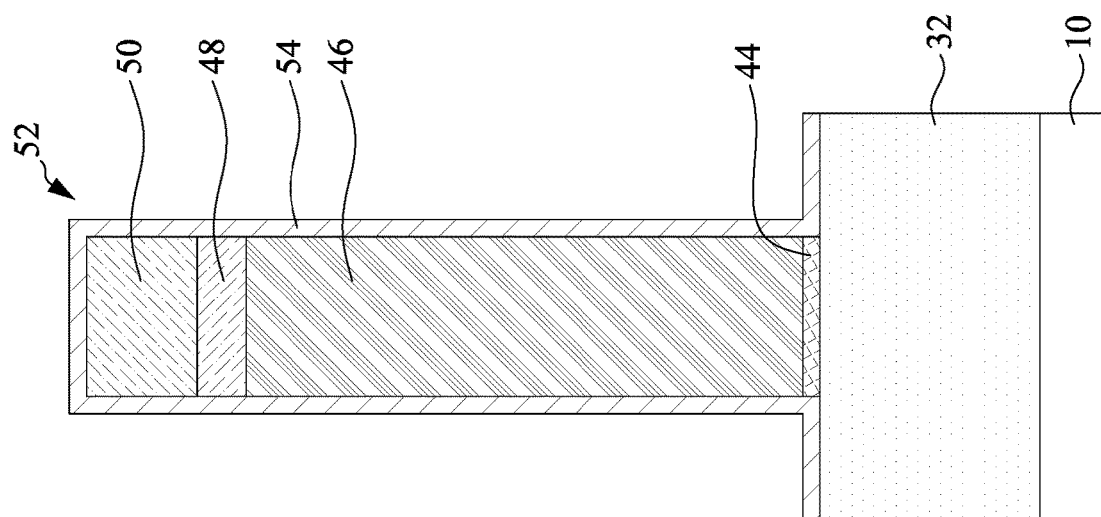
Figure 13E:
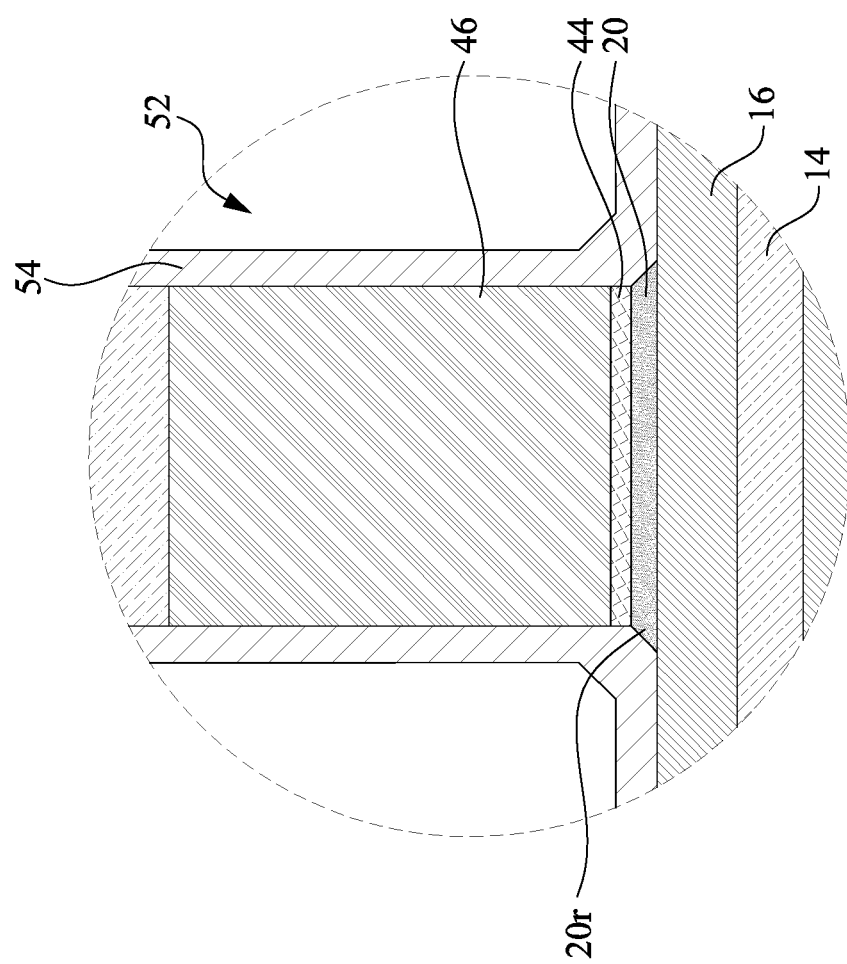
Figure 14A:
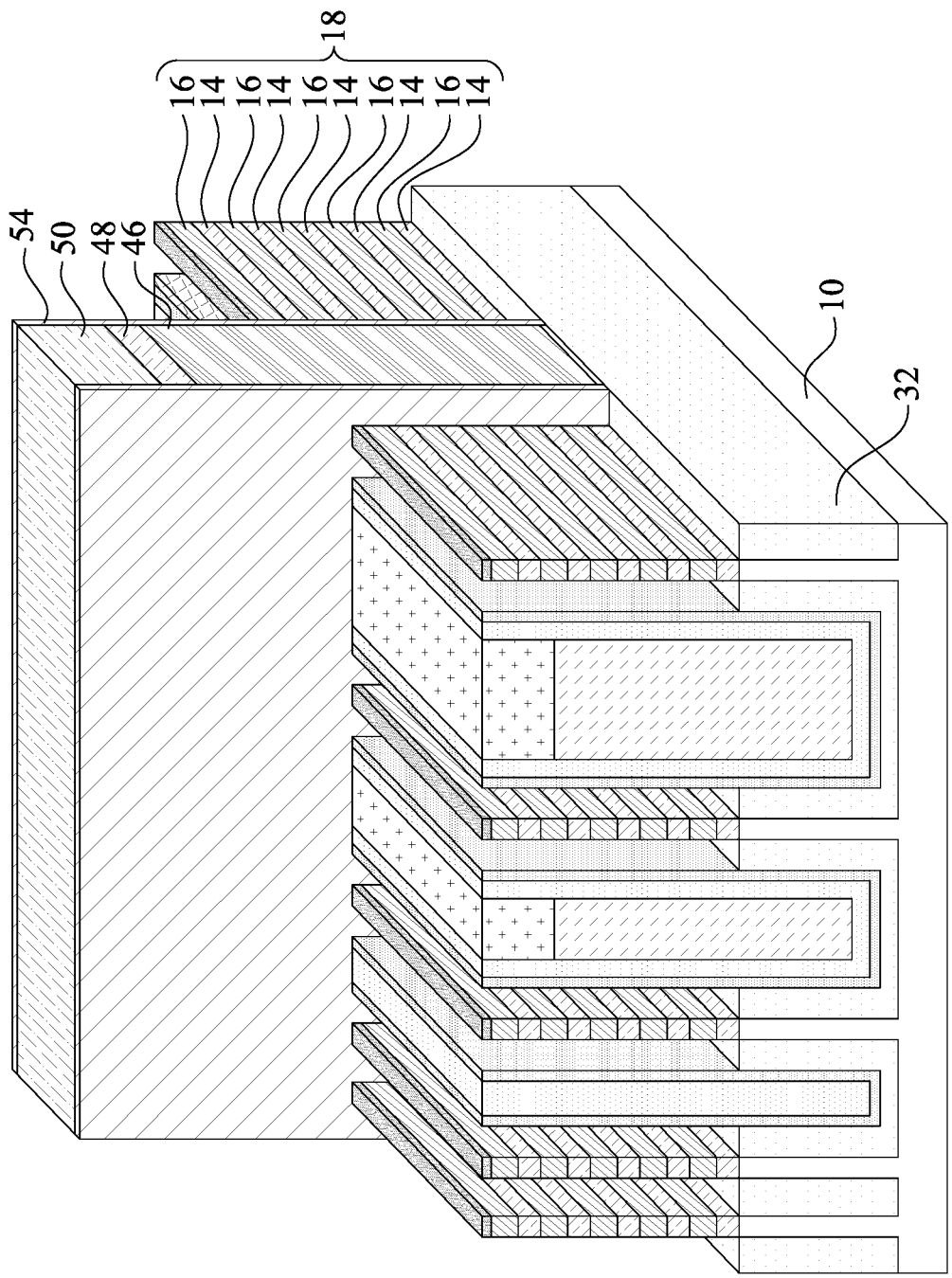
Figure 14B:
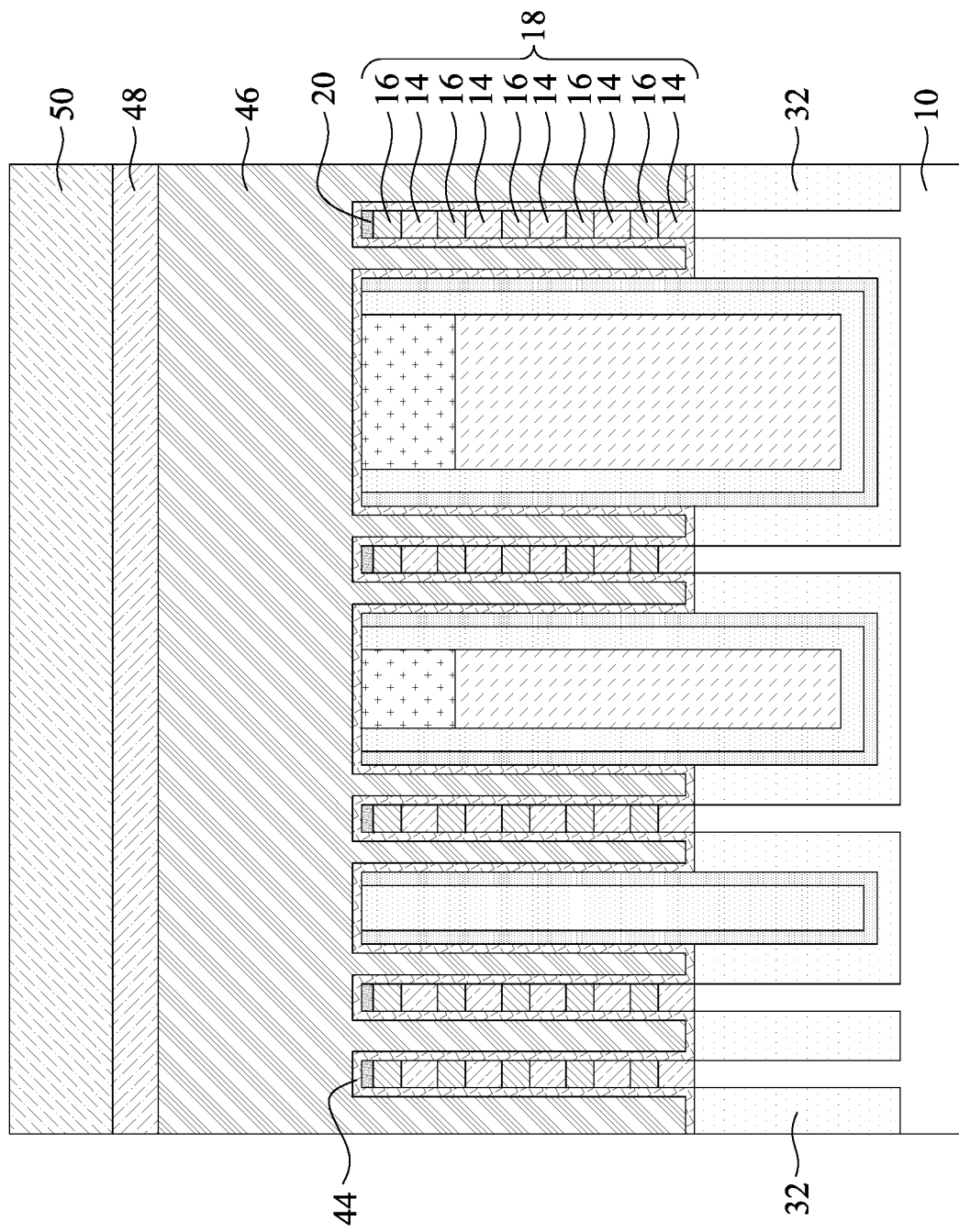
Figure 14D:
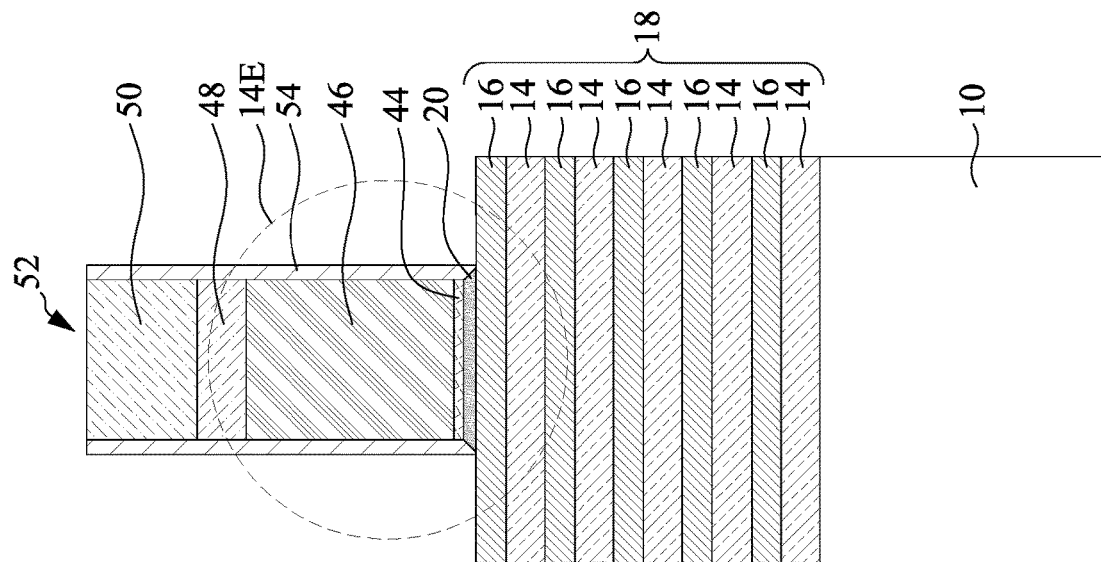
Figure 14C:
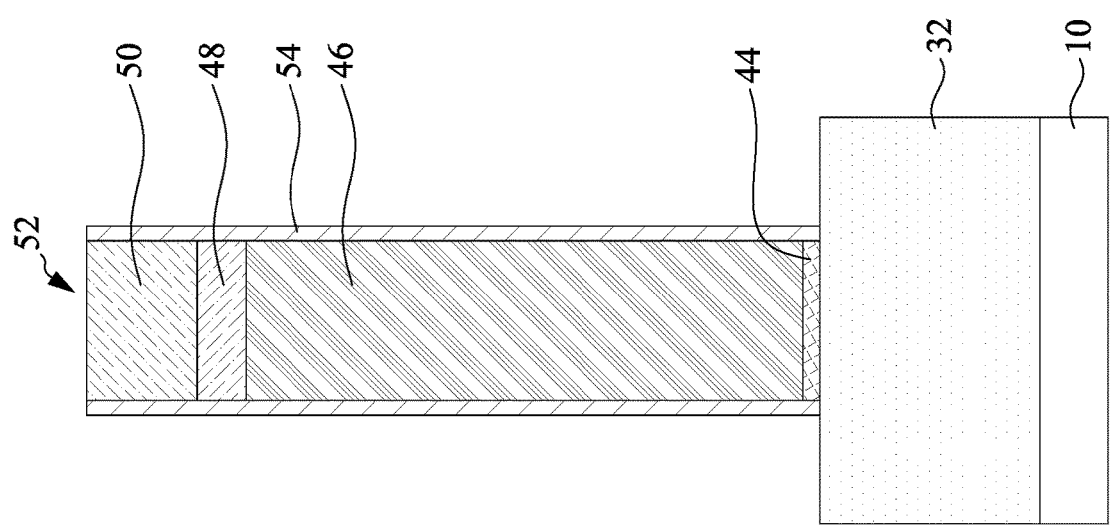
Figure 14E:
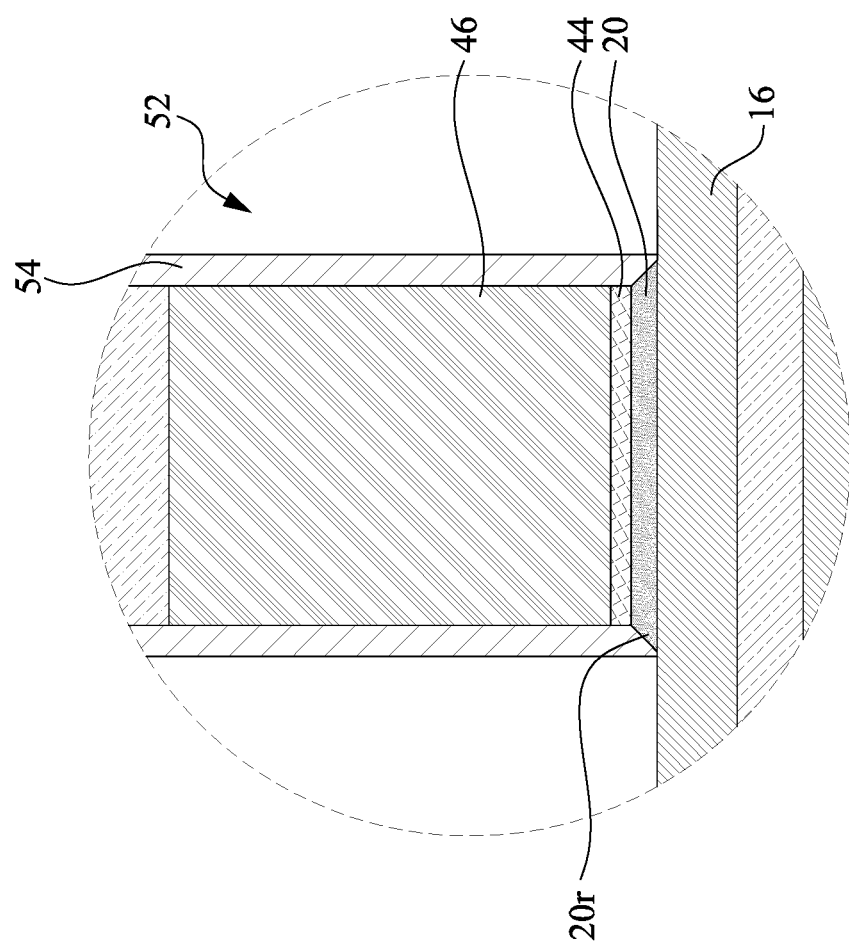

In operation 220, a pair of sidewall spacers 54 are formed on opposite side surfaces of the sacrificial gate structure 52. In some embodiments, the sidewall spacers 54 are formed by a blanket deposition of an insulating material, as shown in FIGS. 13A-13E, followed by anisotropic etch to remove insulating material from horizontal surfaces, as shown in FIGS. 14A-14E. FIGS. 13A and 14A are schematic perspective views of the semiconductor device of FIGS. 2-10. FIGS. 13B and 14B are cross sectional views of the semiconductor device along the line B-B in FIG. 11A. FIGS. 13C and 14C is cross sectional views of the semiconductor device along the line C-C in FIG. 11A. FIGS. 13D and 14D are cross sectional view of the semiconductor device along the line D-D in FIG. 11A. FIGS. 13E and 14E are partial enlarged views of a region in FIGS. 13D and 14D respectively.

In some embodiments, the insulating material of the sidewall spacers 54 is a silicon nitride-based material, such as SiN, SiON, SiOCN or SiCN and combinations thereof. In some embodiments, the sidewall spacers 54 are formed over the remaining portion 20r of the hard mask layer 20.

Figure 15A:
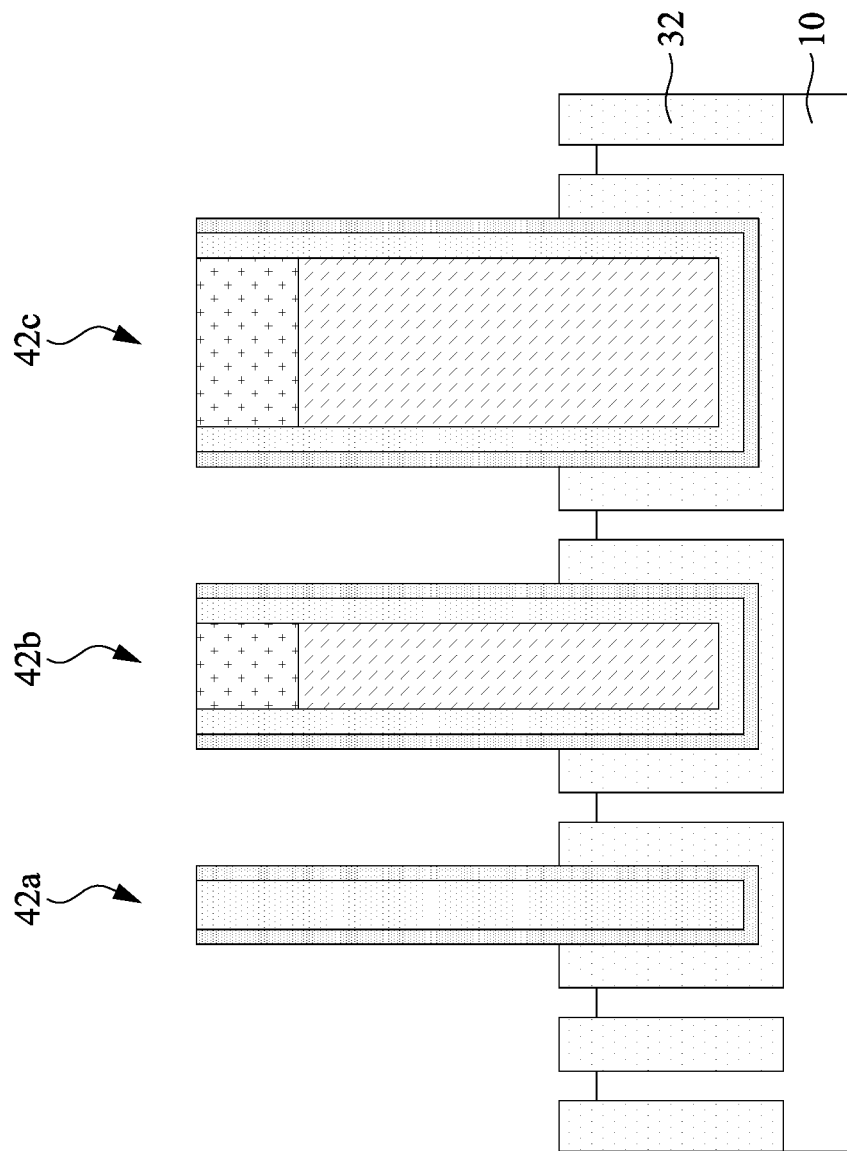
Figure 15B:
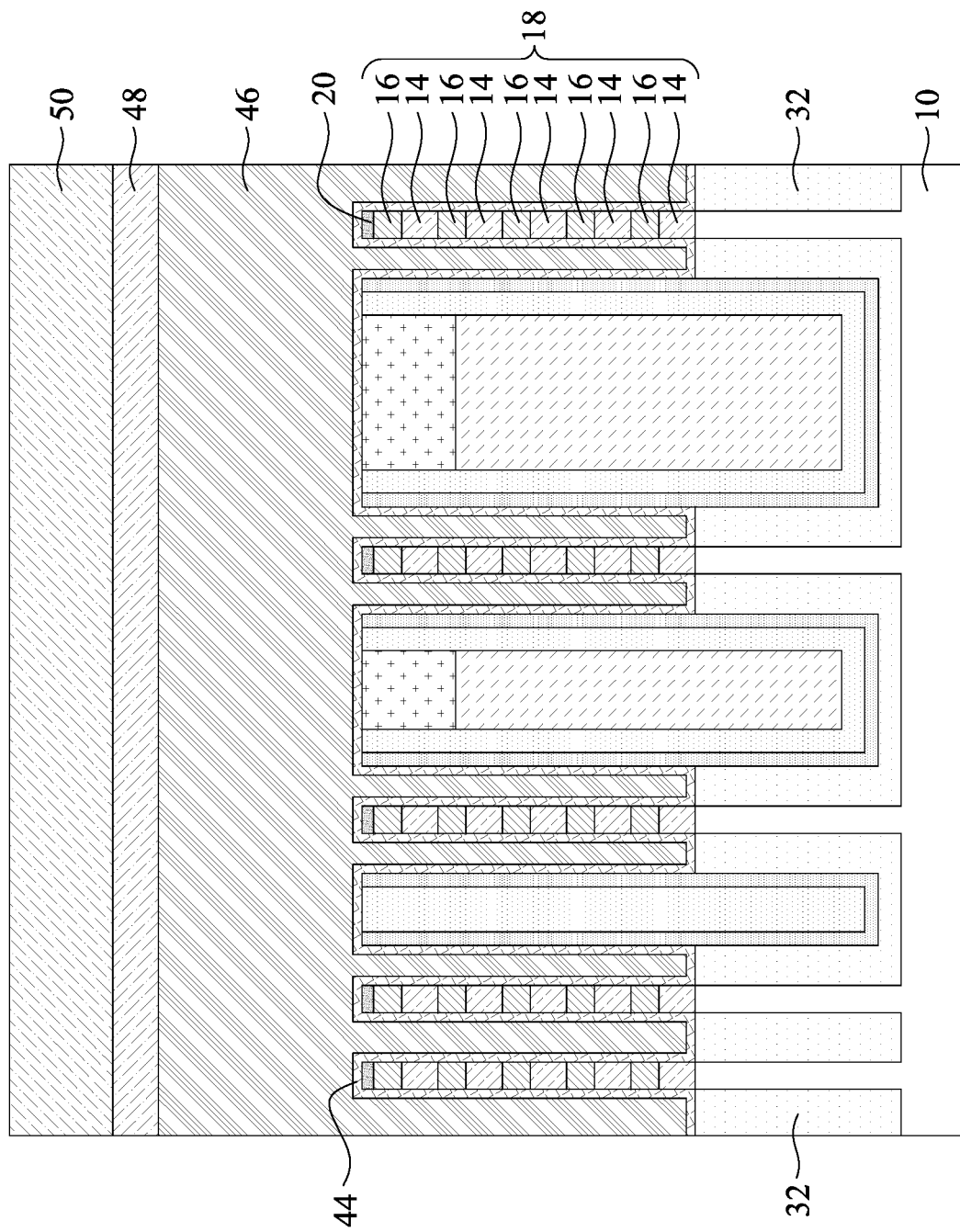
Figure 15D:
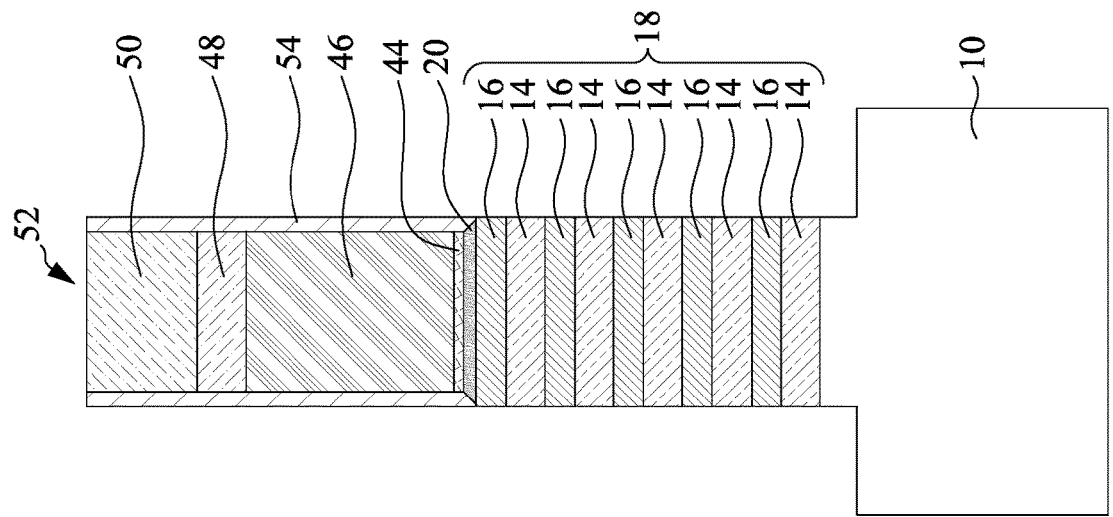
Figure 15C:
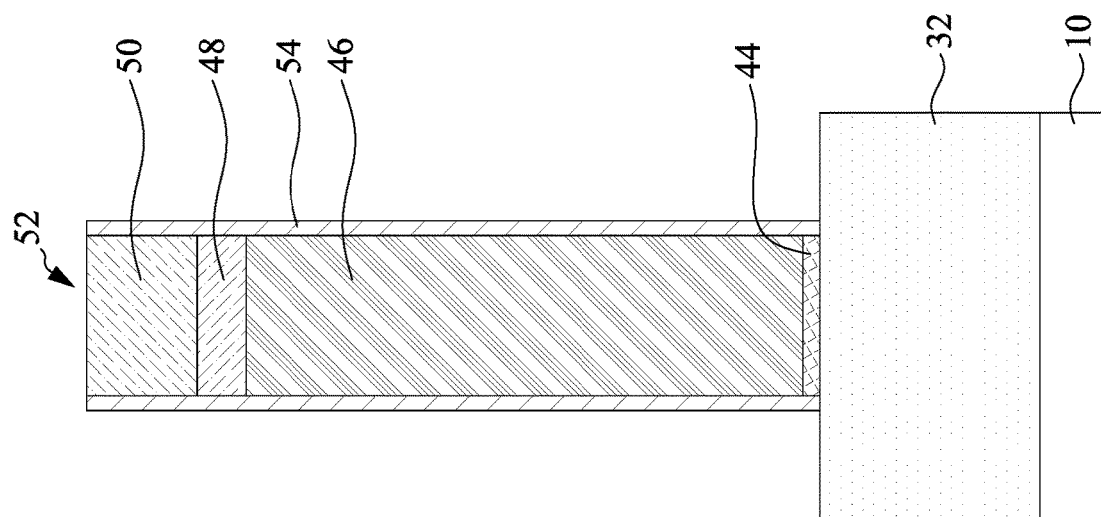

In operation 222, as shown in FIGS. 15A-15D, the semiconductor fins 28 on opposite sides of the sacrificial gate structure 52 are recess etched, forming source/drain spaces on either side of the sacrificial gate structure 52. FIG. 15A is a cross sectional view of the semiconductor device of along the line A-A in FIG. 11A. FIG. 15B is a cross sectional view of the semiconductor device along the line B-B in FIG. 11A. FIG. 15C is a cross sectional view of the semiconductor device along the line C-C in FIG. 11A. FIG. 15D is a cross sectional view of the semiconductor device along the line D-D in FIG. 11A.

The first semiconductor layers 14 and the second semiconductor layers 16 in the semiconductor fins 28 are etched down on both sides of the sacrificial gate structure 52 using one or more lithography and etching operations. In some embodiments, all layers in the semiconductor stack 18 of the semiconductor fins 28 are etched to expose the well portion 12 of the semiconductor fins 28. In some embodiments, suitable dry etching and/or wet etching may be used to remove the first semiconductor layers 14 and the second semiconductor layer 16, together or separately.

Figure 16A:
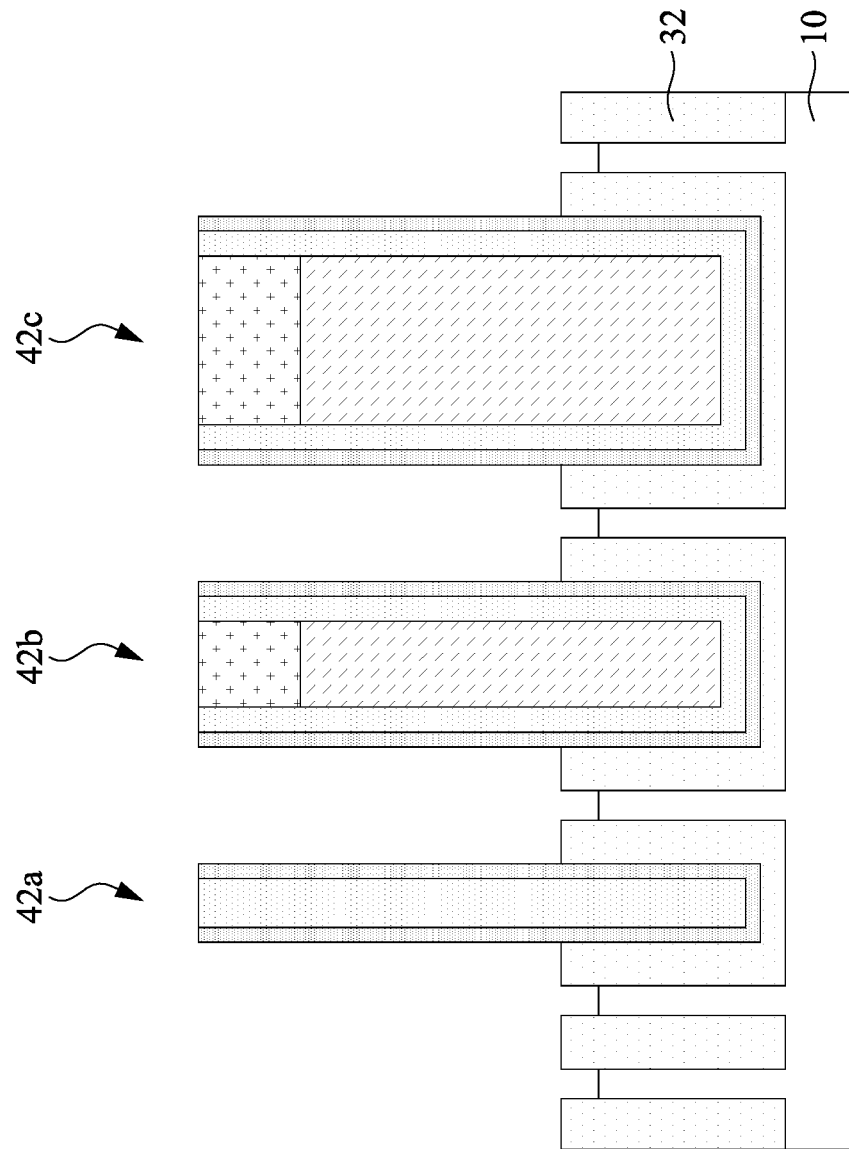
Figure 16B:
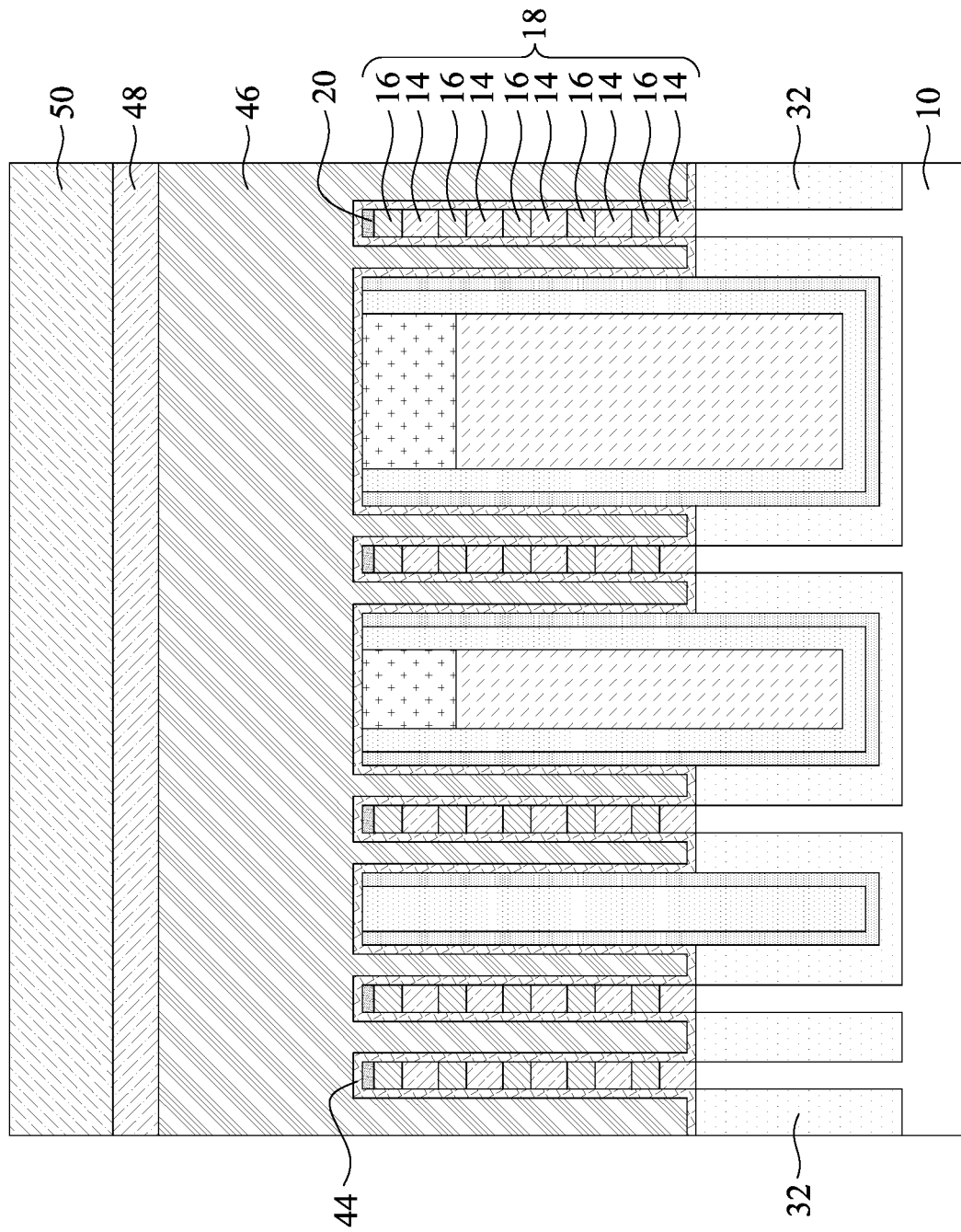
Figure 16D:
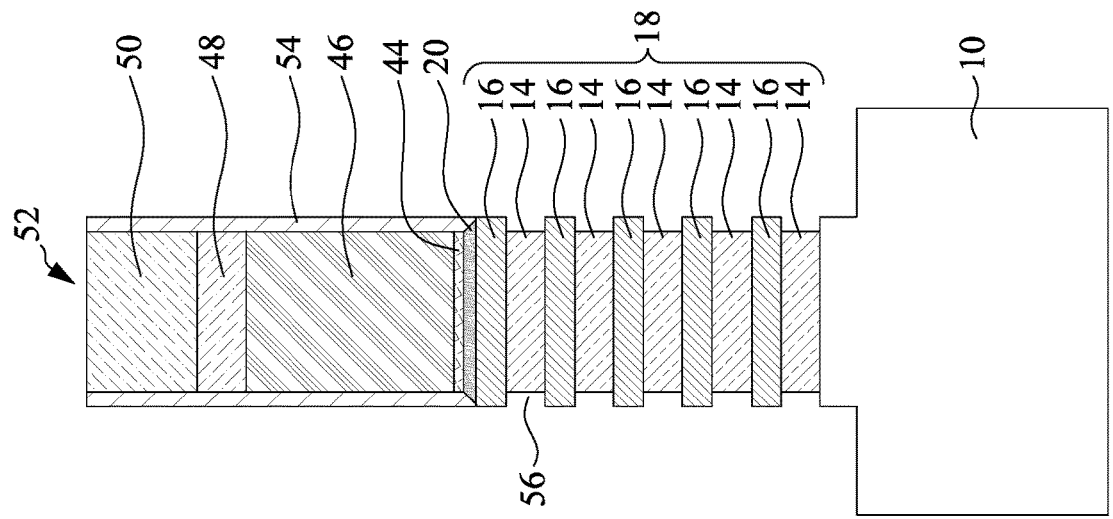
Figure 16C:
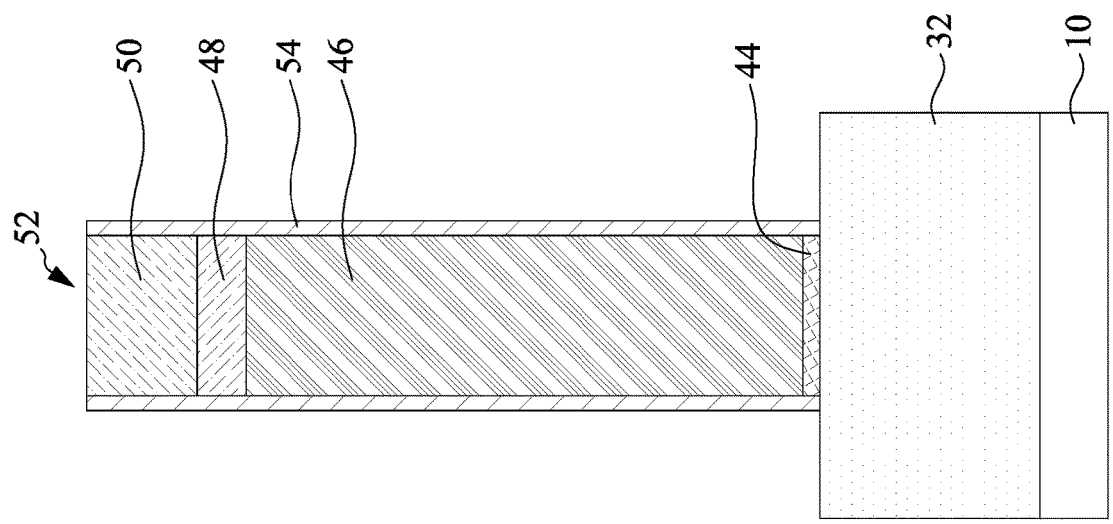
Figure 17A:
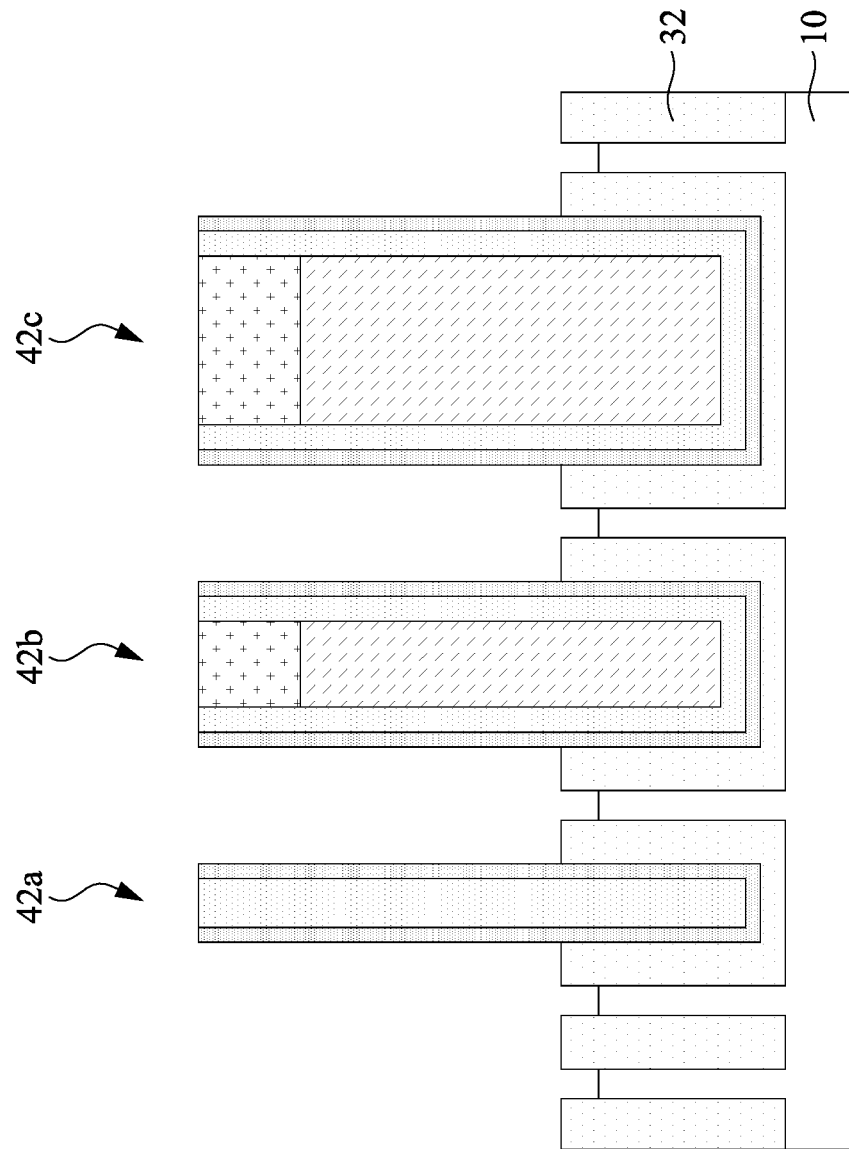
Figure 17B:
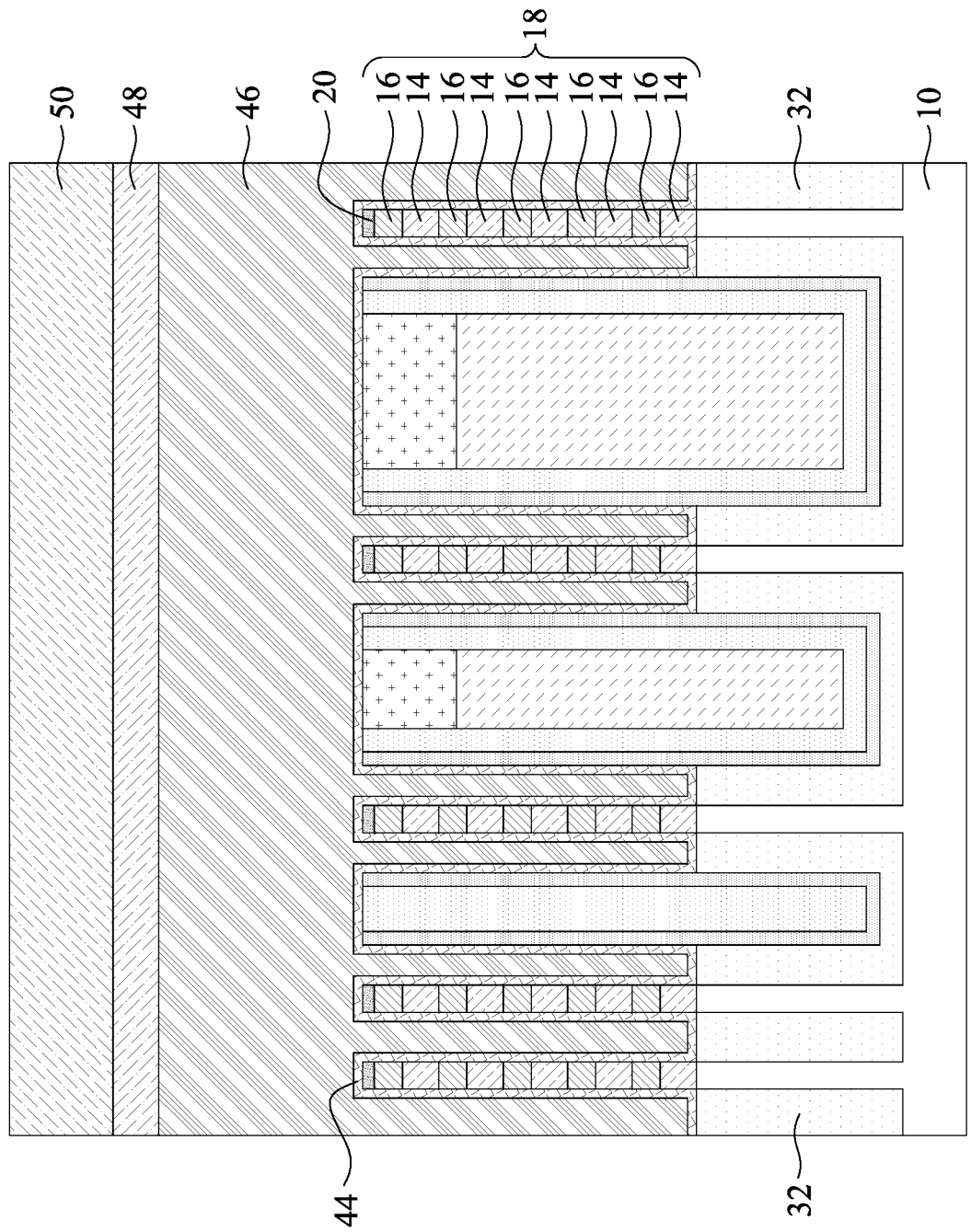

In operation 224, as shown in FIGS. 16A-16D and 17A-17D, inner spacers 58 are formed on exposed ends of the first semiconductor layers 14 under the sacrificial gate structure 52. FIGS. 16A and 17A are cross sectional views of the semiconductor device of along the line A-A in FIG. 11A. FIGS. 16B and 17B are cross sectional views of the semiconductor device along the line B-B in FIG. 11A. FIGS. 16C and 17C is cross sectional views of the semiconductor device along the line C-C in FIG. 11A. FIGS. 16D and 17D are cross sectional view of the semiconductor device along the line D-D in FIG. 11A.

Exposed ends of the first semiconductor layers 14 are first etched horizontally along the X direction to form cavities, as shown in FIG. 16D. In some embodiments, the first semiconductor layers 14 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, the amount of etching of the first semiconductor layer 14 is in a range between about 2 nm and about 10 nm along the X direction.

After forming cavities in the first semiconductor layers 14, the inner spacers 58 can be formed in the cavities by conformally deposit and then partially remove an insulating layer. The insulating layer can be formed by ALD or any other suitable method. In some embodiments, the insulating layer may include one of silicon nitride (SiN) and silicon oxide ($SiO_2$) and have a thickness in a range from about 0.5 nm to about 3.0 nm. The subsequent etch process removes most of the insulating layer except inside the cavities, resulting in the inner spacers 58, as shown in FIGS. 17A-17D.

For FinFET devices, which include a single channel in each fin structure, operation 224 is omitted. Operation 226 is performed after operation 222.

Figure 18A:
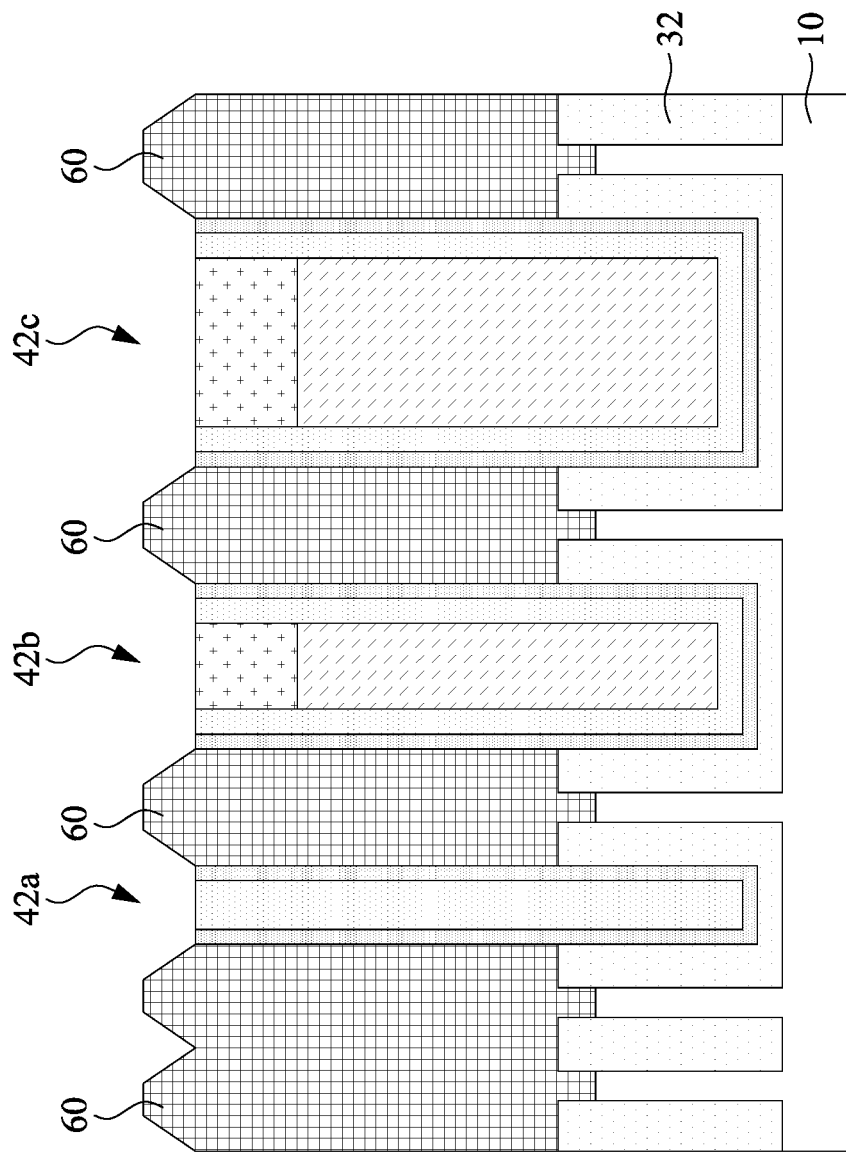
Figure 18B:
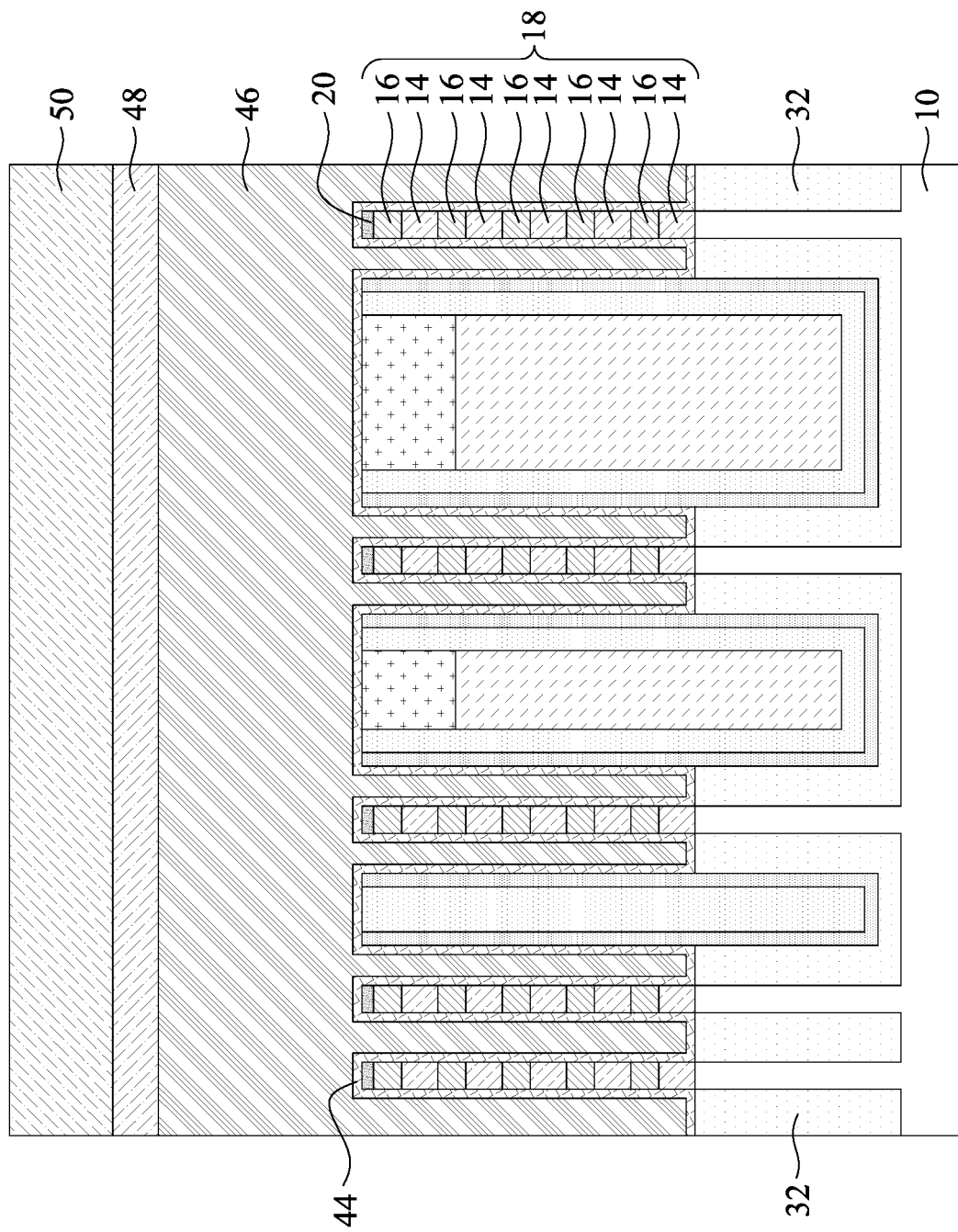
Figure 18D:
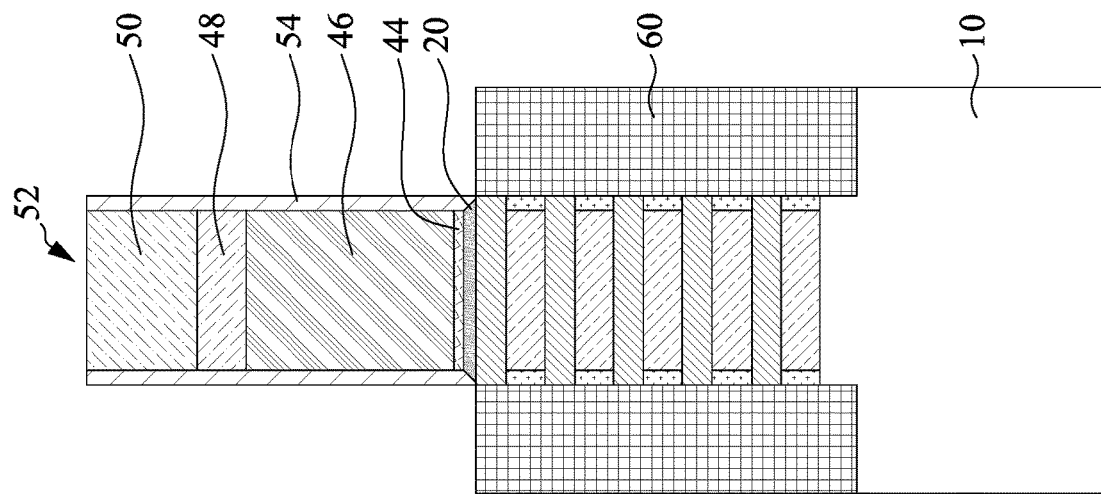
Figure 18C:
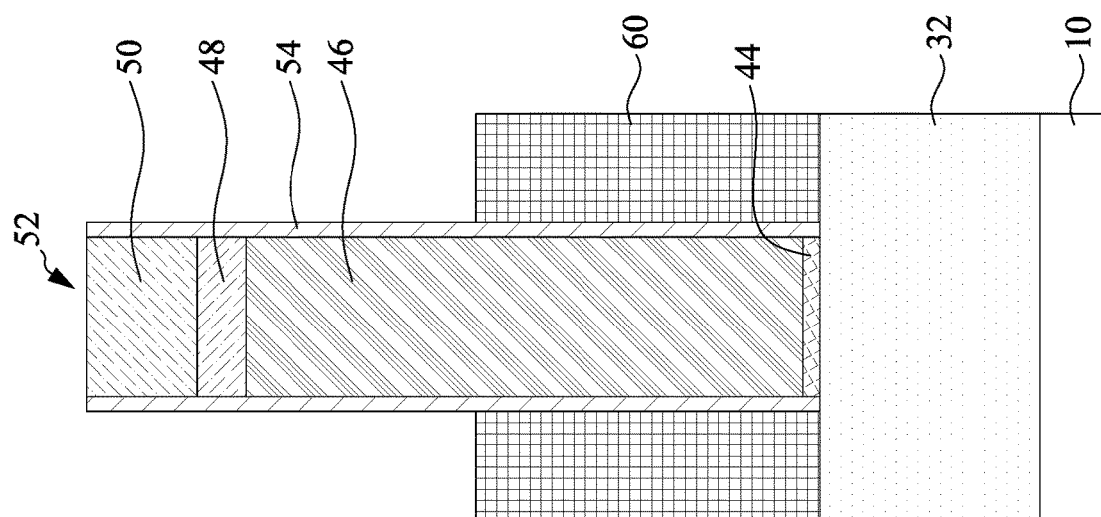

In operation 226, as shown in FIGS. 18A-18D, epitaxial source/drain features 60 are formed from the semiconductor fins 28. FIG. 18A is a cross sectional view of the semiconductor device of along the line A-A in FIG. 11A. FIG. 18B is a cross sectional view of the semiconductor device along the line B-B in FIG. 11A. FIG. 18C is a cross sectional view of the semiconductor device along the line C-C in FIG. 11A. FIG. 18D is a cross sectional view of the semiconductor device along the line D-D in FIG. 11A.

The epitaxial source/drain features 60 are formed from the exposed surfaces of the semiconductor fins 28. The epitaxial source/drain features 60 are formed by an epitaxial growth method using CVD, ALD or molecular beam epitaxy (MBE). In some embodiments, side portions of the epitaxial source/drain features 60 are merged when the source/drain features 60 are grown from semiconductor fins not separated by hybrid fins, such as the hybrid fins 42. The epitaxial source/drain features 60 may include one or more layers of Si, SiP, SiC and SiCP for NFET or Si, SiGe, Ge for a PFET. For the PFET, p-type dopants, such as boron (B), may also be included in the epitaxial source/drain features 60.

Figure 19A:
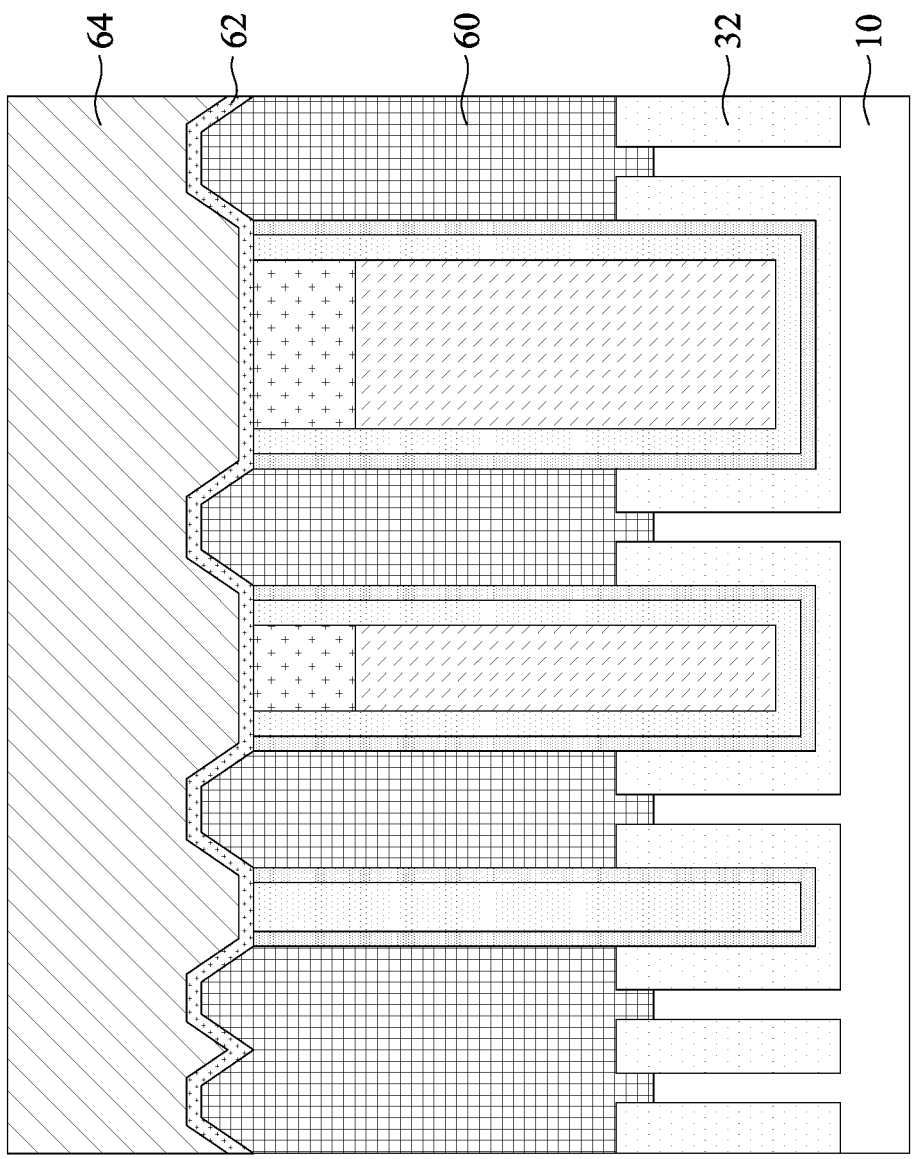
Figure 19B:
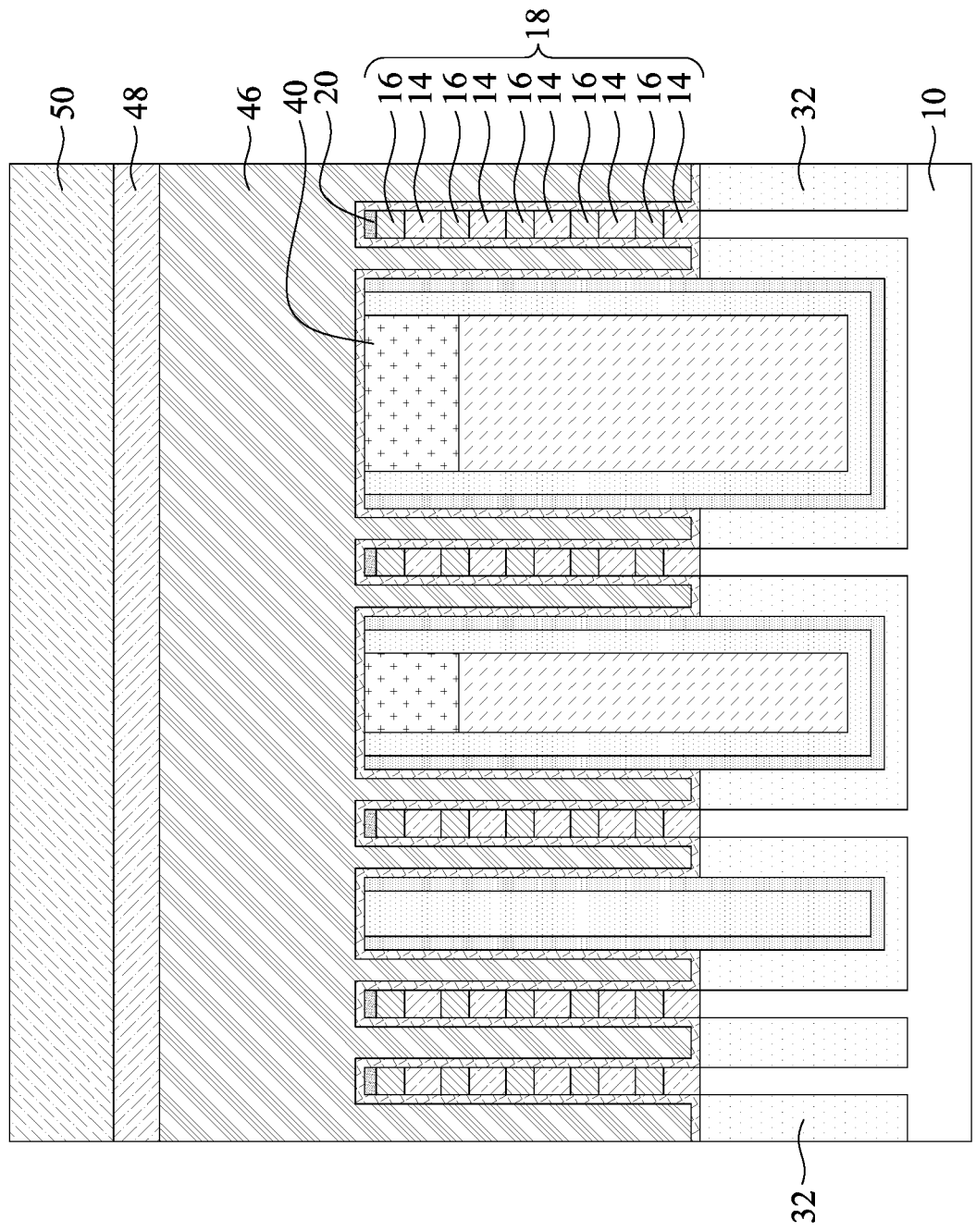
Figure 19D:
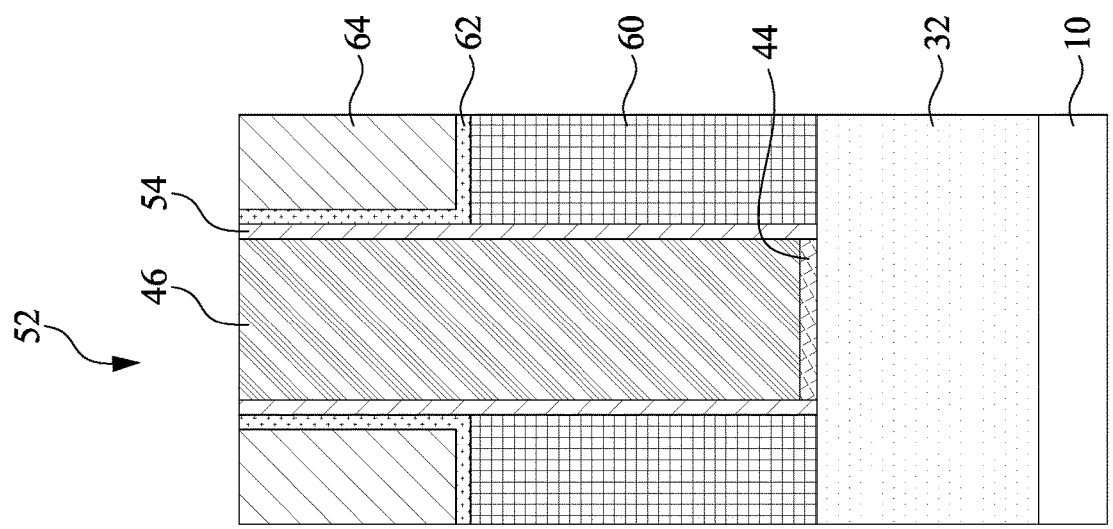
Figure 19C:
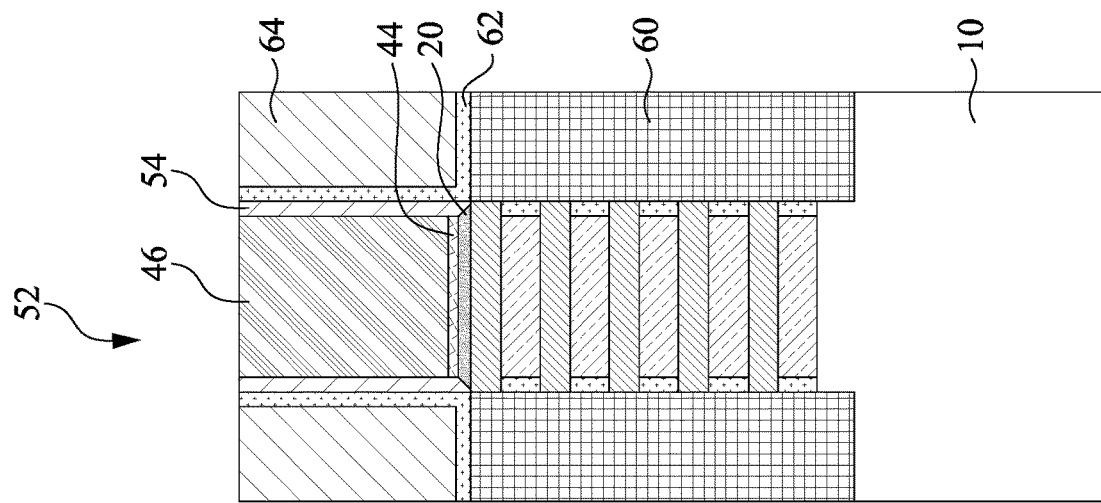

In operation 228, as shown in FIGS. 19A-19D, a contact etch stop layer (CESL) 62 and the interlayer dielectric (ILD) layer 64 are formed over the substrate 10. FIG. 19A is a cross sectional view of the semiconductor device of along the line A-A in FIG. 11A. FIG. 19B is a cross sectional view of the semiconductor device along the line B-B in FIG. 11A. FIG. 19C is a cross sectional view of the semiconductor device along the line C-C in FIG. 11A. FIG. 19D is a cross sectional view of the semiconductor device along the line D-D in FIG. 11A.

The CESL 62 is formed on the epitaxial source/drain features 60. In some embodiments, the CESL 62 has a thickness in a range between about 1 nm and about 15 nm. The CESL 62 may include $Si_3N_4$, SiON, SiCN or any other suitable material, and may be formed by CVD, PVD, or ALD.

The interlayer dielectric (ILD) layer 64 is formed over the CESL 62. The materials for the ILD layer 64 include compounds comprising Si, O, C, and/or H, such as silicon oxide, SiCOH and SiOC. Organic materials, such as polymers, may be used for the ILD layer 64. After the ILD layer 64 is formed, a planarization operation, such as CMP, is performed to expose the sacrificial gate electrode layer 46 for subsequent removal of the sacrificial gate structures 52. The ILD layer 64 protects the epitaxial source/drain features 60 during the removal of the sacrificial gate structures 52.

Figure 20A:
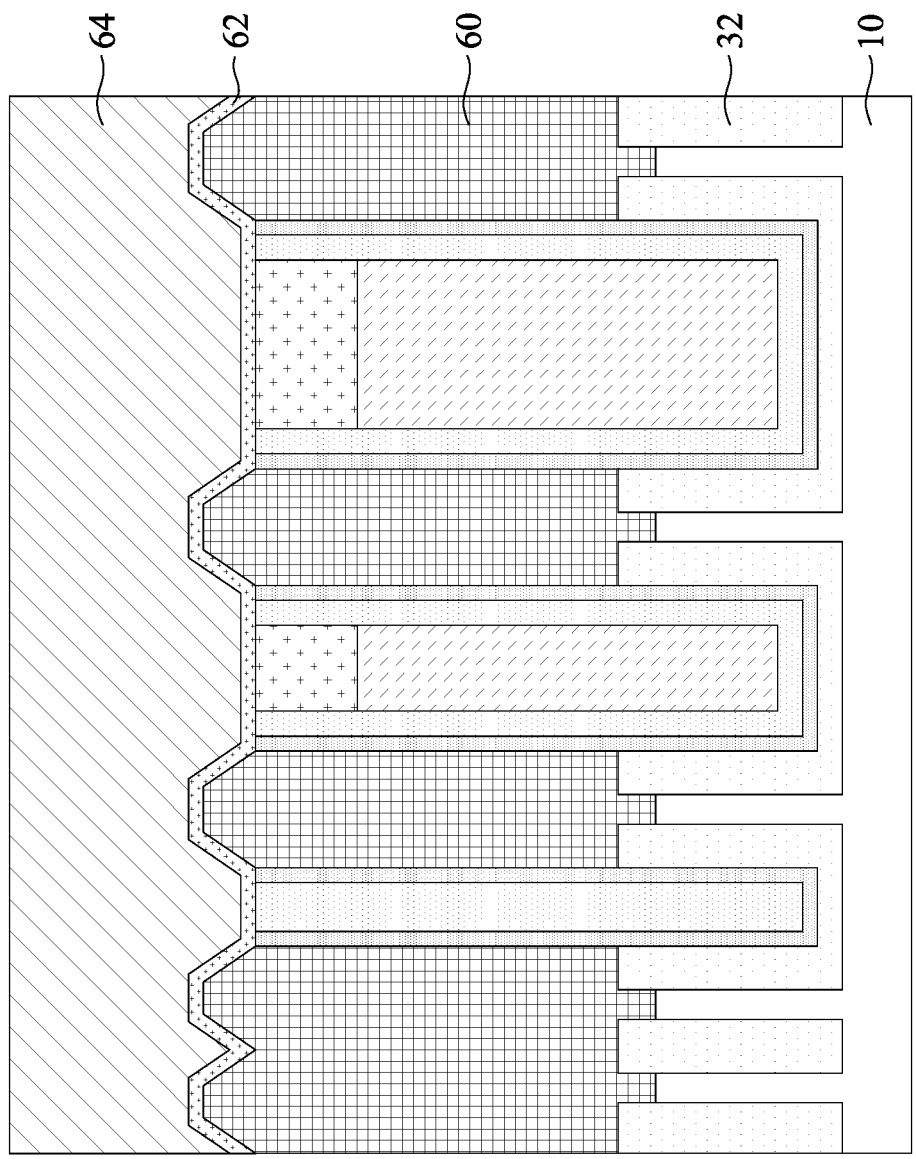
Figure 20B:
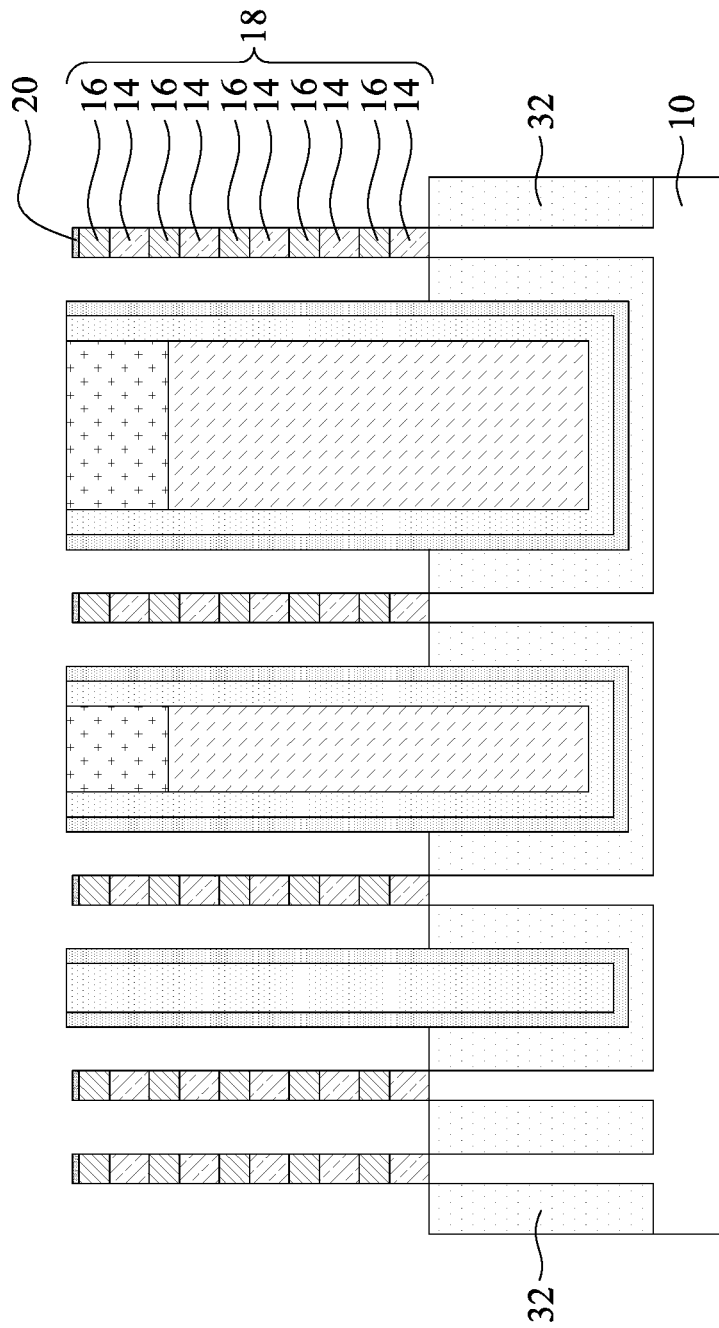
Figure 20C:
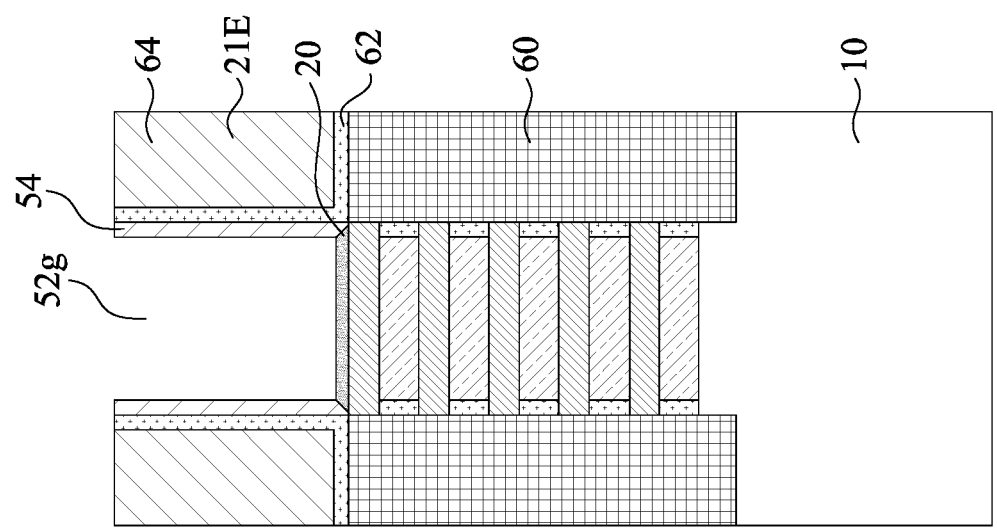
Figure 20D:
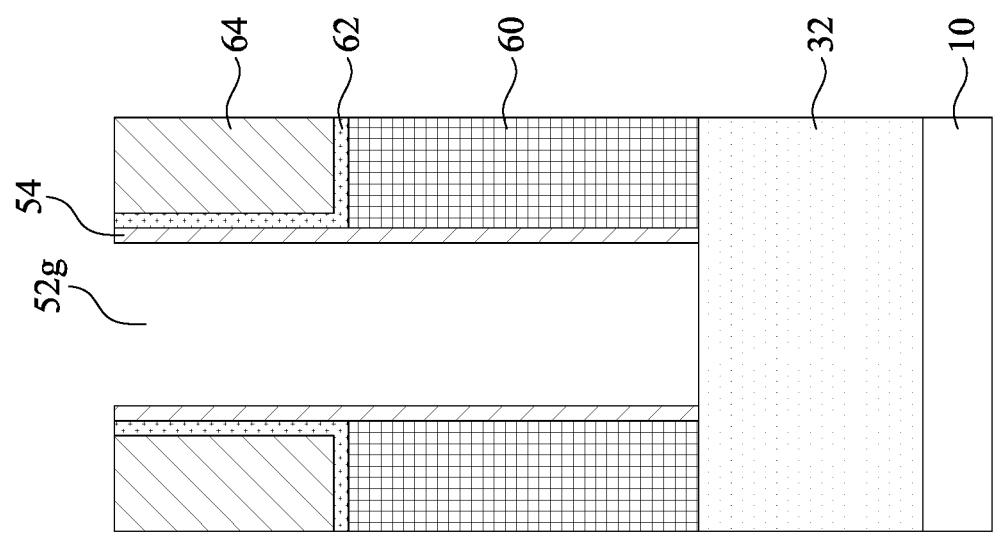

In operation 230, as shown in FIGS. 20A-20D, the sacrificial gate electrode layer 46 and the sacrificial gate dielectric layer 44 are removed and a gate space 52g is formed between the pair sidewall spacers 54. FIG. 20A is a cross sectional view of the semiconductor device of along the line A-A in FIG. 11A. FIG. 20B is a cross sectional view of the semiconductor device along the line B-B in FIG. 11A. FIG. 20C is a cross sectional view of the semiconductor device along the line C-C in FIG. 11A. FIG. 20D is a cross sectional view of the semiconductor device along the line D-D in FIG. 11A.

The sacrificial gate structures 52 can be removed using plasma dry etching and/or wet etching. When the sacrificial gate electrode layer 46 is polysilicon and the ILD layer 64 is silicon oxide, a wet etchant such as a Tetramethylammonium hydroxide (TMAH) solution can be used to selectively remove the sacrificial gate electrode layer 46 without removing the dielectric materials of the ILD layer 64, the CESL 62, and the sidewall spacers 54. The sacrificial gate dielectric layer 44 is thereafter removed using plasma dry etching and/or wet etching.

Figure 21A:
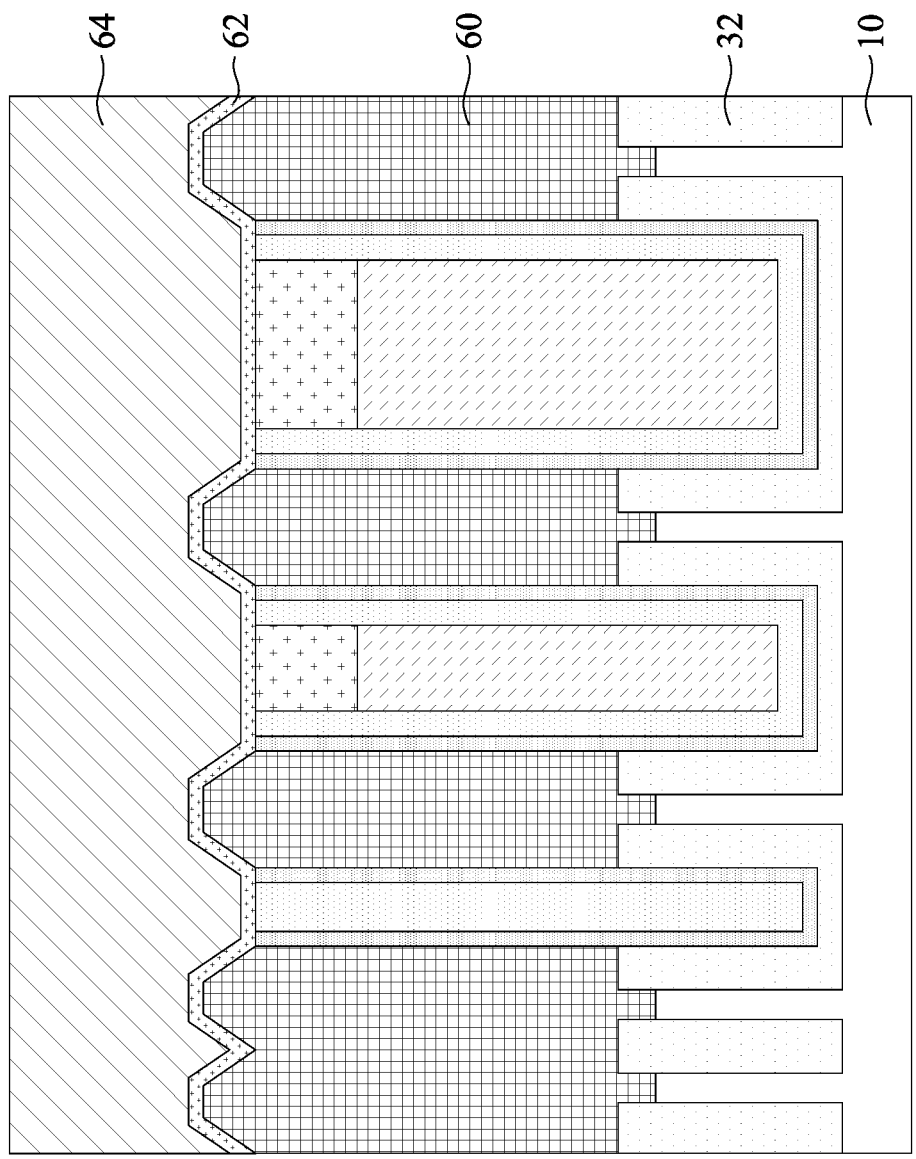
Figure 21B:
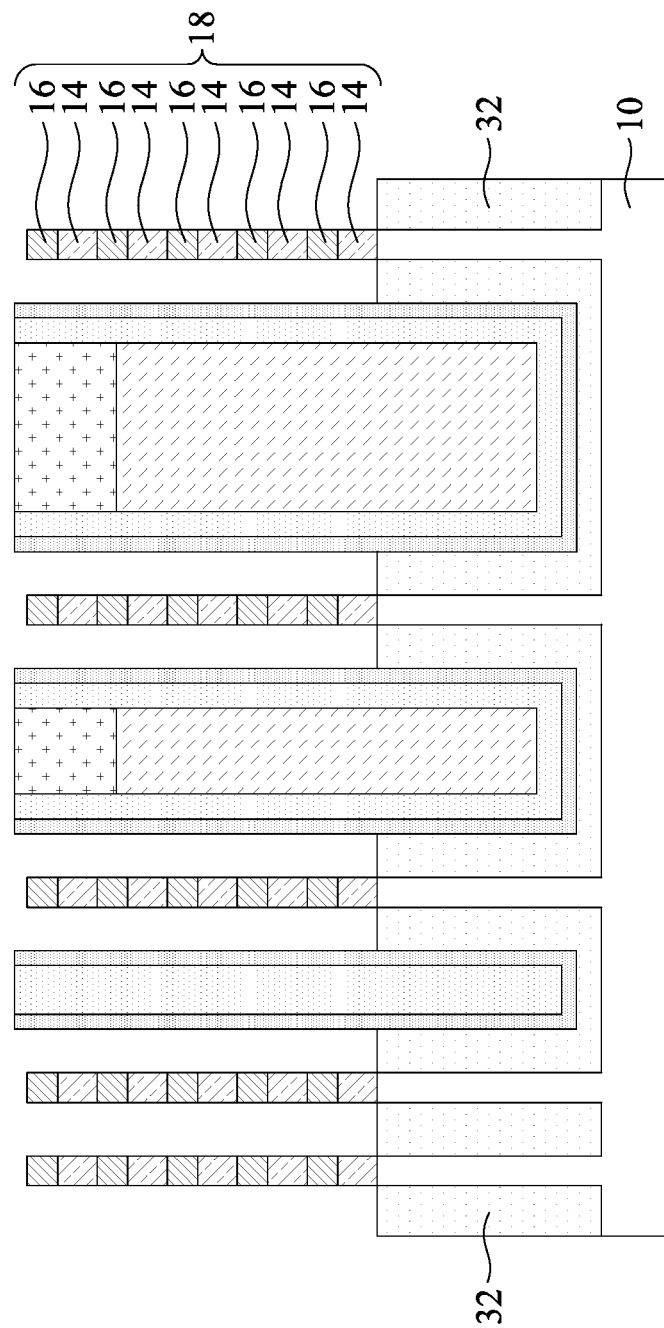
Figure 21D:
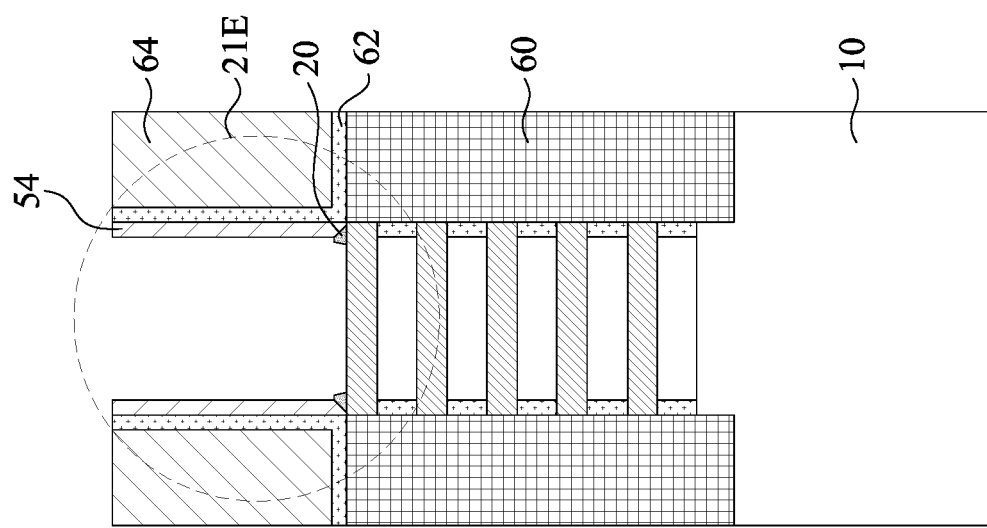
Figure 21C:
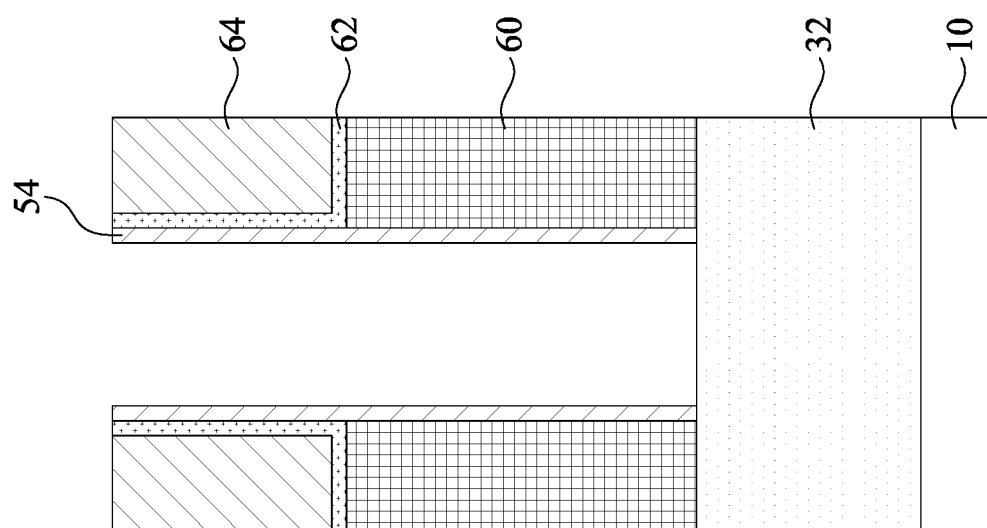
Figure 21E:
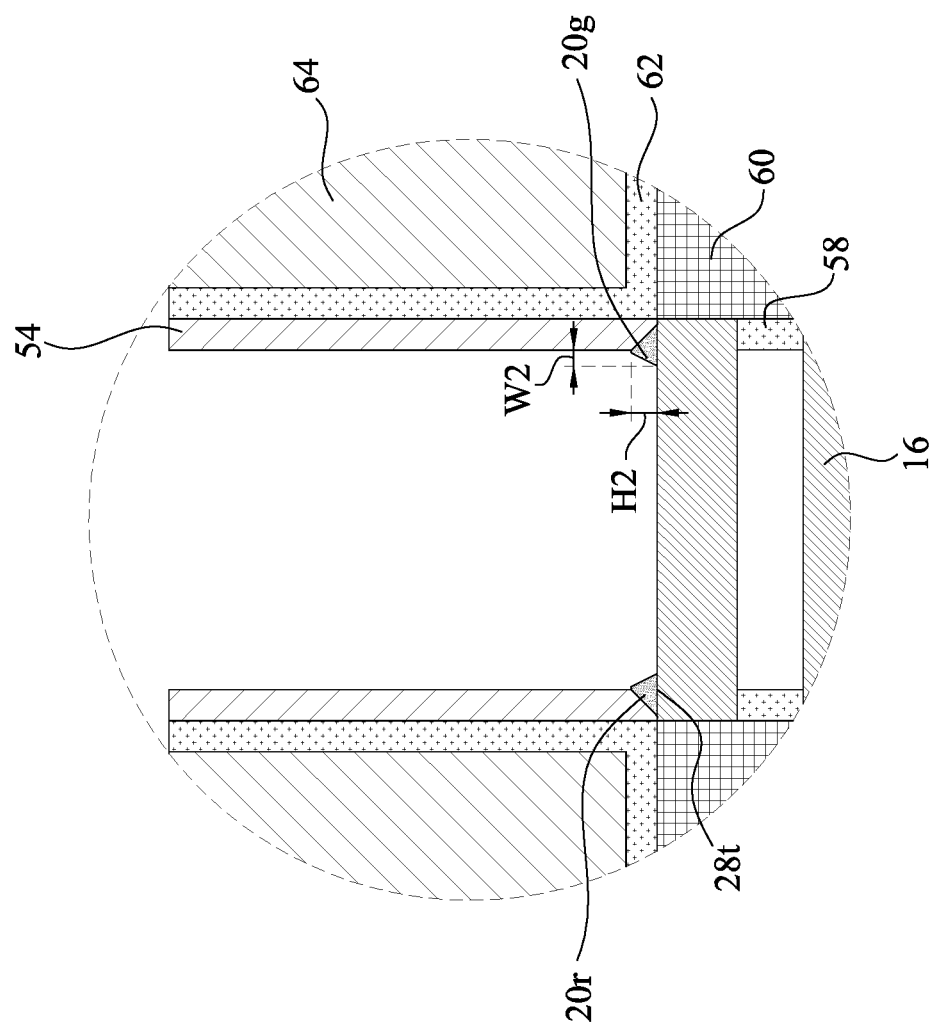

As shown in FIG. 20D, after the sacrificial gate electrode layer 46 and the sacrificial gate dielectric layer 44 are removed, the hard mask layer 20 on the top surface 28t of the semiconductor fins 28 within the gate space 52g is exposed. In operation 232, an etching process is performed to remove the hard mask layer 20, as shown in FIGS. 21A-21E. FIG. 21A is a cross sectional view of the semiconductor device of along the line A-A in FIG. 11A. FIG. 21B is a cross sectional view of the semiconductor device along the line B-B in FIG. 11A. FIG. 21C is a cross sectional view of the semiconductor device along the line C-C in FIG. 11A. FIG. 21D is a cross sectional view of the semiconductor device along the line D-D in FIG. 11A. FIG. 21E is partial enlarged view of a region in FIG. 21D.

At least a portion of the hard mask layer 20 between the sidewall spacers 54 can be removed by a suitable etch process, such as a dry etch, a wet etch, or a combination thereof. In some embodiments, a wet etching process is used to selectively etch the hard mask layer 20 over the semiconductor stack 18. In some embodiments, a wet etching process using diluted HF as etchant is used when the hard mask layer 20 includes silicon oxy-carbo-nitride (SiOCN). In other embodiments, a wet etching process using trifluoromethane ($CHF_3$), carbon tetrafluoride ($CF_4$), and oxygen ($O_2$) as etchant is used when the hard mask layer 20 includes SiCN.

In some instances, a portion 20g of the hard mask layer 20 remains in the gate space 52g at the corners or interface between the sidewall spacers 54 and the semiconductor fin 28 due to limitation of the etching process. FIG. 21E schematically illustrates the location of the portion 20g. In some embodiments, the portion 20i has a triangular shape when viewed in Y direction. The triangular shape may have a height H2 and a width W2. The height H2 and width W2 relate to the etch process being performed in operation 232 and the thickness T1 of the hard mask layer 20. In some instances, the height H2 is between 0 nm and about 4 nm or up to the thickness T1 of the hard mask layer 20. The width W2 is between 0 nm and about 4 nm. The portions 20g and 20r of the hard mask layer 20 may be connected and remains within the semiconductor device to be formed.

Figure 22A:
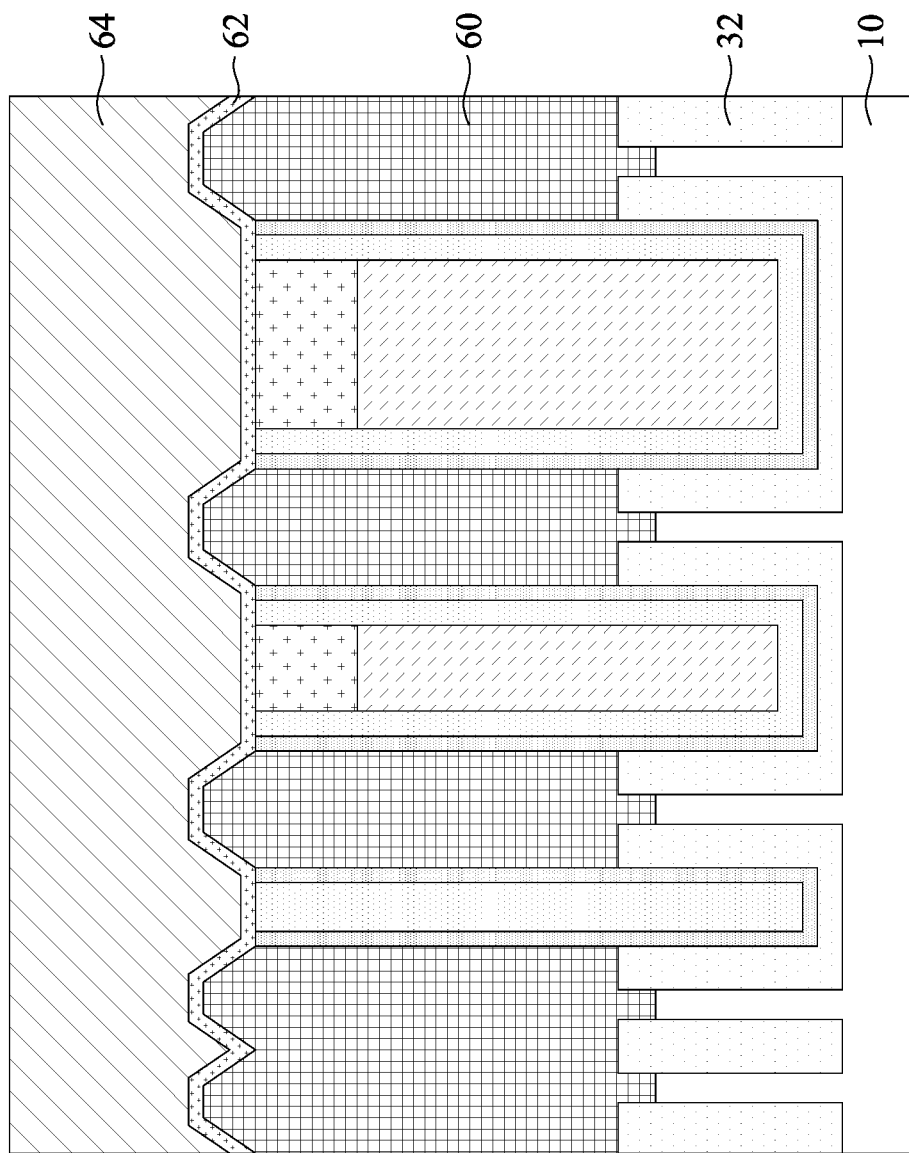
Figure 22B:
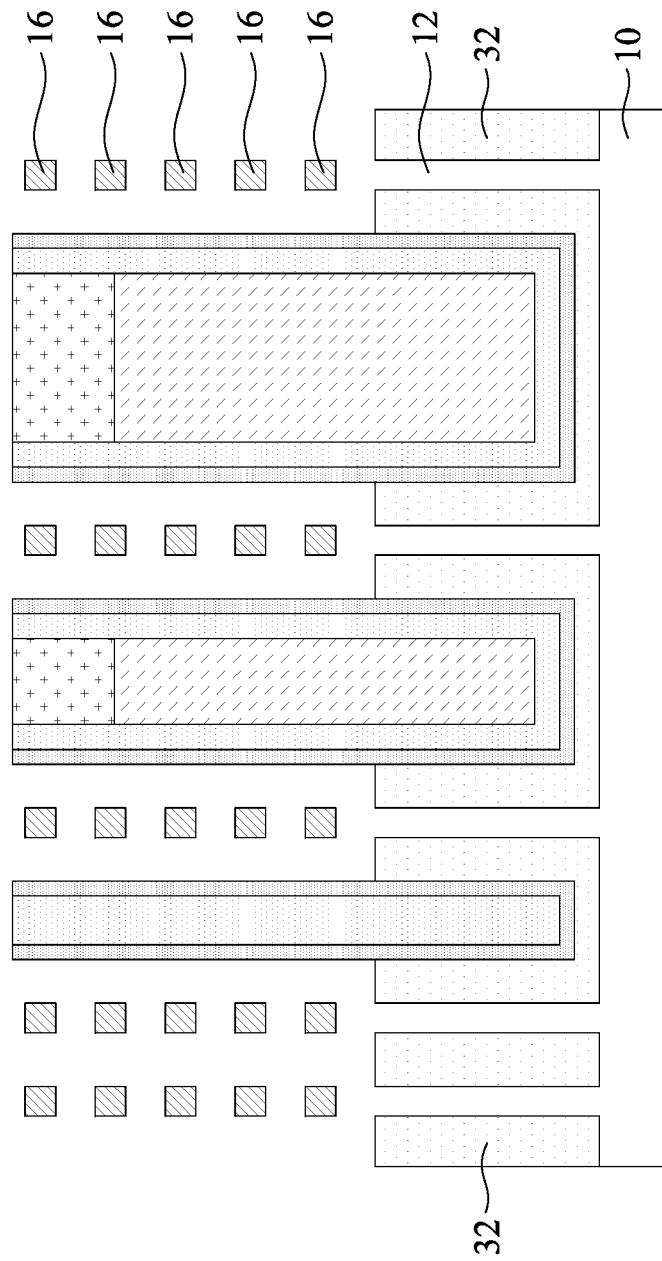
Figure 22D:
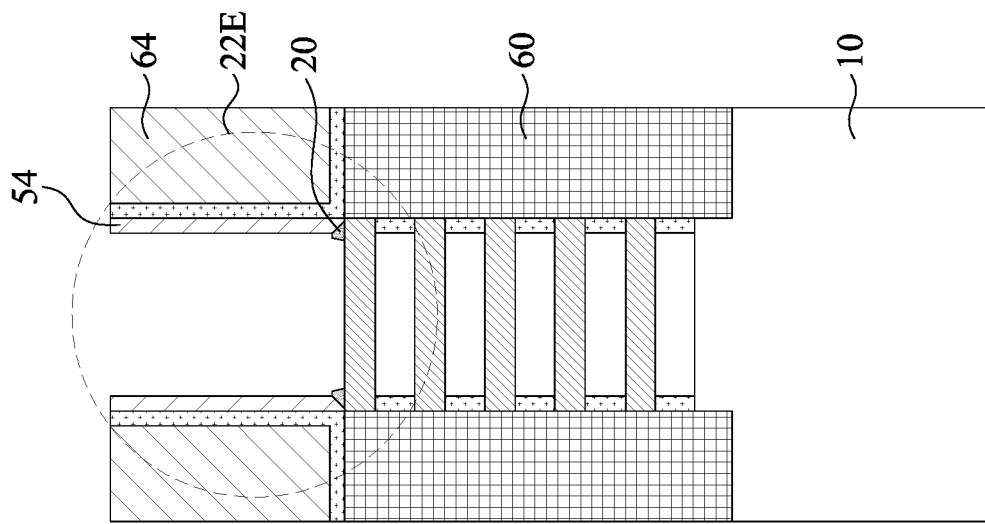
Figure 22C:
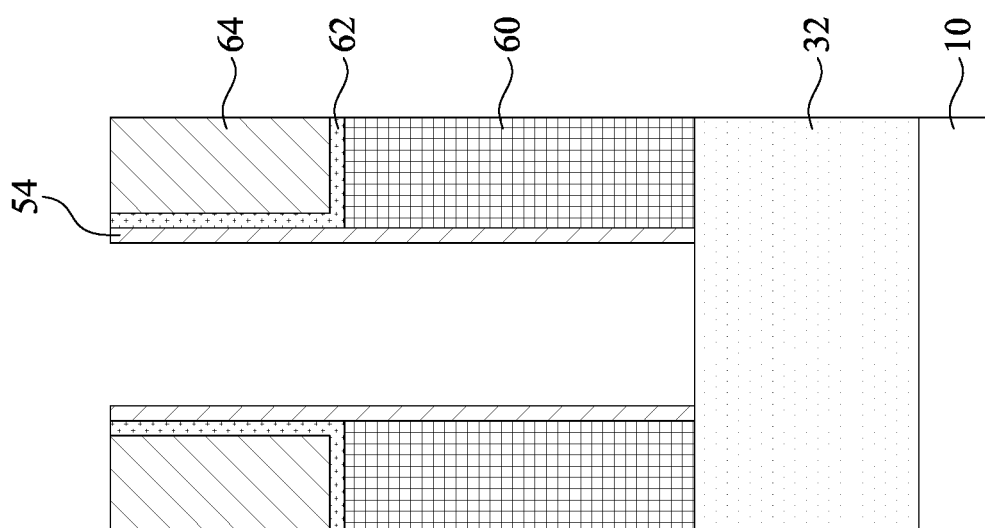
Figure 22E:
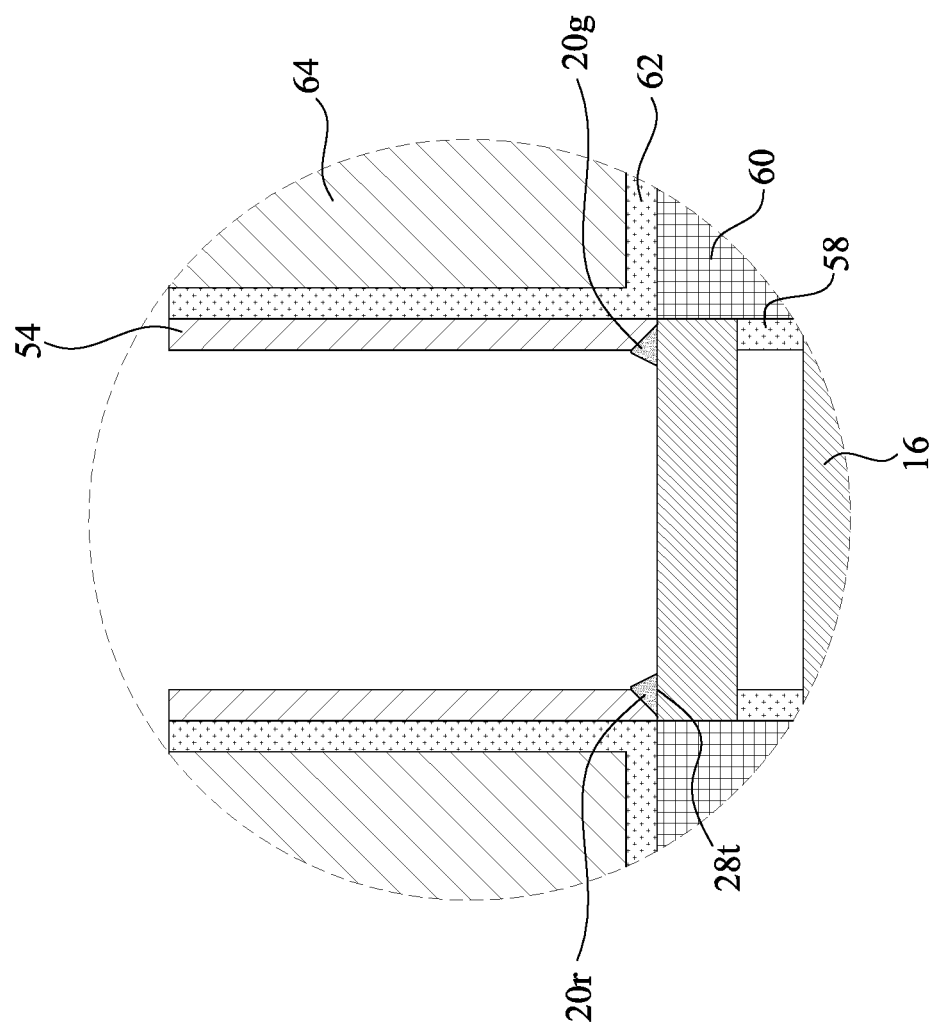

In operation 234, as shown in FIGS. 22A-22E, the first semiconductor layers 14 can be selectively removed resulting in nanosheets of the second semiconductor layers 16. FIG. 22A is a cross sectional view of the semiconductor device of along the line A-A in FIG. 11A. FIG. 22B is a cross sectional view of the semiconductor device along the line B-B in FIG. 11A. FIG. 22C is a cross sectional view of the semiconductor device along the line C-C in FIG. 11A. FIG. 22D is a cross sectional view of the semiconductor device along the line D-D in FIG. 11A. FIG. 22E is partial enlarged view of a region in FIG. 22D.

The semiconductor layers 16 remaining between the sidewall spacers 54 become channel regions of a multi-channel FET device to be formed. The first semiconductor layers 14 can be removed using an etchant that can selectively etch the first semiconductor layers 14 against the second semiconductor layers 16. When the first semiconductor layers 14 are Ge or SiGe and the second semiconductor layers 16 are Si, the first semiconductor layers 14 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

In some embodiments, operation 234 is performed before operation 232. After removal of the sacrificial gate electrode layer 46 and the sacrificial gate dielectric layer 44 are removed, the first semiconductor layers 14 are exposed to the gate space 53g and can be removed by performing operation 234 while the hard mask layer 20 remains on the top surface 28t of the semiconductor fins 28. The hard mask layer 20 can be removed after the first semiconductor layers 14 are removed.

When the semiconductor device being formed is a conventional FinFET device instead of a multi-channel FinFET device, operation 234 is omitted.

Figure 23A:
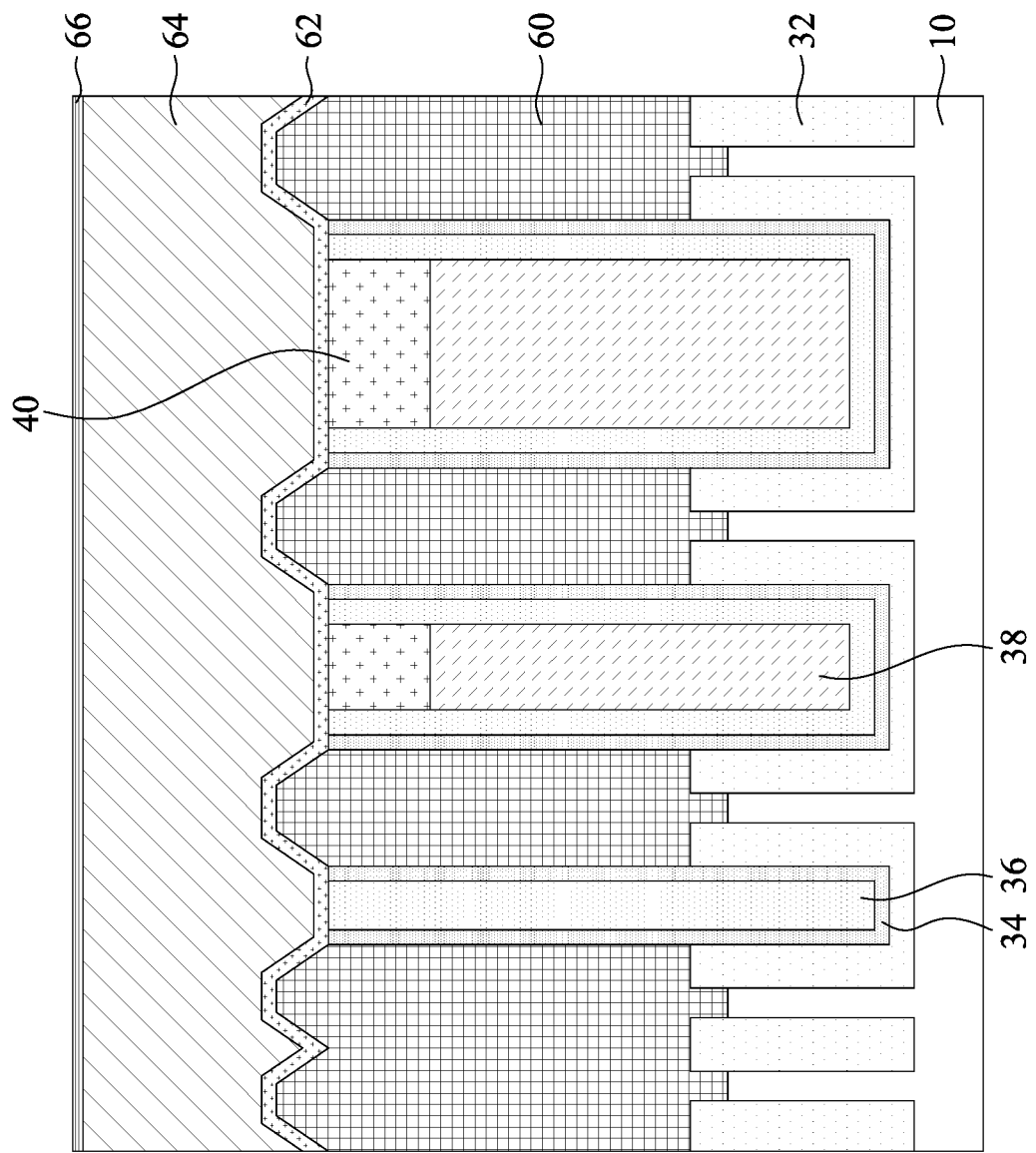
Figure 23B:
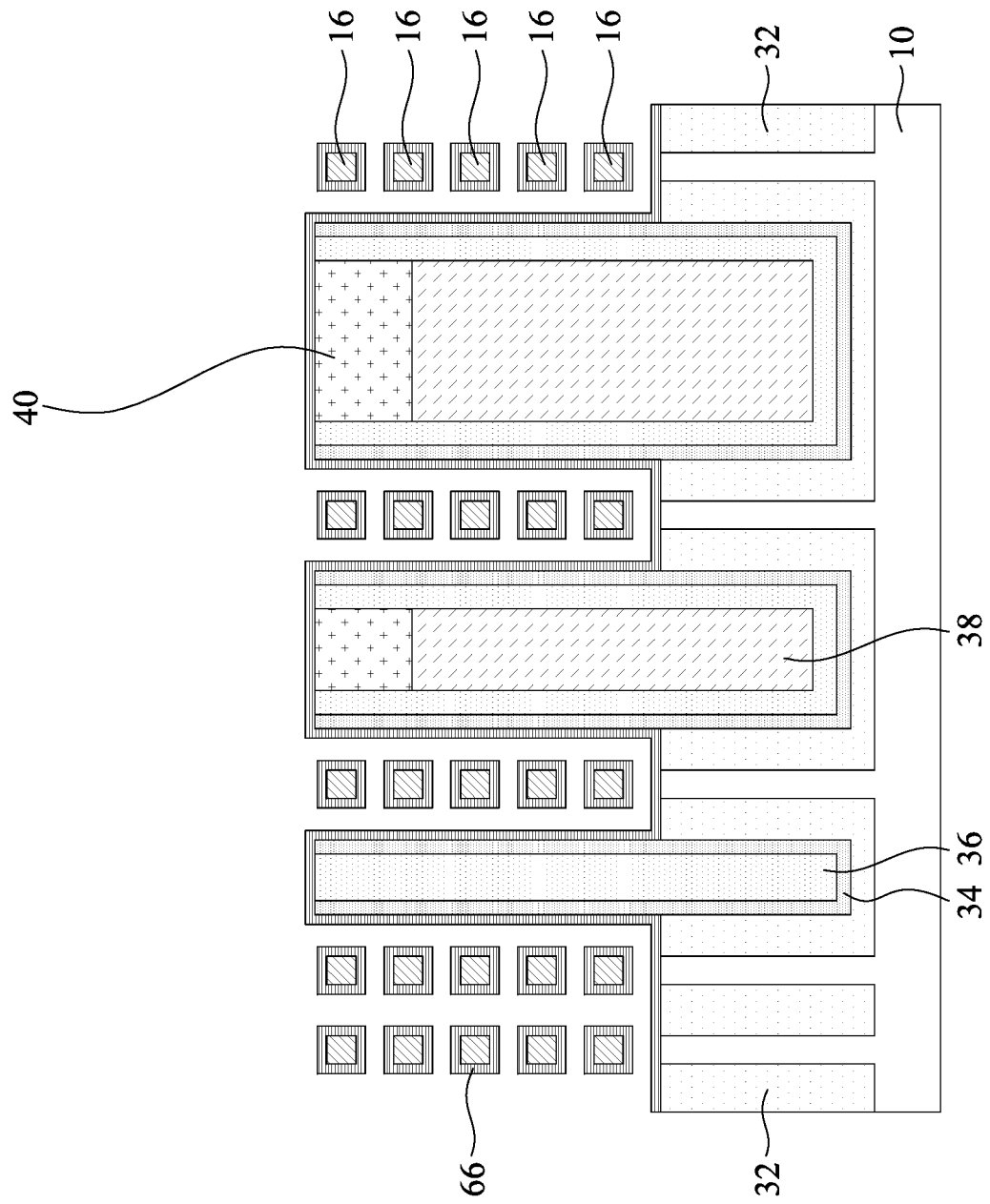
Figure 23C:
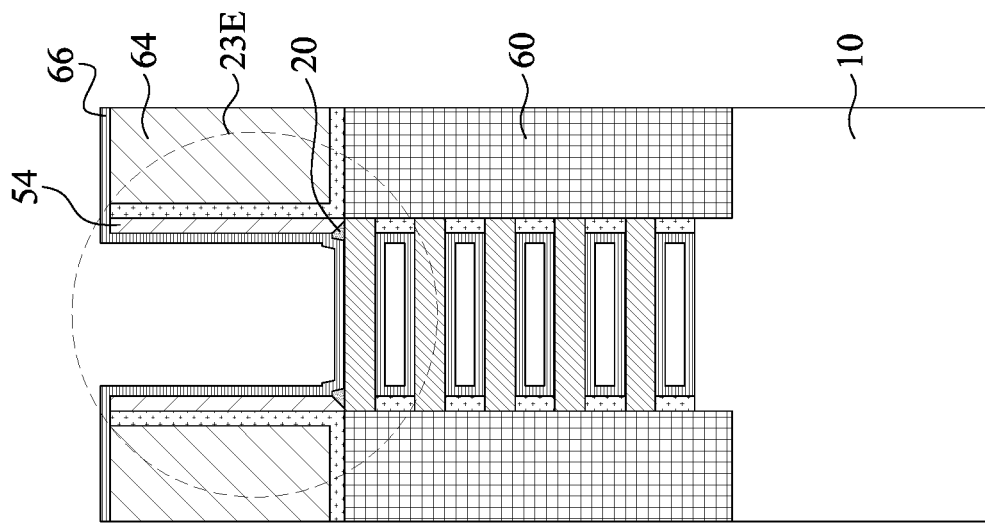
Figure 23D:
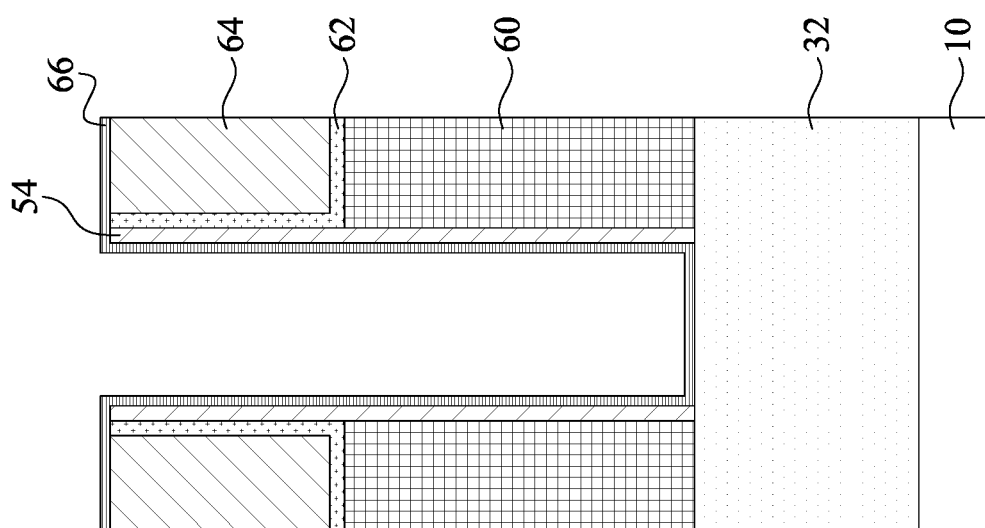
Figure 23E:
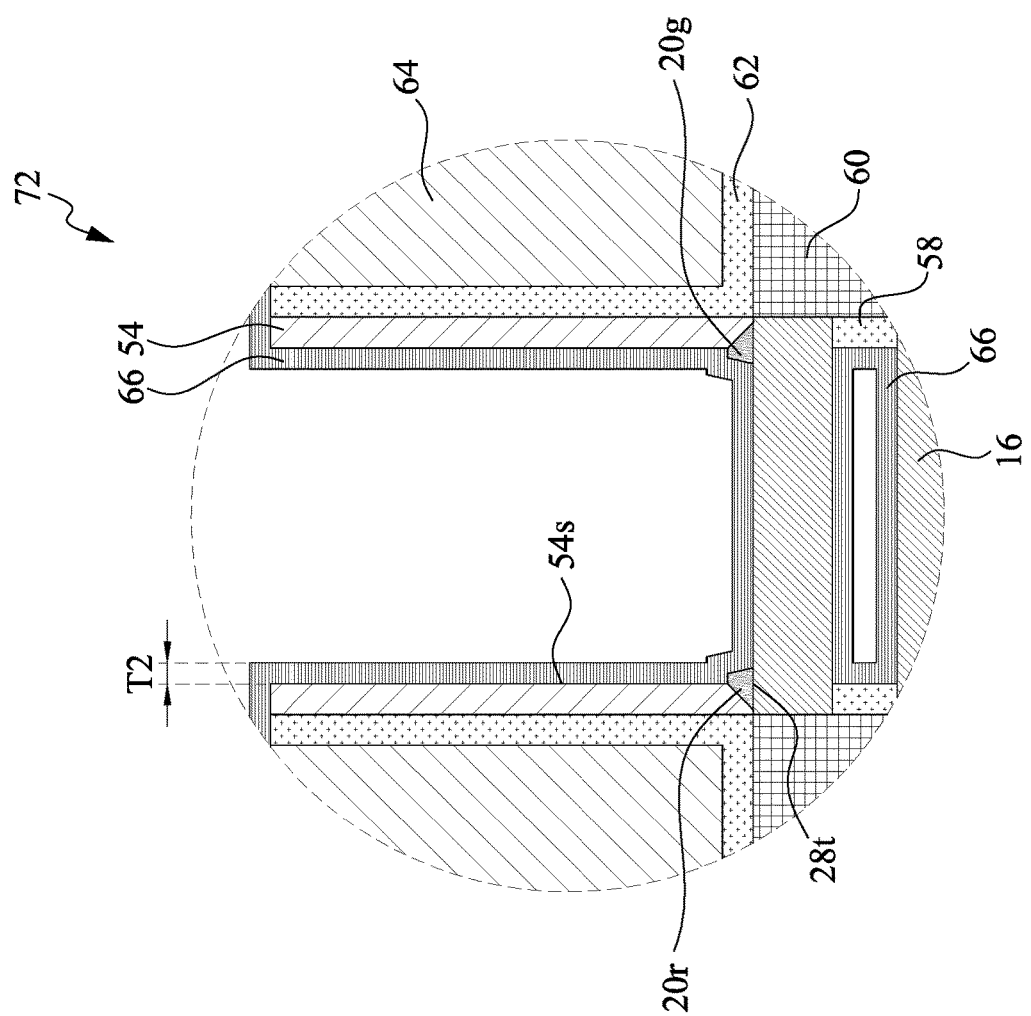

In operation 236, shown in FIGS. 23A-23E, a gate dielectric layer 66 is formed. FIG. 23A is a cross sectional view of the semiconductor device of along the line A-A in FIG. 11A. FIG. 23B is a cross sectional view of the semiconductor device along the line B-B in FIG. 11A. FIG. 23C is a cross sectional view of the semiconductor device along the line C-C in FIG. 11A. FIG. 23D is a cross sectional view of the semiconductor device along the line D-D in FIG. 11A. FIG. 23E is partial enlarged view of a region in FIG. 23D.

The gate dielectric layer 66 is formed over surfaces of the second semiconductor layers 16. In some embodiments, the gate dielectric layer 66 is conformally formed over the exposed surfaces, such as exposed surfaces of the second semiconductor layers 16, sidewalls 54s of the sidewall spacers 54, and the inner spacers 58. For a multi-channel FinFET, such as nanosheet FinFET or GAA devices shown in FIG. 23, the gate dielectric layer 66 is formed around all the nanosheets of the second semiconductor layer 16. Alternatively, for conventional FinFET devices, i.e. FinFET devices with only one channel in each semiconductor fin, the gate dielectric layer 66 is formed over semiconductor fins in the channel region. Because the gate dielectric layer 66 is deposited after removal of the sacrificial gate structure 52, the gate dielectric layer 66 is also formed on the sidewalls 54s of the sidewall spacers 54, as shown in FIG. 23E.

The gate dielectric layer 66 may be deposited or thermally grown according to acceptable techniques, such as thermal CVD, CVD, ALD, and other suitable methods. In one embodiment, the gate dielectric layer 66 is formed using a highly conformal deposition process such as ALD in order to ensure the formation of the gate dielectric layer 66 having a uniform thickness around each of the second semiconductor layers 16. In some embodiments, thickness T2 of the gate dielectric layer 66 is in a range between about 1 nm and about 6 nm. For example, thickness T2 of the gate dielectric layer 66 may be in a range between about 2 nm to about 4 nm. In some embodiments, the gate dielectric layer 66 may include silicon oxide.

Figure 24A:
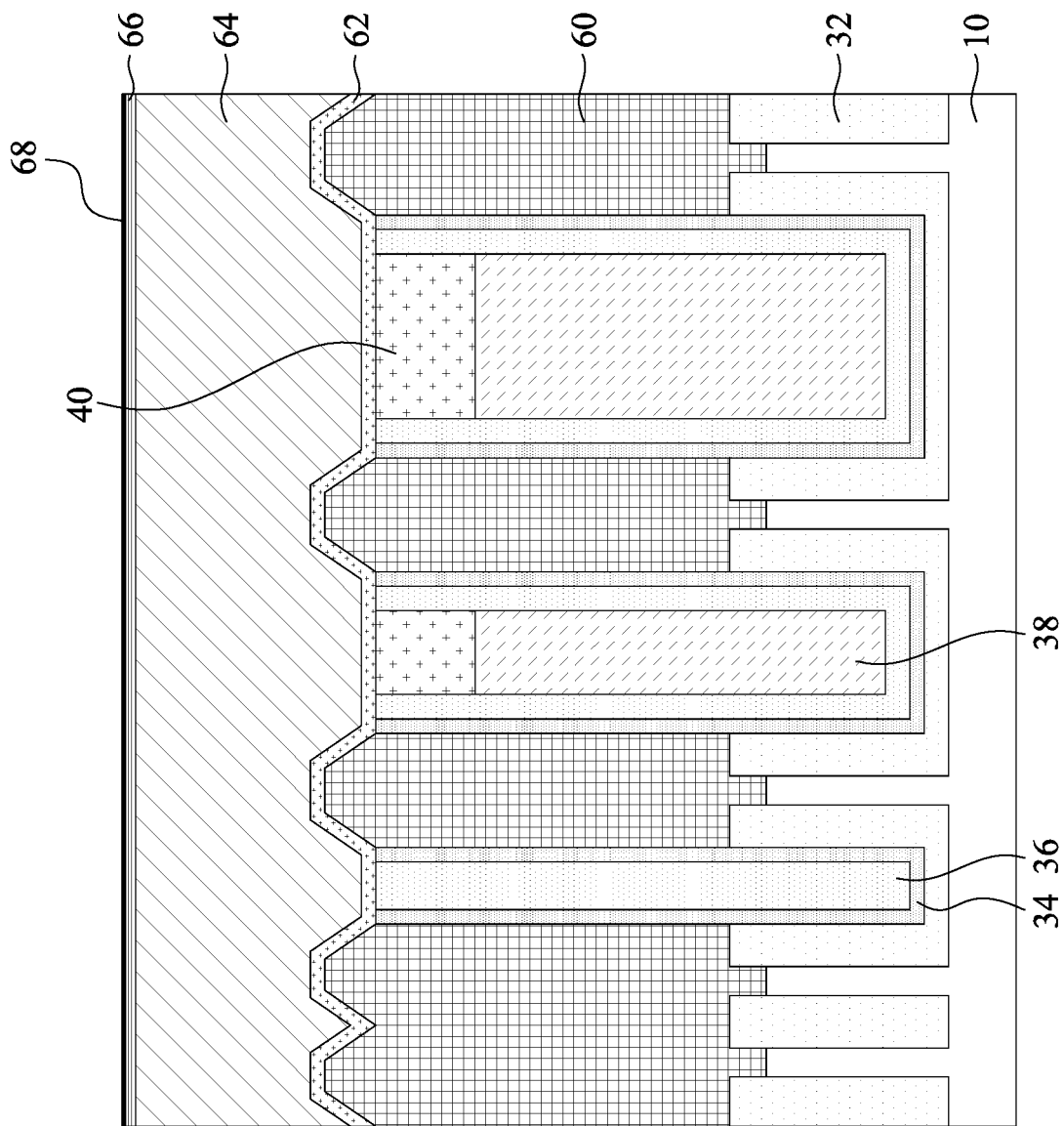
Figure 24B:
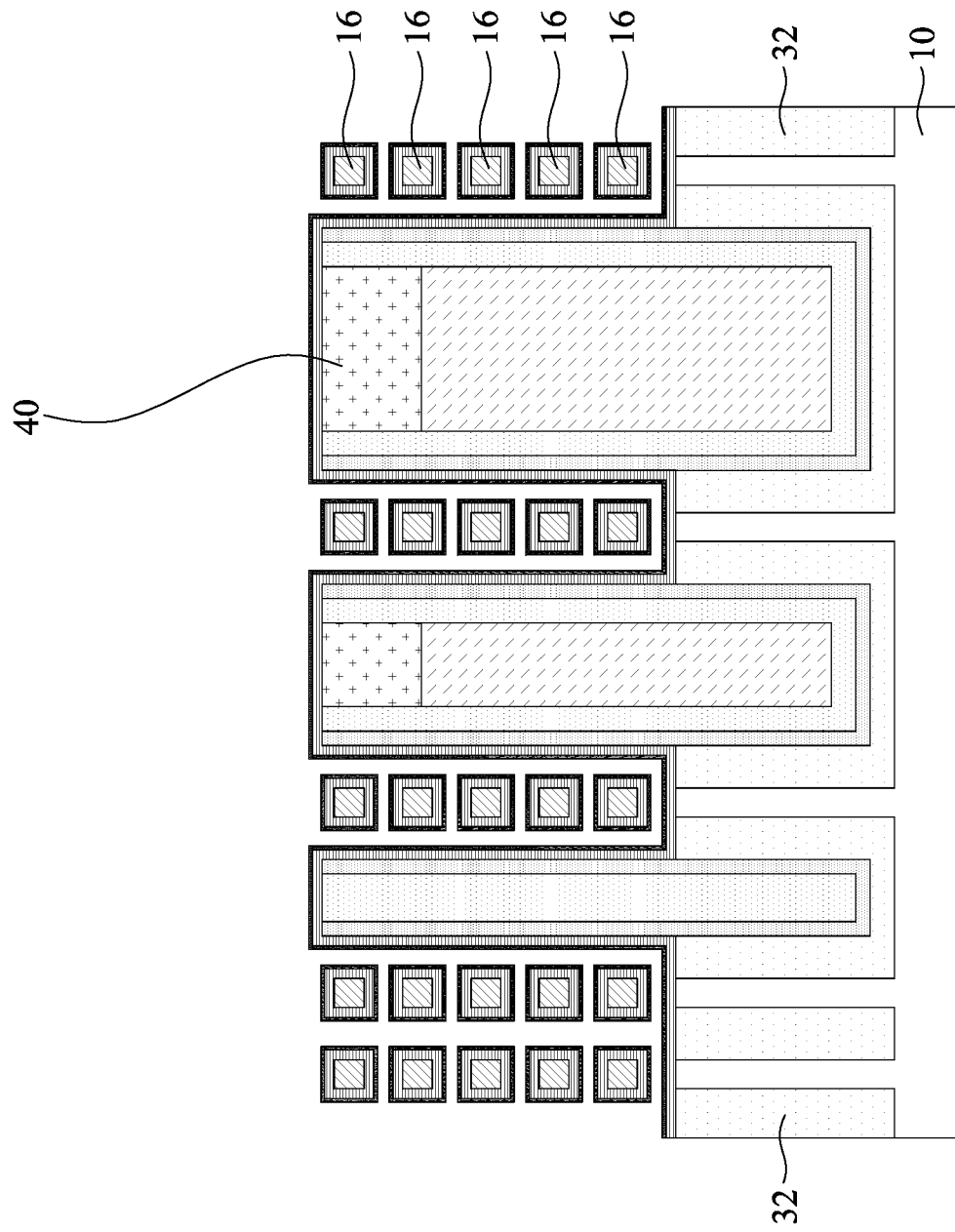
Figure 24D:
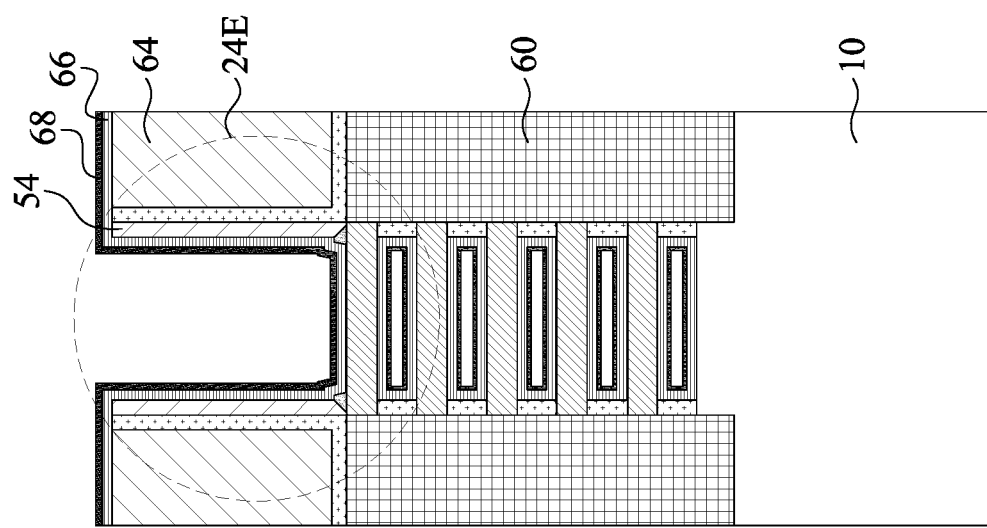
Figure 24C:
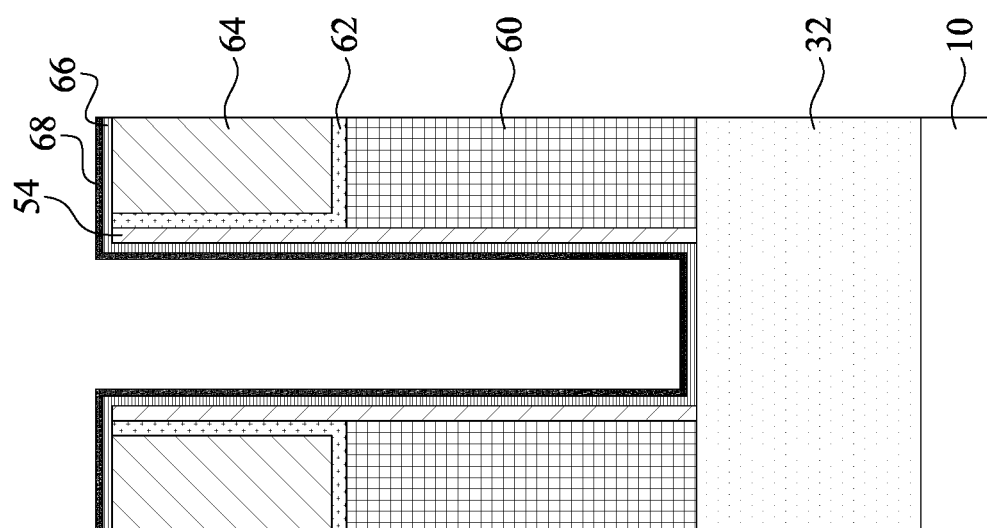
Figure 24E:
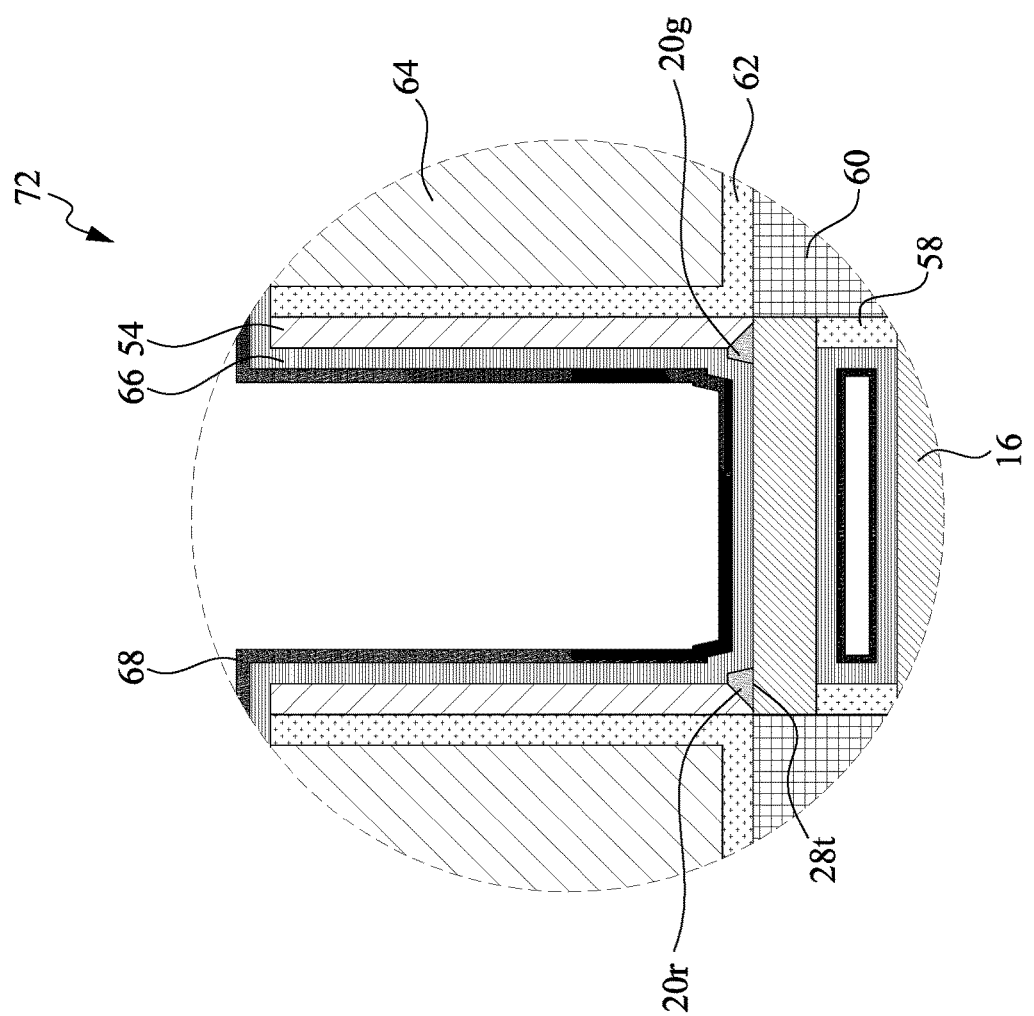

In operation 238, as shown in FIGS. 24A-24E, a high-k dielectric layer 68 is formed over the gate dielectric layer 66. FIG. 24A is a cross sectional view of the semiconductor device of along the line A-A in FIG. 11A. FIG. 24B is a cross sectional view of the semiconductor device along the line B-B in FIG. 11A. FIG. 24C is a cross sectional view of the semiconductor device along the line C-C in FIG. 11A. FIG. 24D is a cross sectional view of the semiconductor device along the line D-D in FIG. 11A. FIG. 24E is partial enlarged view of a region in FIG. 24D. FIG. 25F is a cross sectional view of the semiconductor device along the line F-F in FIG. 25D.

The high-k dielectric layer 68 may be formed by CVD, ALD or any suitable method. In one embodiment, the high-k dielectric layer 68 is formed using a highly conformal deposition process such as ALD in order to ensure the formation of a high-k dielectric layer 68 having a uniform thickness around each of the second semiconductor layers 16 and the gate dielectric layer 66.

The high-k dielectric layer 68 includes one or more layers of a high-k dielectric material, such as $HfO_2$, HfSiO, HISION, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

Figure 25A:
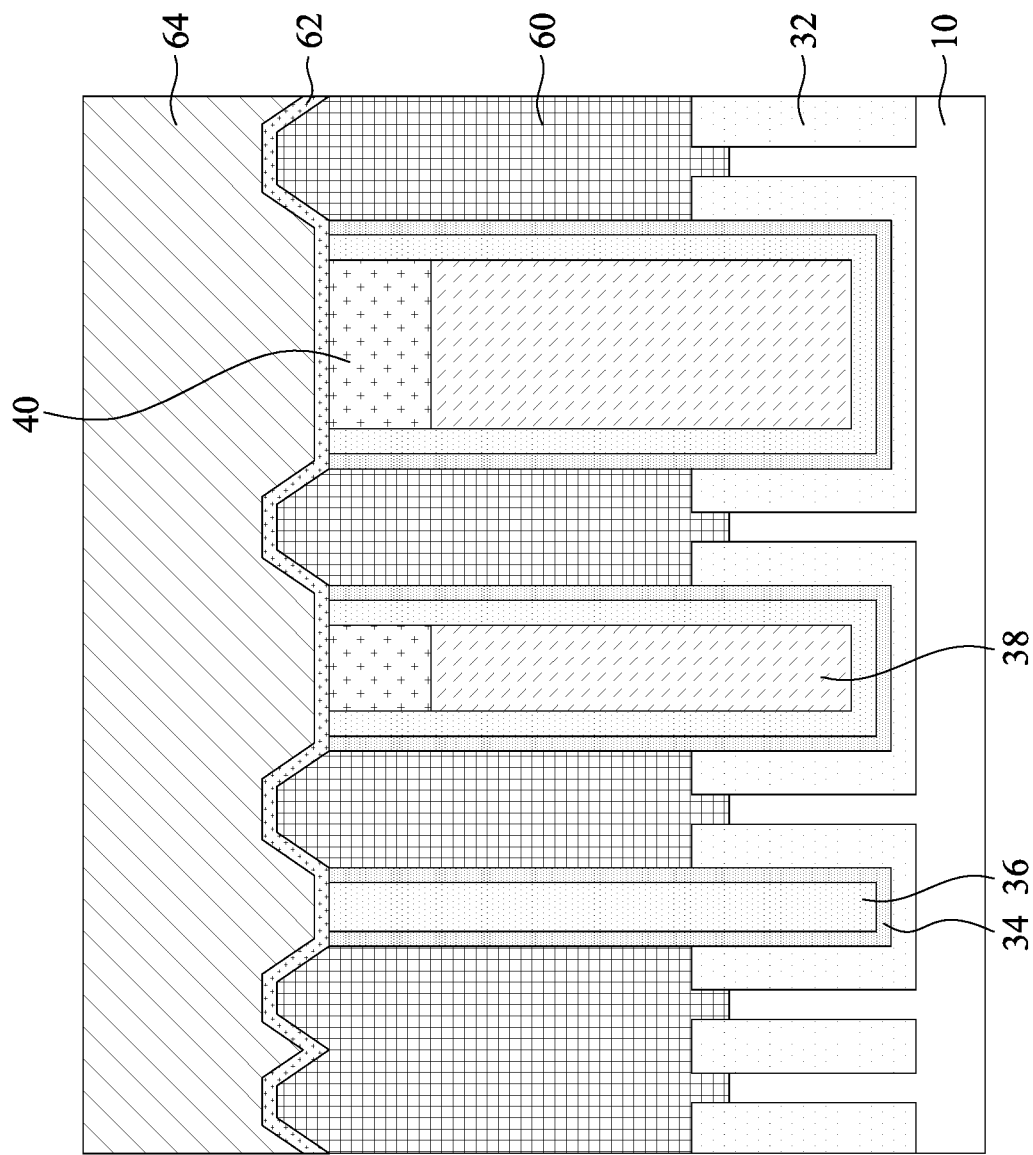
Figure 25B:
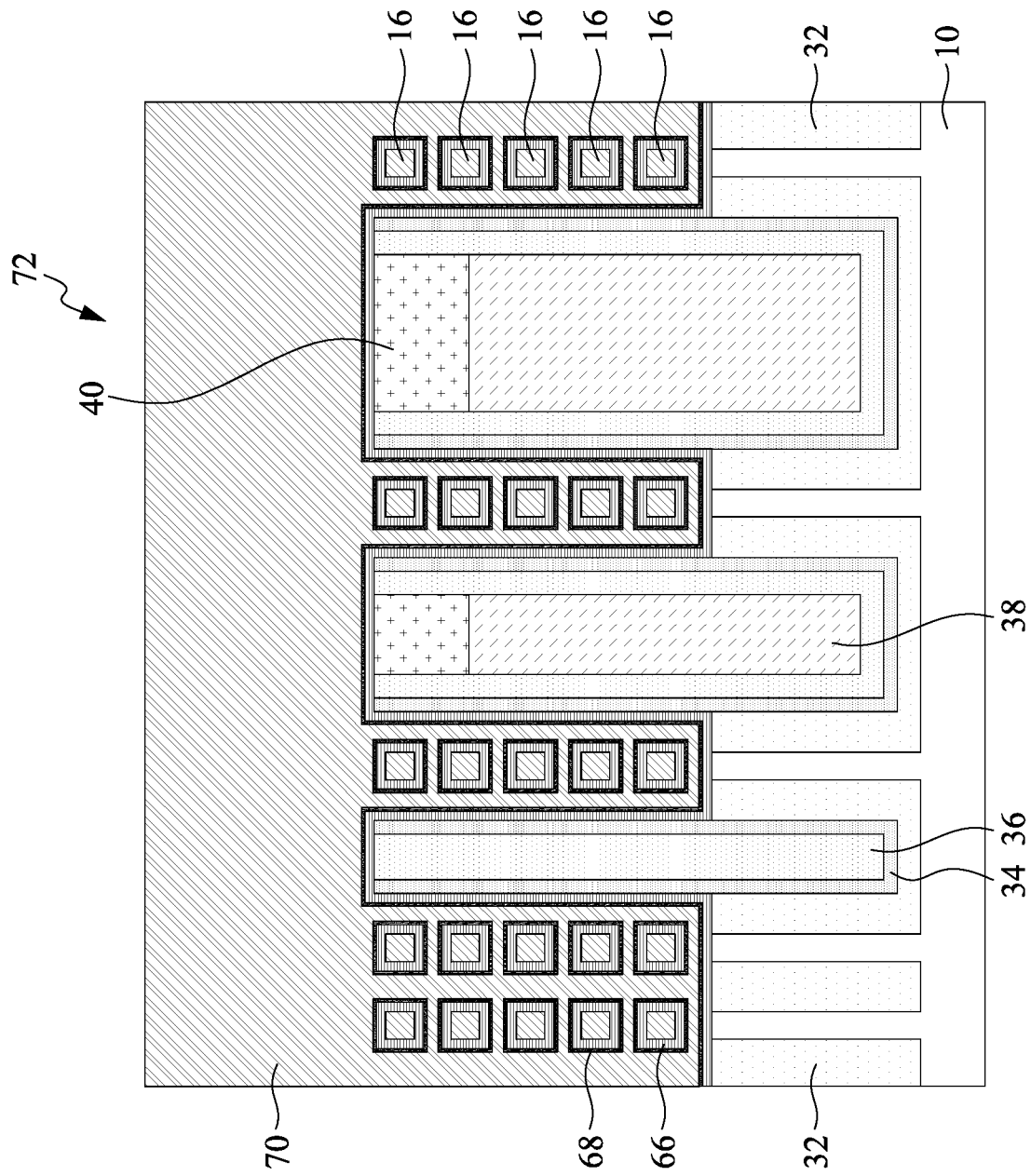
Figure 25D:
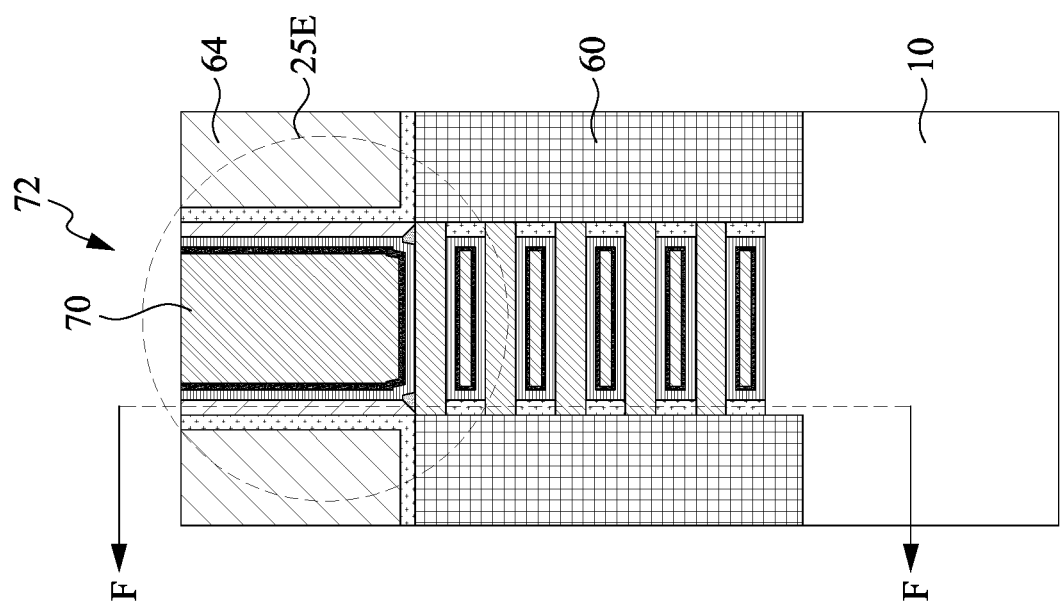
Figure 25C:
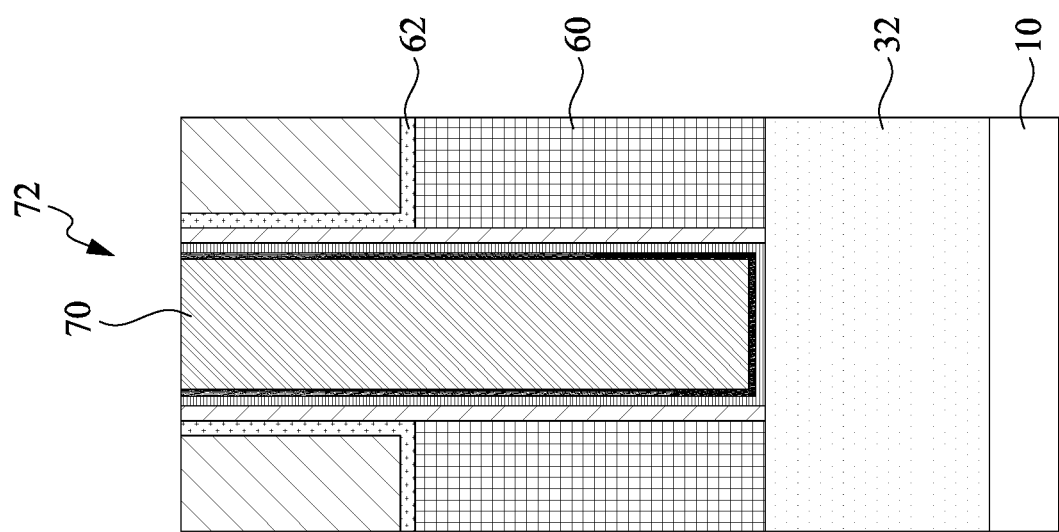
Figure 25E:
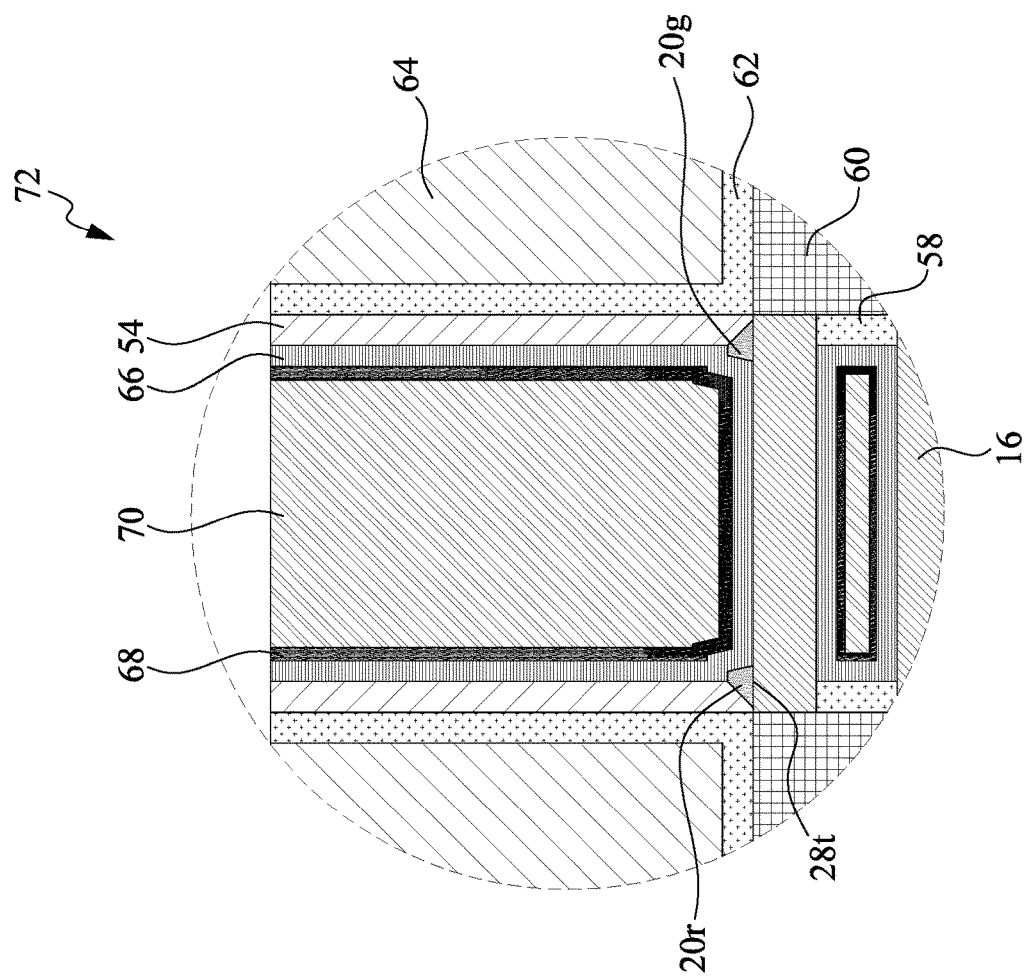
Figure 25F:
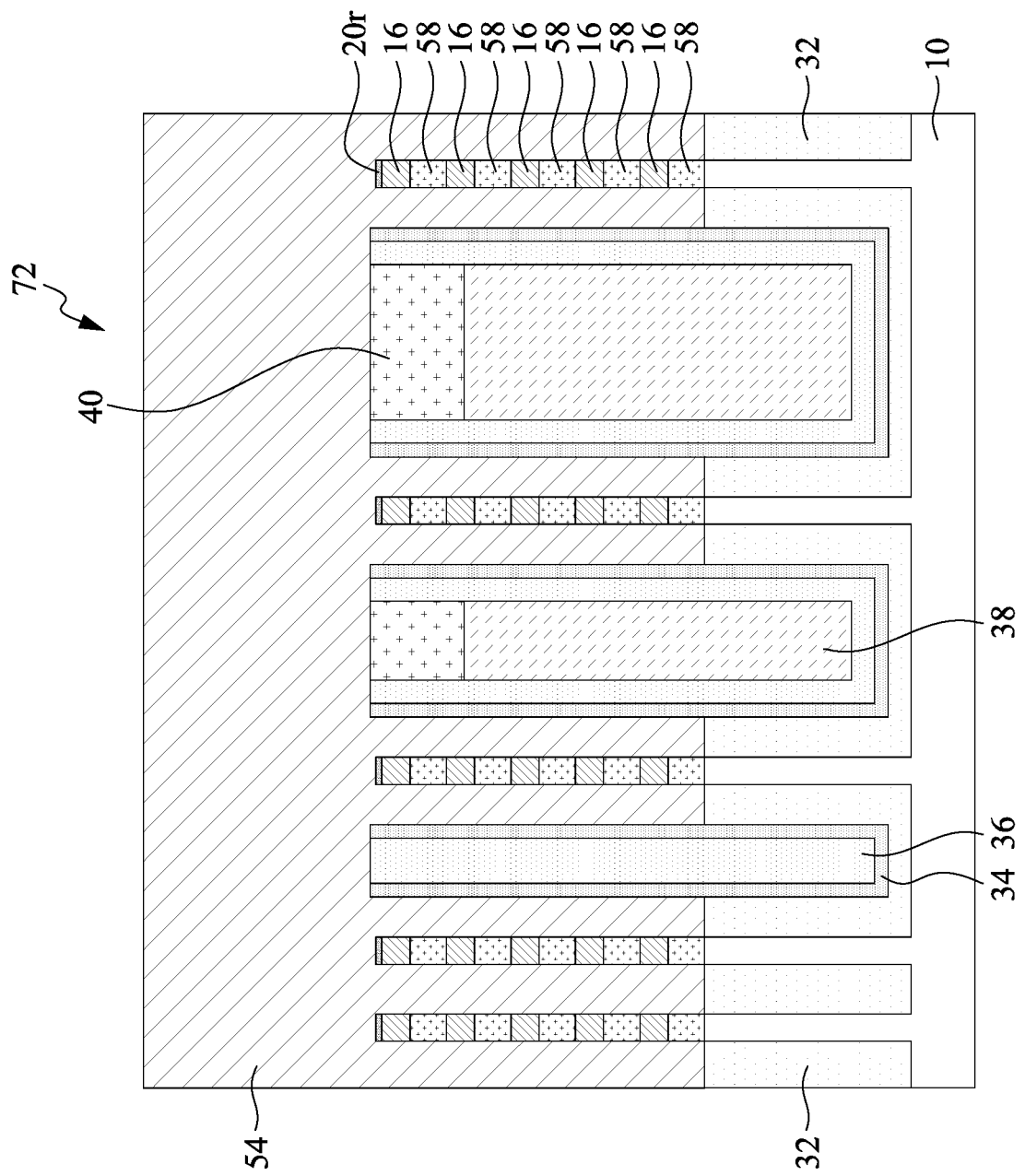

In operation 240, as shown in FIGS. 25A-25F, a gate electrode layer 70 is formed on the high-k dielectric layer 68 to surround each of the second semiconductor layer 16 (i.e., each channel region) and the gate dielectric layer 66 and high-k dielectric layer 68. FIG. 25A is a cross sectional view of the semiconductor device of along the line A-A in FIG. 11A. FIG. 25B is a cross sectional view of the semiconductor device along the line B-B in FIG. 11A. FIG. 25C is a cross sectional view of the semiconductor device along the line C-C in FIG. 11A. FIG. 25D is a cross sectional view of the semiconductor device along the line D-D in FIG. 11A. FIG. 25E is partial enlarged view of a region in FIG. 25D.

The gate electrode layer 70 includes one or more layers of conductive material, such as polysilicon, aluminum, copper, titanium, tantalum, tungsten, cobalt, molybdenum, tantalum nitride, nickel silicide, cobalt silicide, TIN, WN, TiAl, TiAlN, TaCN, TaC, TaSiN, metal alloys, other suitable materials, and/or combinations thereof.

The gate electrode layer 70 may be formed by CVD, ALD, electro-plating, or other suitable method. After the formation of the gate electrode layer 70, a planarization process, such as a CMP process, is performed to remove excess deposition of the gate electrode material and expose the top surface of the ILD layer 64 to complete formation of a replacement gate structure 72. In the embodiments of FIGS. 25A-25D, the replacement gate structure 72 includes the gate dielectric layer 66, the high-k dielectric layer 68, and the gate electrode layer 70. The gate dielectric layer 66 is formed on sidewalls 54s of the sidewall spacers 54.

Referring to FIG. 25E, portions of the hard mask layer 20, such as portions 20r, 20g, remain on the top surface 28t of the semiconductor fins 28 in the fabricated device due to limitation of the etching processes, e.g. etching processes in operations 218 and 232. In some instances, the remaining portions 20r, 20g are connected. The remaining portions 20r, 20g are located between the top surface 28t of the semiconductor fin 28, the sidewall spacer 54, and the gate dielectric layer 66. The gate dielectric layer 66, formed after removal process of the hard mask layer 20, covers both sides 54s of the sidewall spacers 54 and the top surface 28t of the semiconductor fin 28. In some instances, remaining portions of the hard mask layer 20, such as portions 20g, are in contact with the gate dielectric layer 66. In some instances, the portions 20r of the hard mask layer 20 remain under the sidewall spacers 54 and above the top surface 28t of the semiconductor fins 28. FIG. 25F schematically illustrates the portions 20r under the sidewall spacers 54.

Various embodiments or examples described herein offer multiple advantages over the state-of-art technology. Some embodiments provide FinFET devices, conventional FinFETs or nanosheet FinFETs, fabricated using a hard mask layer formed on top of semiconductor fins. The hard mask layer permits a thinner sacrificial gate dielectric layer used to form sacrificial gate structure. Using a thinner sacrificial gate dielectric layer allows further scale down of the devices by reducing the pitch of semiconductor fins. Using the hard mask layer is particularly beneficial in fabricating input/output devices because a thicker sacrificial gate dielectric layer is used in conventional processing sequences resulting in an increase in the pitch of semiconductor fins.

It will be understood that not all advantages have been necessarily discussed herein, no particular advantage is required for all embodiments or examples, and other embodiments or examples may offer different advantages.

Some embodiments of the present disclosure relate to a method for manufacturing a semiconductor device. The method comprises forming a sacrificial gate structure over a semiconductor fin, wherein a hard mask layer is formed over the semiconductor fin, forming a first sidewall spacer and a second sidewall spacer on opposite sidewalls of the sacrificial gate structure, removing the sacrificial gate structure to expose the semiconductor fin and the hard mask layer between the first and second sidewall spacers, and removing the hard mask layer to expose the semiconductor fin between the first and second sidewall spacers.

Some embodiments of the present disclosure relate to a method for manufacturing a semiconductor device. The method comprises forming a hard mask layer over a semiconductor substrate, etching the hard mask layer and the semiconductor substrate to form a plurality of semiconductor fins, wherein the hard mask layer is on each of the plurality of semiconductor fins, forming a sacrificial gate dielectric layer over the plurality of semiconductor fins and the hard mask layer, forming a sacrificial gate electrode layer over the sacrificial gate dielectric layer, patterning the sacrificial gate dielectric layer and the sacrificial gate dielectric layer to form a sacrificial gate structure over the plurality of semiconductor fins and the hard mask layer, and removing the hard mask layer from the plurality of semiconductor fins not covered by the sacrificial gate structure.

Some embodiments of the present disclosure relate to a semiconductor device. The semiconductor device comprises a first fin having a first channel region, a gate structure formed on the first channel region, wherein the gate structure comprises a gate dielectric layer formed over the first channel region and a gate electrode layer, a sidewall spacer formed on a sidewall of the gate structure, and a hard mask layer formed between the first channel region and the sidewall spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for manufacturing a semiconductor device, comprising:
   depositing a patterning stack on a semiconductor substrate, wherein the patterning stack includes a first mask layer, a pad layer, a second mask layer, and a photo resist layer;
   forming a semiconductor fin using the patterning stack, wherein the first mask layer and the second mask layer remain on a top surface of the semiconductor fin; and
   forming a sacrificial gate structure over the semiconductor fin and the first mask layer, wherein the first mask layer remains on the top surface of the semiconductor fin during formation of the sacrificial gate structure, and the first mask layer is disposed between the sacrificial gate structure and the top surface of the semiconductor fin;
   etching the first mask layer to expose the top surface of the semiconductor fin on opposite sides of the sacrificial gate structure; and then
   forming a first sidewall spacer and a second sidewall spacer, wherein the first and second sidewall spacers are formed on the top surface of the semiconductor fin, the first mask layer, and the sacrificial gate structure.

2. The method of claim 1, wherein forming the sacrificial gate structure comprising:
   forming the sacrificial gate dielectric layer over the semiconductor fin and the first mask layer;
   forming the sacrificial gate electrode layer over the sacrificial gate dielectric layer;
   forming a patterned mask layer over the sacrificial gate electrode layer; and
   removing portions of the sacrificial gate electrode layer using the patterned mask layer as a mask and the first mask layer as an etch stop layer.

3. The method of claim 1, wherein etching the first mask layer to expose the top surface of the semiconductor fin comprises substantially removing the first mask layer not covered by the sacrificial gate structure, a portion of the first mask layer extending outwardly from the sacrificial gate structure, and the first sidewall spacer is in contact with the portion of the first mask layer.

4. The method of claim 3, wherein the portion of the first mask layer includes a slope surface extending from a top surface of the first mask layer to the top surface of the semiconductor fin.

5. The method of claim 1, further comprising:
   depositing the first mask layer over the semiconductor substrate; and
   etching the first mask layer and the semiconductor substrate to form the semiconductor fin.

6. The method of claim 5, further comprising:
   forming a semiconductor stack on the semiconductor substrate, wherein the semiconductor stack comprises one or more first semiconductor layers alternately stacked with one or more second semiconductor layers, the first mask layer is formed on the semiconductor stack, and the semiconductor fin comprises the semiconductor stack and a well portion formed from the semiconductor substrate.

7. The method of claim 6, further comprising:
   removing the sacrificial gate structure to expose the semiconductor fin and the first mask layer between the first and second sidewall spacers;
   etching the first mask layer between the first and second sidewall spacers;
   removing the one or more first semiconductor layers from the semiconductor stack; and
   forming a replacement gate structure around the one or more second semiconductor layers, wherein the replacement gate structure is in contact with the first mask layer.

8. A method for manufacturing a semiconductor device, comprising:
   depositing a first mask layer over a planar top surface of a semiconductor substrate; and then
   etching the first mask layer and the semiconductor substrate to form a plurality of semiconductor fins, wherein the first mask layer remains on top surfaces of the plurality of semiconductor fins;
   forming a sacrificial gate dielectric layer over the plurality of semiconductor fins and the first mask layer;
   forming a sacrificial gate electrode layer over the sacrificial gate dielectric layer;
   patterning the sacrificial gate electrode layer and the sacrificial gate dielectric layer to form a sacrificial gate structure over the plurality of semiconductor fins and the first mask layer;

removing the first mask layer from the plurality of semiconductor fins not covered by the sacrificial gate structure to expose the top surfaces of the plurality of semiconductor fins; and then forming sidewall spacers on the top surfaces of the plurality of semiconductor fins, the first mask layer, and the sacrificial gate structure.

9. The method of claim 8, further comprising:

removing the sacrificial gate electrode layer and the sacrificial gate dielectric layer between the sidewall spacers; and removing the first mask layer from the plurality of semiconductor fins between the sidewall spacers.

10. The method of claim 9, further comprising:

forming a gate dielectric layer on the plurality of semiconductor fins and the sidewall spacers.

11. The method of claim 9, further comprising:

prior to forming the first mask layer, forming a semiconductor stack on the semiconductor substrate, wherein the semiconductor stack comprises two or more first semiconductor layers alternately stacked with two or more second semiconductor layers, the first mask layer is formed on the semiconductor stack, and each of the plurality of semiconductor fins comprises the semiconductor stack and a well portion formed from the semiconductor substrate; and removing the two or more first semiconductor layers between the sidewall spacers after removing the sacrificial gate electrode layer and the sacrificial gate dielectric layer.

12. The method of claim 11, wherein removing the one or more first semiconductor layers is performed after removing the first mask layer from the plurality of semiconductor fins between the sidewall spacers.

13. The method of claim 8, further comprising forming a hybrid fin between two immediately adjacent semiconductor fins of the plurality of semiconductor fins prior to forming the sacrificial gate dielectric layer.

14. The method of claim 13, wherein a top surface of the hybrid fin is higher than the top surfaces of the plurality of semiconductor fins.

15. A method forming a semiconductor device, comprising:

depositing a first mask layer on a planar top surface of a semiconductor substrate;

forming a first semiconductor fin and a second semiconductor fin by etching the first mask layer and the semiconductor substrate, wherein the first mask layer is on top surfaces of the first semiconductor fin and second semiconductor fins;

depositing one or more dielectric layers to over the first semiconductor fin and second semiconductor fins;

performing a planarization process to expose the first mask layer;

forming a shallow trench isolation layer around lower portions of the first and second semiconductor fins by etching back a portion of the one or more dielectric layers;

forming a sacrificial gate structure on the first semiconductor fin, the second semiconductor fin and the first mask layer;

etching the first mask layer to expose the top surfaces of the first and second semiconductor fins; and then forming a first sidewall spacer and a second sidewall spacer on opposite sidewalls of the sacrificial gate structure, wherein the first and second sidewall spacers are formed on the first and second semiconductor fins, the first mask layer, and the sacrificial gate structure.

16. The method of claim 15, further comprising:

forming a hybrid fin parallel to the first and second semiconductor fins while forming the shallow trench isolation layer, wherein the sacrificial gate structure is formed over the hybrid fin.

17. The method of claim 15, further comprising:

removing the sacrificial gate structure between the first and second spacers;

removing the first mask layer to expose the top surfaces of the first and second semiconductor fins between the first and second spacers;

depositing a gate dielectric layer over the first and second semiconductor fins between the first and second sidewall spacers; and depositing a gate electrode layer on the gate dielectric layer.

18. The method of claim 17, wherein after removal of the first mask layer from the first and second semiconductor fins, portions of the first mask layer are disposed on the first and second semiconductor fins adjacent the first sidewall spacer.

19. The method of claim 18, wherein the portions of the first mask layer include a slope surface extending from a top surface of the first mask layer to the top surface of the semiconductor fin, and the gate dielectric layer is disposed on the slope surface.

20. The method of claim 15, wherein forming the first and second semiconductor fins further comprises:

forming a semiconductor stack on the semiconductor substrate, wherein the semiconductor stack comprises one or more first semiconductor layers alternately stacked with one or more second semiconductor layers, the first mask layer is formed on the semiconductor stack.

* * * * *